(12) United States Patent
Bando et al.

(10) Patent No.: US 10,284,109 B2
(45) Date of Patent: May 7, 2019

(54) POWER MODULE HAVING CONTROL SUBSTRATE MOUNTED ABOVE POWER SUBSTRATE WITH CONTROL SUBSTRATE DRIVERS LOCATED BETWEEN THE POWER SUBSTRATE POWER TRANSISTORS

(71) Applicant: RENESAS ELECTRONICS CORPORATION, Tokyo (JP)

(72) Inventors: Koji Bando, Tokyo (JP); Kuniharu Muto, Tokyo (JP); Hideaki Sato, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/891,872

(22) Filed: Feb. 8, 2018

(65) Prior Publication Data

US 2018/0241319 A1    Aug. 23, 2018

(30) Foreign Application Priority Data

Feb. 17, 2017  (JP) ................................ 2017-027815

(51) Int. Cl.

| H01L 25/16 | (2006.01) |
|---|---|
| H02M 7/48 | (2007.01) |
| H02M 7/00 | (2006.01) |
| H03K 17/64 | (2006.01) |
| H01L 25/18 | (2006.01) |
| H01L 23/12 | (2006.01) |

(52) U.S. Cl.
CPC .............. *H02M 7/48* (2013.01); *H01L 23/12* (2013.01); *H01L 25/16* (2013.01); *H01L 25/18* (2013.01); *H02M 7/003* (2013.01); *H03K 17/64* (2013.01)

(58) Field of Classification Search
CPC ............................ H01L 25/162; H02M 7/003
See application file for complete search history.

(56) References Cited

U.S. PATENT DOCUMENTS 5,471,089 A * 11/1995 Nagatomo .............. H01L 23/50
                                                                257/691
6,215,679 B1    4/2001 Yamane et al.
(Continued)

FOREIGN PATENT DOCUMENTS

| JP | 2000-357757 A | 12/2000 |
|---|---|---|
| JP | 2001-186778 A | 7/2001 |

*Primary Examiner* — Harry R Behm
(74) *Attorney, Agent, or Firm* — McDermott Will & Emery LLP

(57) ABSTRACT

An electronic device includes a first substrate, a wiring substrate (second substrate) disposed over the first substrate, and an enclosure (case) in which the first substrate and the wiring substrate are accommodated and that has a first side and a second side. A driver component (semiconductor component) is mounted on the wiring substrate. A gate electrode of a first semiconductor component is electrically connected to the driver component via a lead disposed on a side of the first side and a wiring disposed between the driver component and the first side. A gate electrode of a second semiconductor component is electrically connected to the driver component via a lead disposed on a side of the second side and a wiring disposed between the driver component and the second side.

11 Claims, 23 Drawing Sheets

(56) References Cited

U.S. PATENT DOCUMENTS

| | | | |
|---|---|---|---|
| 6,791,170 B1 * | 9/2004 | Fuku | H05K 7/1417 |
| | | | 257/678 |
| 2009/0218666 A1 * | 9/2009 | Yang | H01L 21/56 |
| | | | 257/677 |
| 2013/0009290 A1 * | 1/2013 | Lim | H01L 23/4334 |
| | | | 257/666 |
| 2014/0167242 A1 * | 6/2014 | Kim | H01L 23/053 |
| | | | 257/690 |
| 2017/0012030 A1 * | 1/2017 | Wang | H01L 25/162 |

* cited by examiner

POWER MODULE HAVING CONTROL SUBSTRATE MOUNTED ABOVE POWER SUBSTRATE WITH CONTROL SUBSTRATE DRIVERS LOCATED BETWEEN THE POWER SUBSTRATE POWER TRANSISTORS

CROSS-REFERENCE TO RELATED APPLICATION

The present application claims priority from Japanese Patent Application No. 2017-27815 filed on Feb. 17, 2017, the content of which is hereby incorporated by reference into this application.

TECHNICAL FIELD OF THE INVENTION

The present invention relates to an electronic device (semiconductor module) and to an effective technique applied to, for example, an electronic device having a plurality of substrates accommodated in a single case with the substrates stacked.

BACKGROUND OF THE INVENTION

Japanese Patent Application Laid-open No. 2000-357757 (Patent Document 1) describes a structure in which two wiring substrates are connected via a contactor provided on a side face of a packaging board.

Japanese Patent Application Laid-open No. 2001-186778 (Patent Document 2) describes a power converter in which a substrate mounting a smoothing capacitor is stacked on a substrate mounting a switching element and the substrates are accommodated in a common case.

SUMMARY OF THE INVENTION

A power converting circuit such as inverter circuit is incorporated in a power supply system that drives air conditioners, automobiles, or various pieces of industrial equipment etc. An example of such a power converting circuit includes an electronic device (power converter, semiconductor module) modularized by mounting an electronic component on a substrate and electrically connecting them to each other, the electronic component including a plurality of semiconductor chips each having a power transistor operating as a switching element.

The inventors of the present application have studied, as part of efforts to improve performance of the modularized electronic device as described above, the electronic device having a plurality of substrates accommodated in the single case with the substrates stacked. As a result of the study, it has been found that there are some problems about layout of the plurality of electronic components incorporated in the electronic device and about layout of wirings connected to the electronic components.

For example, if variations in length of paths for supplying drive signals to a plurality of switching elements occur, the occurrence becomes a cause for deviating from operation timing of the switching elements. In addition, for example, when the number of electronic components incorporated in the electronic device is increased with functionalization of the electronic device, the layout of the electronic components and the wirings needs to be made more efficient so as to suppress an increase in a packaging area of the electronic device.

The above and other objects and novel characteristics of the present invention will be apparent from the description of the present specification and the accompanying drawings.

An electronic device according to one embodiment includes a first substrate, a second substrate placed on the first substrate, and a case in which the first and second substrates are accommodated and that has a first side and a second side opposite to the first side. On the first substrate, a first semiconductor component having a first power transistor is mounted on a side of the first side of the case, and a second semiconductor component having a second power transistor is mounted on a side of the second side thereof. A third semiconductor component having a drive circuit driving the first and second power transistors is mounted on the second substrate. A gate electrode of the first semiconductor component is electrically connected to the third semiconductor component via a first lead member disposed on a side of the first side and via a first wiring disposed between the third semiconductor component and the first side. In addition, a gate electrode of the second semiconductor component is electrically connected to the third semiconductor component via a second lead disposed on a side of the second side and via a second wiring disposed between the third semiconductor component and the second side.

According to the above embodiment, performance of the electronic device can be improved.

BRIEF DESCRIPTIONS OF THE DRAWINGS

Figure 1:
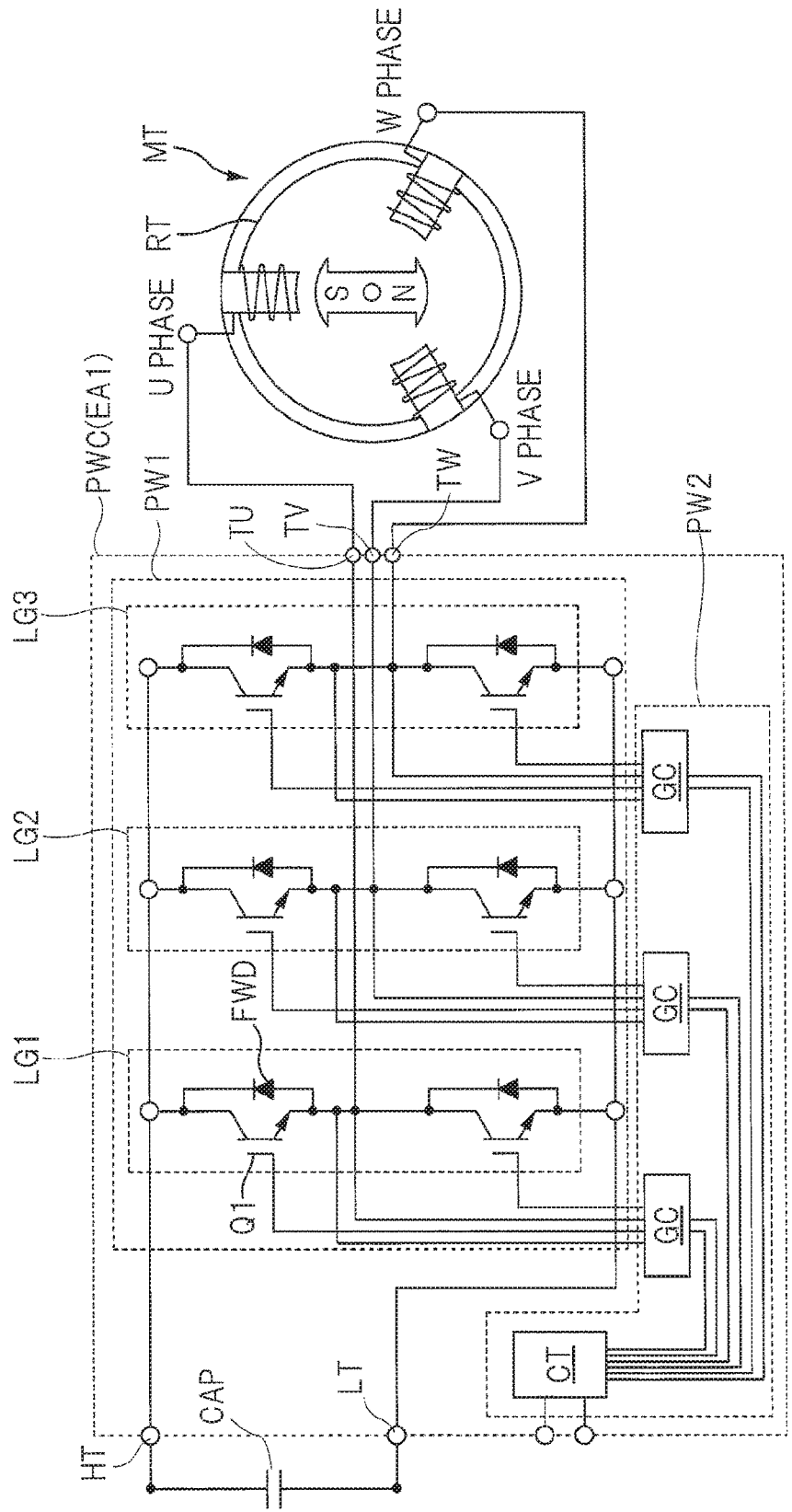
FIG. 1 is a circuit diagram showing a configuration of a motor circuit including an inverter circuit and a three-phase induction motor according to an embodiment.

DESCRIPTIONS OF THE PREFERRED EMBODIMENTS (Description of Format, Basic Terms, and Description of Usage in the Present Application)

In this application, embodiments will be described in a plurality of sections or the like when required as a matter of convenience. However, these sections are not independent and irrelevant to each other unless otherwise stated, and the one relates to the entire or a part of the other as a detail, a modification example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise indicated clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In addition, in the attached drawings, hatching may be omitted even in cross sections in the case where it becomes rather complicated or the case where discrimination from void is clear. In this regard, when it is clear from the description or the like, an outline of a background may be omitted even in a planarly closed hole. Furthermore, even other than the cross section, hatching or dot patterns may be drawn so as to clarify non-voids or clarify a boundary of regions.

In addition, in the present specification, an "electronic component" means a component that operates by using electrons, and a component that operates by using electrons in a semiconductor particularly becomes a "semiconductor component". As an example of this "semiconductor component", a semiconductor chip can be given. Therefore, a technical term including the "semiconductor chip" is the "semiconductor component", and a generic concept of the "semiconductor component" becomes an "electronic component".

In addition, in the present specification, the "semiconductor device" means a structure that has a semiconductor component(s) and an external connection terminal(s) electrically connected thereto and in which the semiconductor component is covered with a sealing material(s). The "semiconductor device" is particularly configured so as to be able to be electrically connected to an external device(s) by the external connection terminal.

Further, in the present specification, a "power transistor" means a unit-transistor aggregation in which a plurality of unit transistors (cell transistors) are connected in parallel (e.g., several thousands to ten thousands of the unit transistors are connected in parallel) to realize a function of the unit transistor even when a larger current than an allowable current of the unit transistor flows. For example, when the unit transistor functions as a switching element, the "power transistor" serves as a switching element applicable also to a current larger than the allowable current of the unit transistor. Exemplified as the power transistor making up the switching element are an insulated gate bipolar transistor (IGBT) and a power metal oxide semiconductor field effect transistor (power MOSFET). In the present specification, the term "power transistor" is used as a term that expresses a generic concept encompassing both of the "power MOSFET" and the "IGBT". In addition, the semiconductor chip having the power transistor may be referred to as power semiconductor chip.

Embodiment

In the present embodiment, a power converter that is a semiconductor package (semiconductor device) having an inverter circuit (power inverter circuit) will be dealt with and described as an example of an electronic device (semiconductor module) in which a plurality of electronic components including semiconductor chips having power transistors are accommodated in a single package. In this embodiment, an example of using an IGBT as a power transistor will be dealt with and described.

An inverter circuit is a circuit that converts DC power into AC power. For example, if a plus and minus currents are alternately outputted from a DC power source, a current direction flowing in a circuit is inverted depending thereon. In this case, since the current direction is alternately inverted, an output from the power source is considered to be AC power. This is the principle of the inverter circuit. Here, AC power includes various forms as typified by single-phase AC power and three-phase AC power. In this embodiment, described as an example will be a three-phase inverter circuit that converts DC power into three-phase AC power. However, a technical idea in this embodiment is not limited to an application to the three-phase inverter circuit, and can be applied also to, for example, a single-phase inverter circuit etc.

<Configuration Example of Three-Phase Inverter Circuit>

FIG. 1 is a circuit diagram showing a configuration of a motor circuit including an inverter circuit and a three-phase induction motor according to the present embodiment. In FIG. 1, the motor circuit includes a motor MT, which is a three-phase induction motor, and an inverter circuit PWC. The motor MT is configured to be driven by three-phase voltages of different in phase. The motor MT uses three-phase alternating currents called a U phase, a V phase, and a W phase shifted 120 degrees with respect to each other to generate a rotating magnetic field around a rotor RT which is a conductor. In this case, the generated magnetic field rotates around the rotor RT. This means that magnetic flux traversing the rotor RT as a in the conductor changes. As a result, electromagnetic induction occurs at the rotor RT as a conductor, thus causing an induced current to flow through the rotor RT. That the induced current flows in the rotating magnetic field means that, by the Fleming's left hand rule, a force is applied to the rotor RT, and this force rotates the rotor RT. The motor circuit utilizes the inverter circuit PWC creating an alternating current from a direct current, and thereby supplies the induction motor with AC power. The motor MT exemplified in FIG. 1 uses a three-phase alternating current to rotate the rotor RT. For this reason, the inverter circuit PWC of FIG. 1 generates three kinds (U phase, V phase, and W phase) of AC currents and supplies them to the motor MT.

A configuration example of the inverter circuit PWC will hereinafter be described. As shown in FIG. 1, the inverter circuit PWC of this embodiment is provided with transistors Q1 and diodes FWD correspondingly to three phases. A switching element(s) included in the inverter circuit PWC of this embodiment is configured by a constituent element(s) that anti-parallelly connects a diode FWD and a transistor Q1. In other words, each of an upper arm and a lower arm on a leg LG1, those on a leg LG2, and those on a leg LG3 is configured by the constituent element that anti-parallelly connects the diode FWD and the transistor Q1.

The transistor Q1 is a power transistor that operates as a switching element and is, for example in this embodiment, an IGBT. In the inverter circuit PWC, the transistor Q1 and the diode FWD are connected anti-parallelly between a high-side terminal (e.g., positive potential terminal) HT supplied with a relatively high potential and each phase (U phase, V phase, W phase) of the motor MT. Likewise, the transistor Q1 and the diode FWD are connected anti-parallelly between a low-side terminal (e.g., negative potential terminal) LT supplied with a relatively lower potential than that of each phase of the motor MT and each phase (U phase, V phase, W phase) of the motor MT. That is, a set of two transistors Q1 and two diodes FWD are provided for each phase. In other words, each of the leg LG1, leg LG2, and leg LG3 has the transistor Q1 that is a power transistor operating as a high-side switching element, and a transistor Q1 that is a power transistor operating as a low-side switching element. Thus, six transistors Q1 and six diodes FWD are provided for three phases. A gate electrode of each transistor Q1 is connected to a gate drive circuit (drive circuit) GC so that a switching operation of the transistor Q1 is controlled by the gate drive circuit GC. In the inverter circuit PWC configured in such a manner, the gate drive circuit GC controls the switching operation of each transistor Q1, and thereby converts DC power into three-phase AC power so as to supply the three-phase AC power to the motor MT. As shown in FIG. 1, according to this embodiment, one gate drive circuit GC is connected to each of the legs LG1, LG2, and LG3. Three gate drive circuits GC for three phases are formed into three semiconductor components independent of each other although described in detail later.

In the inverter circuit PWC of this embodiment, the transistor Q1 that is an IGBT serving as the switching element is used, and the diode FWD is provided so as to be connected anti-parallelly to the transistor Q1. From the viewpoint of merely achieving a switching function by using the switching element, such a configuration is also conceivable as not to include the diode FWD if including the transistor Q1 as the switching element. When a load connected to the inverter circuit PWC includes an inductor, however, the diode FWD needs being provided.

When the load is pure resistance including no inductor, the diode FWD is unnecessary since there is no reflux energy. However, if such a circuit including an inductor as a motor is connected to the load, there may arise a state (mode) in which a load current flows in a direction reverse to a direction of a current flowing in a switch turned on. That is, when the load includes an inductor, energy may return from the inductor of the load to the inverter circuit PWC (a current may flow backward).

At this time, since only the transistor Q1 that is an IGBT has no function of carrying a reflux current, the diode FWD needs to be connected anti-parallelly to the transistor Q1. That is, in the inverter circuit PWC, when the load includes an inductor like a motor, energy accumulated in the inductor ($\frac{1}{2}LI^2$) must be released in turning off the transistor Q1. Only the transistor Q1, however, cannot carry a reflux current for releasing energy accumulated in the inductor. Therefore, the diode FWD is connected anti-parallelly to the transistor Q1 in order to return electric energy accumulated in the inductor. In short, the diode FWD has a function of carrying the reflux current in order to release electric energy accumulated in the inductor. As described above, in the inverter circuit PWC connected to the load including the inductor, the diode FWD needs to be provided anti-parallelly to the transistor Q1 serving as the switching element. This diode FWD is referred to as a freewheeling diode.

In addition, in the inverter circuit PWC of this embodiment, for example, a capacitative element CAP is connected between the high-side terminal HT and the low-side terminal LT, as shown in FIG. 1. This capacitative element CAP has a function of, for example, smoothing out switching noise in the inverter circuit PWC and stabilizing a system voltage. In the example of FIG. 1, the capacitative element CAP is provided outside the inverter circuit PWC. However, the capacitative element CAP may be provided inside the inverter circuit PWC.

In addition, as shown in FIG. 1, the inverter circuit PWC of this embodiment includes an output unit PW1 having six switching elements corresponding to three phases, and a control unit PW2 that controls operations of six power transistors of the output unit PW1. In addition to the above three gate drive circuits GC, the control unit PW2 has also a control circuit (logic circuit, arithmetic circuit) CT that controls each operation of a high-side drive circuit and a low-side drive circuit included in each gate drive circuit GC. In addition to the above circuits, the control unit PW2 may further have various control circuits that control the operation of the inverter circuit PWC although omitted in FIG. 1. For example, a nose filter circuit that reduces noise such as a gate drive signal outputted from the gate drive circuit GC and a signal inputted to the gate drive circuit GC may be formed in the control unit PW2. Another circuit that, for example, measures temperature etc. of an electronic component(s) making up the output unit PW1 and filters or amplifies the measured electric signal may also be formed in the control unit PW2.

<Structure of Power Semiconductor Chip>

Figure 2:
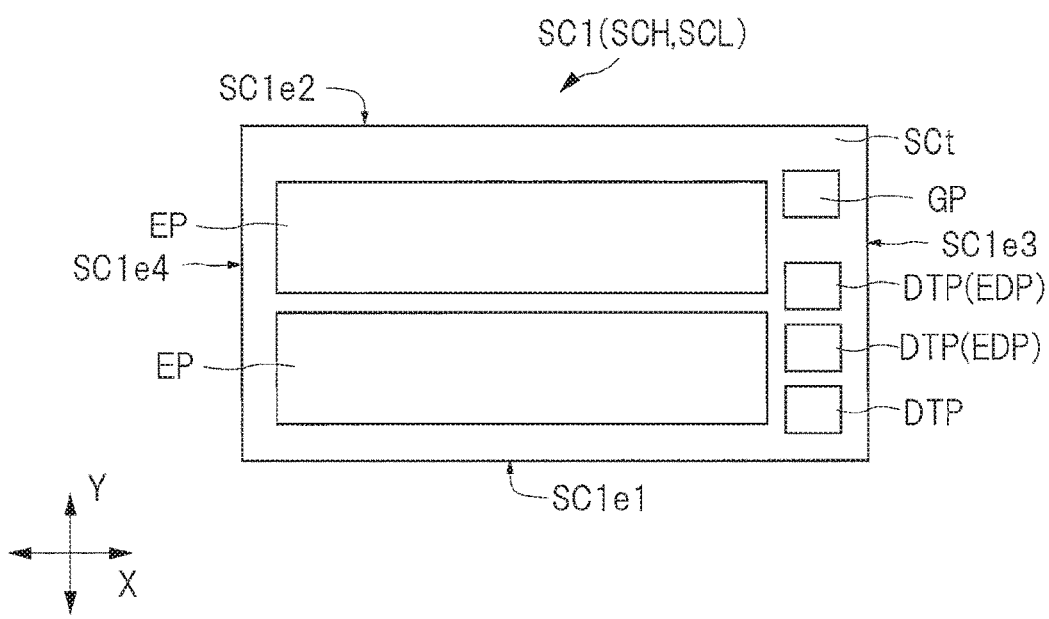
FIG. 2 is a plan view showing a front-surface-side shape of a semiconductor chip having a transistor of FIG. 1 formed thereon.
Figure 3:
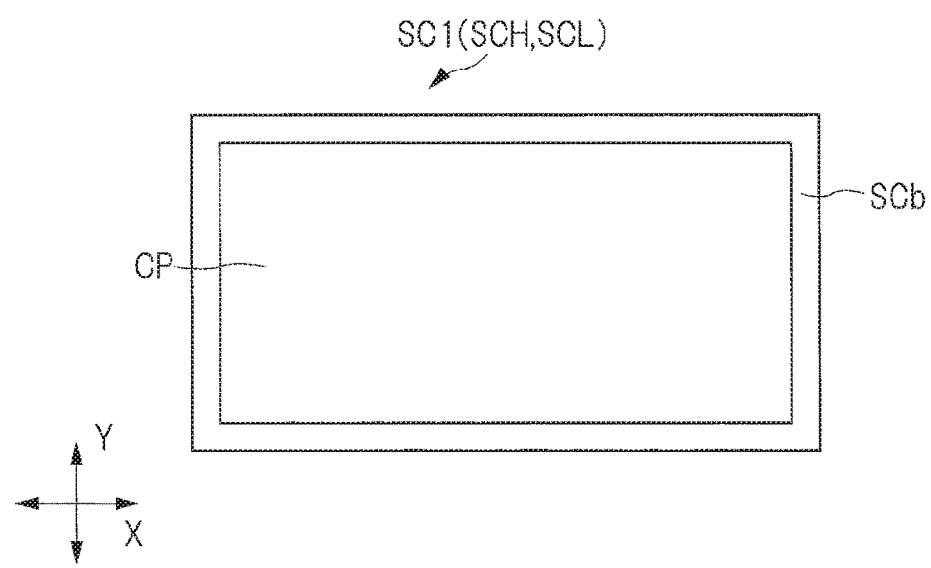
FIG. 3 is a plan view of a back surface of the semiconductor chip of FIG. 2.
Figure 4:
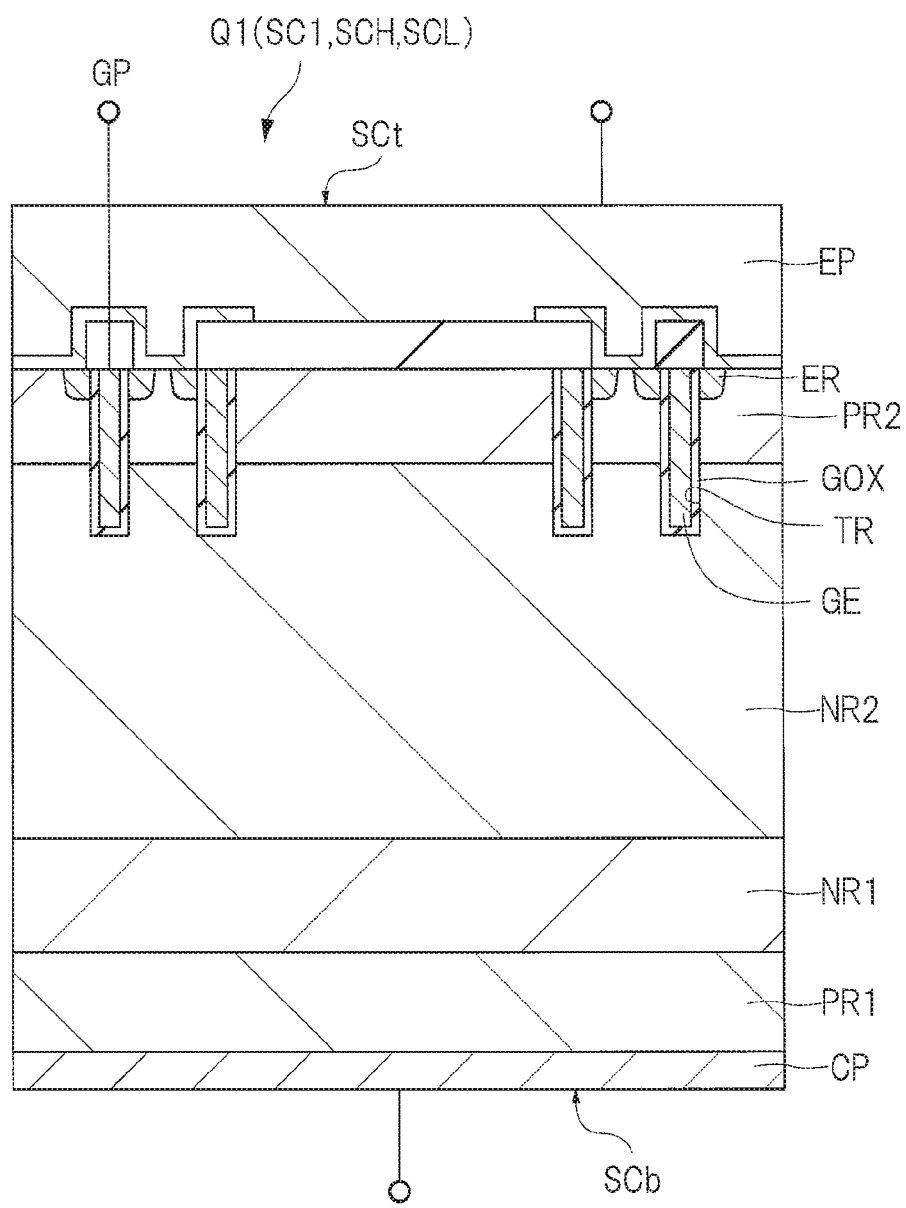
FIG. 4 is a sectional view showing a structure example of a transistor that the semiconductor chip of FIGS. 2 and 3 has.

A structure of a power semiconductor chip having the transistor Q1 serving as an IGBT making up the inverter circuit PWC of FIG. 1 and a structure of a semiconductor chip having the diode FWD will then be descried with reference to drawings. FIG. 2 is a plan view showing a front-surface-side shape of a semiconductor chip on which the transistor of FIG. 1 is formed. FIG. 3 is a plan view showing a back surface of the semiconductor chip of FIG. 2. FIG. 4 is a sectional view showing a structure example of a transistor that the semiconductor chip of FIGS. 2 and 3 has.

In a case of this embodiment, the transistor Q1 and the diode FWD that make up the inverter circuit PWC are separately formed on different semiconductor chips independent of each other. A semiconductor chip (power semiconductor chip, semiconductor component) SC1 forming the transistor Q1 will first be described, and then a semiconductor chip (power semiconductor chip, semiconductor component) SC2 forming the diode FWD will be described.

As shown in FIGS. 2 and 3, the semiconductor chip SC1 of this embodiment has a front surface (surface, upper surface, main surface) SCt (see FIG. 2), and a back surface (surface, lower surface, main surface) SCb (see FIG. 3) opposite to the front surface SCt. The front surface SCt and back surface SCb of the semiconductor chip SC1 are each rectangular. An area of the front surface SCt is, for example, equal to that of the back surface SCb.

As shown in FIG. 2, the semiconductor chip SC1 also has a gate electrode (gate electrode pad, surface electrode) GP and emitter electrodes (emitter electrode pads, surface electrodes) EP that are formed on the front surface SCt. In the example of FIG. 2, one gate electrode GP and two emitter electrodes EP are exposed from the front surface SCt. An exposed area of each of the two emitter electrodes EP is larger than an exposed area of the gate electrode GP. The emitter electrodes EP are connected to an output terminal or the low-side terminal LT (see FIG. 1) of the inverter circuit PWC (see FIG. 1). By enlarging the exposed area of the emitter electrode EP, therefore, impedance of a transmission path through which a large current flows can be reduced.

As shown in FIG. 3, the semiconductor chip SC1 also has a collector electrode (collector electrode pad, back surface electrode) CP formed on the back surface SCb. The collector electrode CP is formed to cover the whole of the back surface SCb of the semiconductor chip SC1. It is understood by comparing FIG. 2 with FIG. 3 that the exposure area of the collector electrode CP is further larger than that of the emitter electrode EP. The collector electrodes CP is connected to an output terminal or the high-side terminal HT (see FIG. 1) of the inverter circuit PWC (see FIG. 1) although described in detail later. By enlarging the exposed area of the collector electrode CP, therefore, impedance of a transmission path through which a large current flows can be reduced.

As shown in FIG. 2, the semiconductor chip SC1 of this embodiment also has a plurality of electrodes exposed from the front surface SCt. The plurality of electrodes include the above gate electrode GP and emitter electrodes EP and a plurality of other signal electrodes (signal electrode pads, surface electrodes) DTP. Each of the plurality of signal electrodes DTP is an output terminal that outputs, as an electric signal, measurement data on temperature etc. of the semiconductor chip SC1. Exemplified as the electric signals outputted via the signal electrode DTP is, for example, a temperature signal of the semiconductor chip SC1, a measurement signal at a potential level of the emitter electrode EP, a detection signal of a current flowing through the emitter electrode EP, or the like. In the example of FIG. 2, emitter signal electrodes EDP that are parts of the plurality of signal electrodes DTP are electrically connected to the emitter electrodes EP inside the semiconductor chip SC1. Thus, the measurement signal at the potential level of the emitter electrode EP, the detection signal of the current flowing through the emitter electrode EP, or the like can be outputted from the emitter signal electrode EDP. The electric signal outputted from the signal electrode DTP is inputted to, for example, the control circuit CT of FIG. 1. The control circuit CT then carries out a data processing (computation processing) to the electric signal. Data created by the data processing is outputted to, for example, an external control device, and can be used as data for monitoring a state of the semiconductor chip SC1. Or, so-called feedback control which changes a control signal outputted from the control circuit CT to the gate drive circuit GC (see FIG. 1) can be also performed based on the data created by the data processing. In this manner, by outputting as an electric signal the measurement data on the temperature etc. of the semiconductor chip SC1, the operation of the inverter circuit PWC can be made more efficient. That is, performance of the inverter circuit PWC can be improved.

In addition, each of the gate electrode GP and the plurality of signal electrodes DTP is an electrode for signal transmission. For this reason, a current flowing through each of these electrodes is smaller in magnitude than that through the emitter electrode EP. The exposure areas of those electrodes are, therefore, smaller than that of the emitter electrode EP.

As shown in FIG. 2, the front surface of the semiconductor chip SC1 also has four sides in its plan view. In the example of FIG. 2, in a plan view, the semiconductor chip SC1 has: a side (long side) SC1e1 extending in an X direction; a side (long side) SC1e2 located opposite to the side SC1e1; a side (short side) SC1e3 extending in a Y direction intersecting the X direction (at a right angle in FIG. 2); and a side (short side) SC1e4 located opposite to the side SC1e3. The sides SC1e1 and SC1e2 are relatively longer than the sides SC1e3 and SC1e4, respectively. The signal electrodes DTP and gate electrode GP among the plurality of electrodes exposed from the front surface SCt of the semiconductor chip SC1 are arranged along the same side (side SC1e3 in FIG. 2). As described later, the gate electrode GP and each of the signal electrodes DTP are connected via a wire(s). When the gate electrode GP and signal electrodes DTP are arranged along the same side, layout of signal transmission paths connected to the respective electrodes can be simplified, so that a design which makes each transmission path equal in length becomes easy.

The transistor Q1 equipped with the semiconductor chip SC1 also has, for example, a structure shown in FIG. 4. On the collector electrode CP formed on the back surface SCb of the semiconductor chip SC1, a $p^+$-type semiconductor region PR1 is formed. An $n^+$-type semiconductor region NR1 is formed on the $p^+$-type semiconductor region PR1, and an $n^-$-type semiconductor region NR2 is formed on this $n^+$-type semiconductor region NR1. A p-type semiconductor region PR2 is formed on the $n^-$-type semiconductor region NR2, and trenches TR are formed so as to penetrate the p-type semiconductor region PR2 to reach the $n^-$-type semiconductor region NR2. Further, $n^+$-type semiconductor regions ER to be aligned with the trenches TR and be made emitter regions are formed. A gate insulating film GOX made of, for example, a silicon oxide film is formed inside each trench TR, and a gate electrode GE is formed via the gate insulating film GOX. The gate electrode GE is made of, for example, a polysilicon film and is formed so as to fill and embed the trench TR.

In the transistor Q1 structured in the above manner, the gate electrode GE is connected to the gate electrode GP of FIG. 2. Likewise, the $n^+$-type semiconductor region ER to be an emitter region is connected electrically to the emitter electrode EP, and the $p^+$-type semiconductor region PR1 to be a collector region is connected electrically to the collector electrode CP formed on the back surface SCb of the semiconductor chip SC1. The transistor Q1 combines high-speed switching and voltage drive characteristics of the power MOSFET and a low on-voltage characteristic of the bipolar transistor.

Incidentally, the $n^+$-type semiconductor region NR1 is referred to as a buffer layer. This $n^+$-type semiconductor region NR1 is provided in order to prevent a punch-through phenomenon in which a depletion layer growing from the p-type semiconductor region PR2 into the $n^-$-type semiconductor region NR2 contacts with the $p^+$-type semiconductor region PR1 formed under the $n^-$-type semiconductor region NR2 when the transistor Q1 is turned off. The $n^+$-type semiconductor region NR1 is also provided for the purpose of limiting etc. the volume of holes injected from the $p^+$-type semiconductor region PR1 into the $n^-$-type semiconductor region NR2.

The gate electrode GE of the transistor Q1 is also connected to the gate drive circuit GC (see FIG. 1). At this time, a signal from the gate drive circuit GC is applied to the gate electrode GE of the transistor Q1 via the gate electrode GP, so that the switching operation of the transistor Q1 can be controlled from the gate drive circuit GC.

Figure 5:
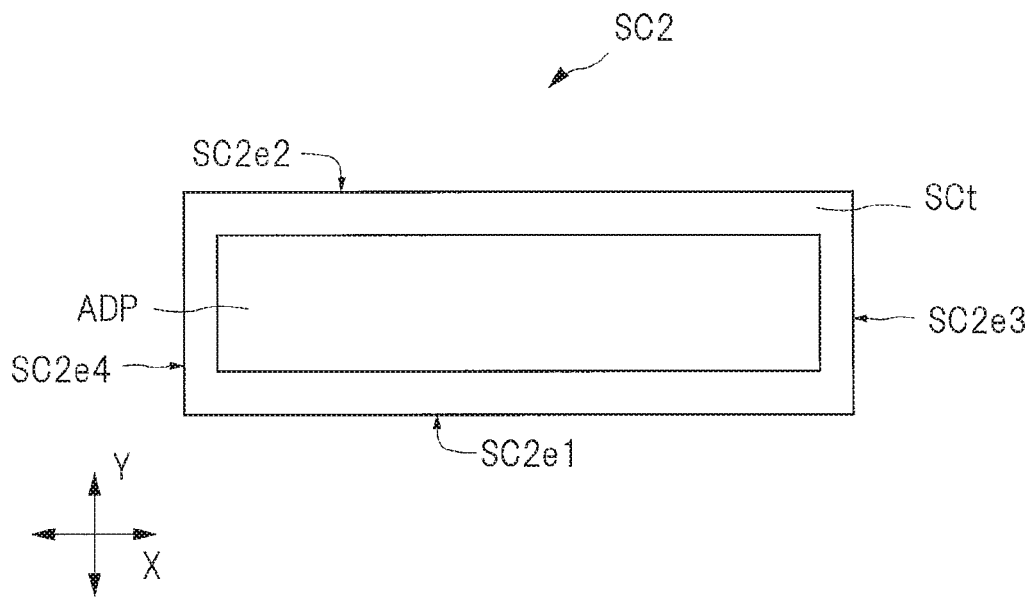
FIG. 5 is a plan view showing a front-surface-side shape of a semiconductor chip having a diode of FIG. 1.
Figure 6:
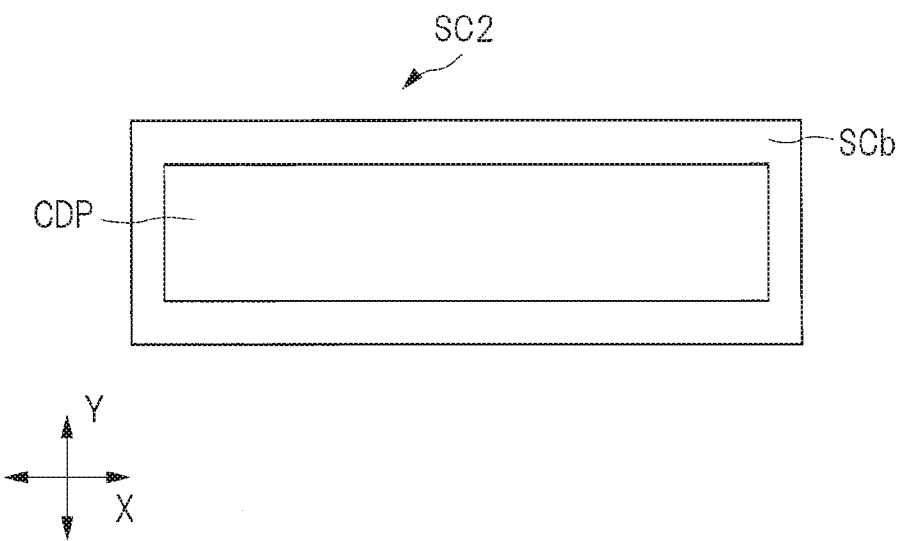
FIG. 6 is a plan view of a back surface of the semiconductor chip of FIG. 5.
Figure 7:
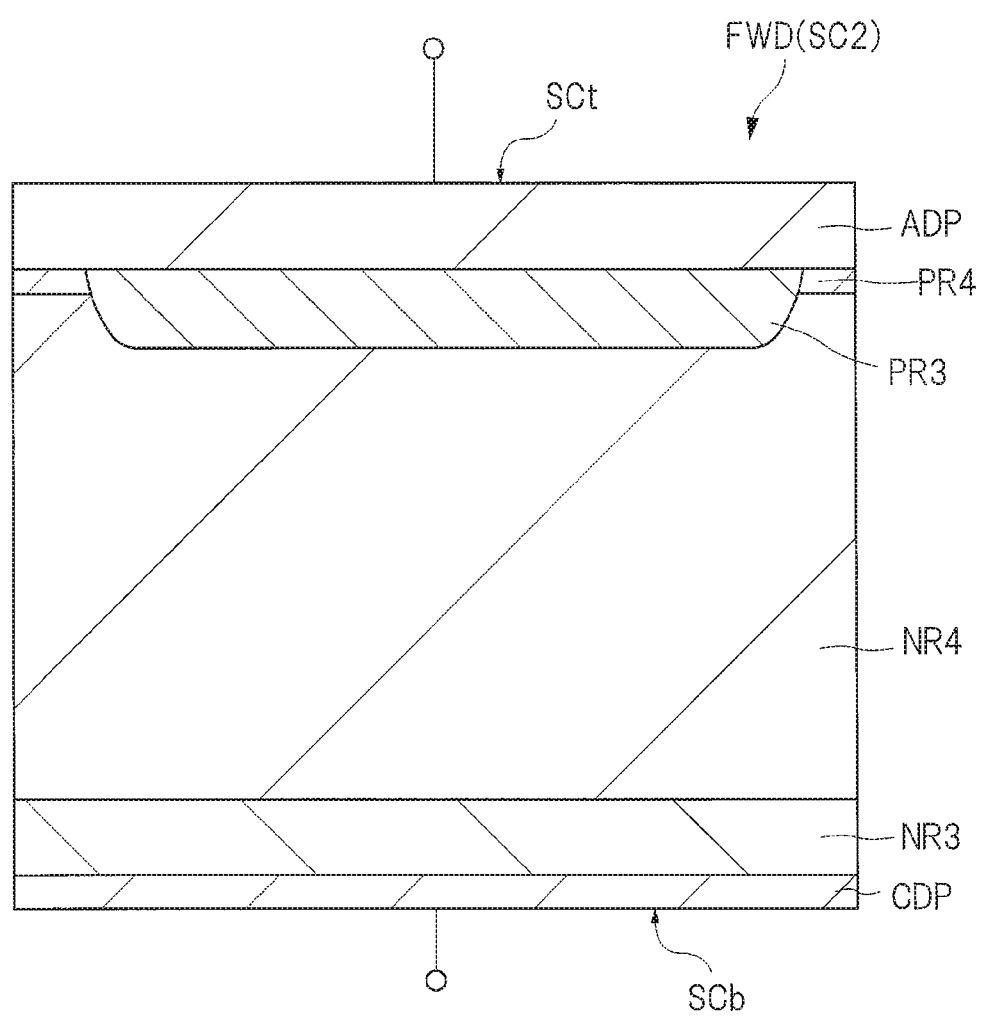
FIG. 7 is a sectional view showing a structure example of a diode that the semiconductor chip of FIGS. 5 and 6 has.

A semiconductor chip on which the diode FWD of FIG. 1 is formed will then be described. FIG. 5 is a plan view showing a front-surface-side shape of the semiconductor chip on which the diode of FIG. 1 is formed. FIG. 6 is a plan view showing the back surface of the semiconductor chip of FIG. 5. In addition, FIG. 7 is a sectional view showing a structure example of the diode that the semiconductor chip of FIGS. 5 and 6 has.

As shown in FIGS. 5 and 6, a semiconductor chip SC2 of this embodiment has a front surface (surface, upper surface, main surface) SCt (see FIG. 5), and a back surface (surface, lower surface, main surface) SCb (see FIG. 6) opposite to the front surface SCt. The front surface SCt and back surface SCb of the semiconductor chip SC2 are each rectangular. An area of the front surface SCt is, for example, equal to that of the back surface SCb.

In addition, as shown in FIG. 5, the front surface of the semiconductor chip SC2 has four sides in its plan view. In the example of FIG. 2, in a plan view, the semiconductor chip SC2 has: a side (long side) SC2$e$1 extending in the X direction; a side (long side) SC2$e$2 located opposite the side SC2$e$1; a side (short side) SC2$e$3 extending in the Y direction intersecting the X direction (at a right angle in FIG. 5); and a side (short side) SC2$e$4 located opposite the side SC2$e$3. The sides SC2$e$1 and SC2$e$2 are relatively longer than the sides SC2$e$3 and SC2$e$4, respectively.

It is also understood by comparing FIG. 2 with FIG. 5 that the area of the front surface SCt of the semiconductor chip SC1 (see FIG. 2) is larger than the area of the front surface SCt of the semiconductor chip SC2 (see FIG. 5).

In addition, as shown in FIG. 5, the semiconductor chip SC2 has an anode electrode (anode electrode pad, surface electrode) ADP formed on the front surface SCt. As shown in FIG. 6, the semiconductor chip SC2 has a cathode electrode (cathode electrode pad, surface electrode) CDP formed on the back surface SCb. The cathode electrode CDP is formed is so as to cover the whole of the back surface SCb of the semiconductor chip SC2.

In addition, the diode FWD equipped with the semiconductor chip SC2 has, for example, a structure shown in FIG. 7. As shown in FIG. 7, an $n^+$-type semiconductor region NR3 is formed on the cathode electrode CDP formed on the back surface SCb of the semiconductor chip SC2. An $n^-$-type semiconductor region NR4 is formed on the $n^+$-type semiconductor region NR3, and p-type semiconductor regions PR4 are formed on the $n^-$-type semiconductor region NR4 so as to be separated from each other. Between these p-type semiconductor regions PR4, a p-type semiconductor region PR3 is formed. The anode electrode ADP is formed on the $p^-$-type semiconductor region PR3 and p-type semiconductor regions PR4. The anode electrode ADP is made of, for example, aluminum and silicon.

According to the diode FWD structured in the above manner, when a positive voltage is applied to the anode electrode ADP and a negative voltage is applied to the cathode electrode CDP, a pn junction between the $n^-$-type semiconductor region NR4 and the $p^-$-type semiconductor region PR3 is forward biased to carry a current. In contrast, when a negative voltage is applied to the anode electrode ADP and a positive voltage is applied to the cathode electrode CDP, the pn junction between the $n^-$-type semiconductor region NR4 and the p-type semiconductor region PR3 is reversely biased to carry no current. This can cause the diode FWD with a rectifying function to operate.

<Configuration of Drive Circuit>

Figure 8:
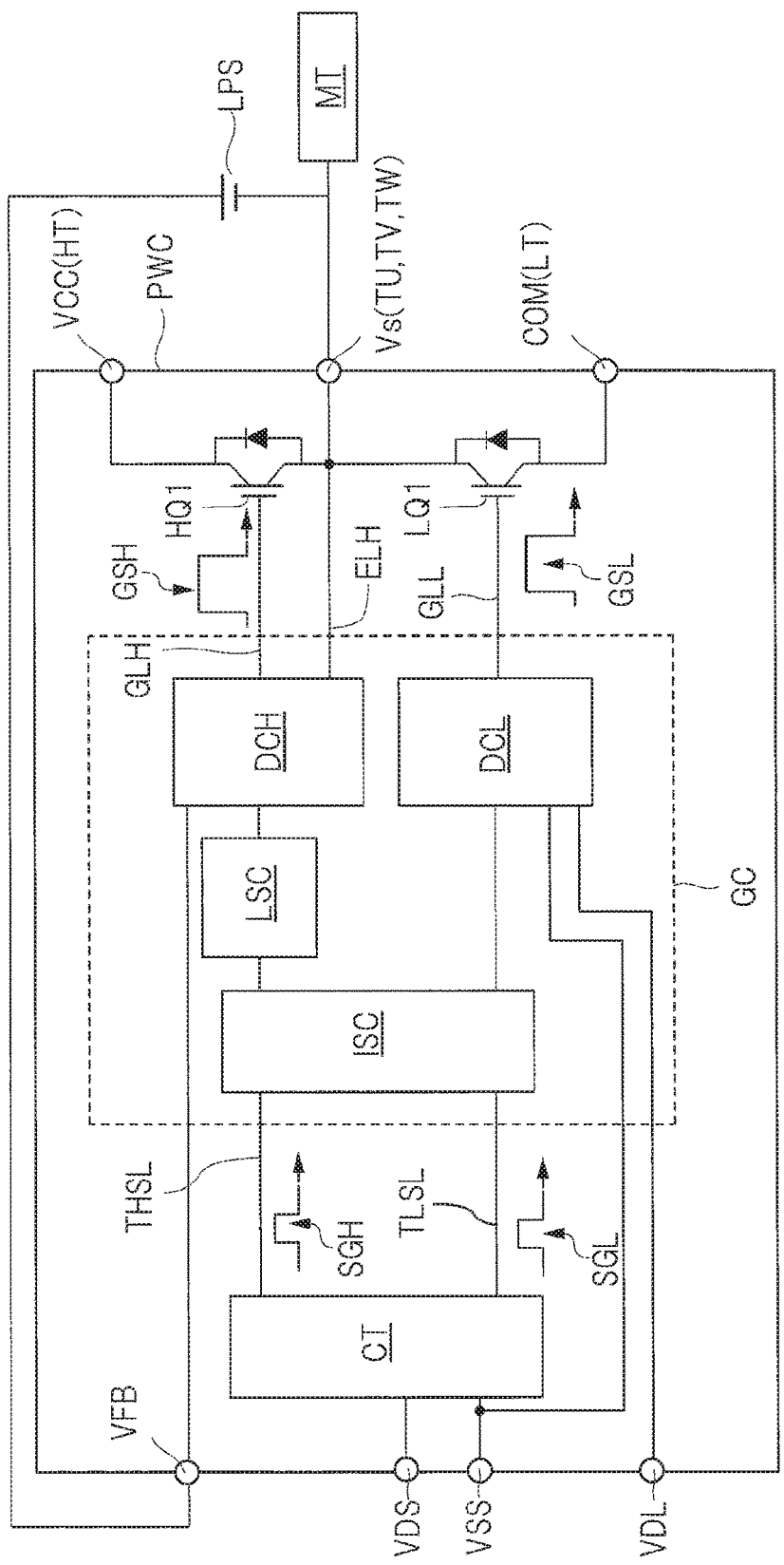
FIG. 8 is a view showing a circuit block configuration of a gate drive circuit.

A configuration of the gate drive circuit GC of FIG. 1 will then be described. FIG. 8 is a view showing a circuit block configuration of the gate drive circuit. By taking as an example one phase out of three phases of the inverter circuit PWC that drives the motor MT, a configuration of the gate drive circuit GC that controls a voltage of the one phase will be described with reference to FIG. 8. In FIG. 8, between a terminal VCC electrically connected to a high-voltage power source and a terminal COM electrically connected to, for example, a low-voltage power source, a high-side transistor HQ1 and a low-side transistor LQ1 making up, for example, an element corresponding to one phase of the inverter circuit PWC are connected in series. An intermediate node between the high-side transistor HQ1 and the low-side transistor LQ1 is electrically connected to the motor MT via a terminal Vs.

The gate drive circuit GC is configured so as to control an on/off operations of the high-side transistor (high-side IGBT) HQ1 and an on/off operations of the low-side transistor (low-side IGBT) LQ1. For example, the gate drive circuit GC controls a gate voltage applied to the gate electrode of the high-side transistor HQ1, thereby realizing the on/off operations of the high-side transistor HQ1, and controls a gate voltage applied to the gate electrode of the low-side transistor LQ1, thereby realizing the on/off operations of the low-side transistor LQ1.

The gate drive circuit GC of FIG. 8 is connected to, for example, a terminal VDL electrically connected to a low-voltage power source (e.g., 15 V), and a terminal VSS electrically connected to a reference potential (e.g., a fixed potential such as a grounding potential). The gate drive circuit GC has: an input signal processing circuit ISC that processes an input signal from the control circuit CT; a level shift circuit LSC; a low-side drive circuit DCL; and a high-side drive circuit DCH. As schematically shown in FIG. 8, the control circuit CT transmits, through a control signal line THSL, a signal SGH which controls the operation of the high-side drive circuit DCH. The control circuit CT also transmits, through a control signal line TLSL, a signal SGL which controls the operation of the low-side drive circuit DCL.

Based on a processed signal outputted from the input signal processing circuit ISC, the low-side drive circuit DCL controls a gate voltage applied to the gate electrode of the low-side transistor LQ1. For example, the low-side drive circuit DCL inputs a reference potential from the terminal SS, and supplies, to the gate electrode of the low-side transistor LQ1, a gate voltage that is generated based on the reference potential. Here, when the gate voltage supplied to the gate electrode is equal to or higher than a threshold voltage with respect to the reference potential, the low-side transistor LQ1 is turned on. Meanwhile, when the gate voltage supplied to the gate electrode is lower than a threshold voltage with respect to the reference potential, the low-side transistor LQ1 is turned off. In this manner, the on/off operations of the low-side transistor LQ1 are controlled by the low-side drive circuit DCL.

Meanwhile, after a processed signal from the input signal processing circuit ISC is inputted to a level shift circuit LSC, the high-side drive circuit DCH controls, based on an output signal from the level shift circuit LSC, a gate voltage applied to the gate electrode of the high-side transistor HQ1. For example, the high-side drive circuit DCH inputs a reference potential to become a standard from the terminal Vs connected to the motor MT which is a load. The high-side transistor HQ1 uses, for example, its emitter potential as the reference potential. This emitter potential is outputted from the emitter signal electrode EDP of the semiconductor chip SC1 of FIG. 2 and is supplied to the high-side drive circuit DCH via an emitter line ELH. The emitter potential of the high-side transistor HQ1 fluctuates between a potential supplied to the terminal COM and a potential supplied to the terminal VCC. For example, when the high-side transistor HQ1 is turned on, the emitter potential of the high-side transistor HQ1 becomes the same as a power source potential supplied to the terminal VCC. In order to cause the high-side transistor HQ1 to be turned on, this case means needing to generate the gate voltage by using the power source potential as a standard. The high-side drive circuit DCH thus inputs the emitter potential of the high-side transistor HQ1 from the terminal Vs and generates, based on the potential inputted from the terminal Vs, a gate voltage applied to the gate electrode of the high-side transistor HQ1. Since the potential inputted from the terminal Vs fluctuates up to the power source potential, the gate voltage of the high-side transistor HQ1 that is generated based on the potential inputted from the terminal Vs needs having a potential higher than the power source potential. In the high-side drive circuit DCH, for example, a terminal VFB is connected to a low-voltage power source LPS (e.g., 15 V) disposed outside the inverter circuit PWC, and a potential inputted from this terminal VFB is used to generate a gate voltage higher than the power source potential. This gate voltage is supplied to the gate electrode of the high-side transistor HQ1 from the high-side drive circuit DCH. In the above manner, when the gate voltage supplied to the gate electrode is equal to or higher than the threshold voltage with respect to the reference potential, the high-side transistor HQ1 is turned on. Meanwhile, when the gate voltage supplied to the gate electrode is lower than the threshold voltage with respect to the reference potential, the high-side transistor HQ1 is turned off. In this manner, the on/off operations of the high-side transistor HQ1 are controlled by the high-side drive circuit DCH.

now, the control circuit CT is connected to a terminal VDS, which is connected to a power source potential node (e.g., about 1.5 V or 3 V) further lower than a potential of the terminal VDL. A power source potential supplied from the terminal VDS is used to generate a digital signal(s) for control. Such a digital signal for control includes the signals SGH and SGL schematically shown in FIG. 8.

Meanwhile, a gate signal GSH, which is a gate drive signal, is transmitted through a gate line GLH to the gate electrode of the high-side transistor HQ1. In addition, a gate signal GSL, which is a gate drive signal, is transmitted through a gate line GLL to the gate electrode of the low-side transistor LQ1. A potential difference (voltage) between the gate signal GSH and the gate signal GSL is, for example, 15 V, which is larger than a potential difference (voltage) between the signal SGH and the signal SGL. In addition, a current flowing through the gate lines GLH and GLL is 100 times as large as or more than a current flowing through the control signal lines THSL and TLSL. For example, a current flowing through the control signal lines THSL and TLSL is of microampere (pA) order, while the current flowing through the gate lines GLH and GLL is of milliampere (mA) order. For this reason, as schematically shown in FIG. 8, amplitudes of waveforms of the gate signals GSH and GSL are larger than those of the signals SGH and SGL.

In this manner, when the gate signals GSH and GSL whose waveforms have large amplitudes are compared to the signals SGH and SGL whose waveforms have small amplitudes, a time for raising a potential level becomes difficult to control. However, it is important for stabilizing the operation of the power transistor that a rising time till the potential level exceeds a threshold value is matched with a falling time till the potential level drops below the threshold value. For this reason, although the gate signals GSH and GSL are digital signals, they are preferably treated as analog signals in terms of controlling of the rising time and falling time. In other words, it is preferable that a path distance of the gate line GLH and that of the gate line GLL are made equal to each other in terms of matching of the rising times of the gate signals GSH and GSL and matching of the falling times thereof. In addition, as described with reference to FIG. 1, the inverter circuit PWC of this embodiment has three phases, so that each of the gate line GLH and gate line GLL of FIG. 8 has three in number. In this case, the respective path distances of the six gate lines are preferably made equal in length to each other.

In this embodiment, as detailed later, the output unit PW1 and the control unit PW2 shown by FIG. 1 are formed on mutually different substrates, so that the respective path distances of the six gate lines becomes long. Therefore, making the respective path distances of the six gate lines equal in length to each other is important for improving the performance of the inverter circuit PWC.

<Structure of Electronic Device>

Figure 9:
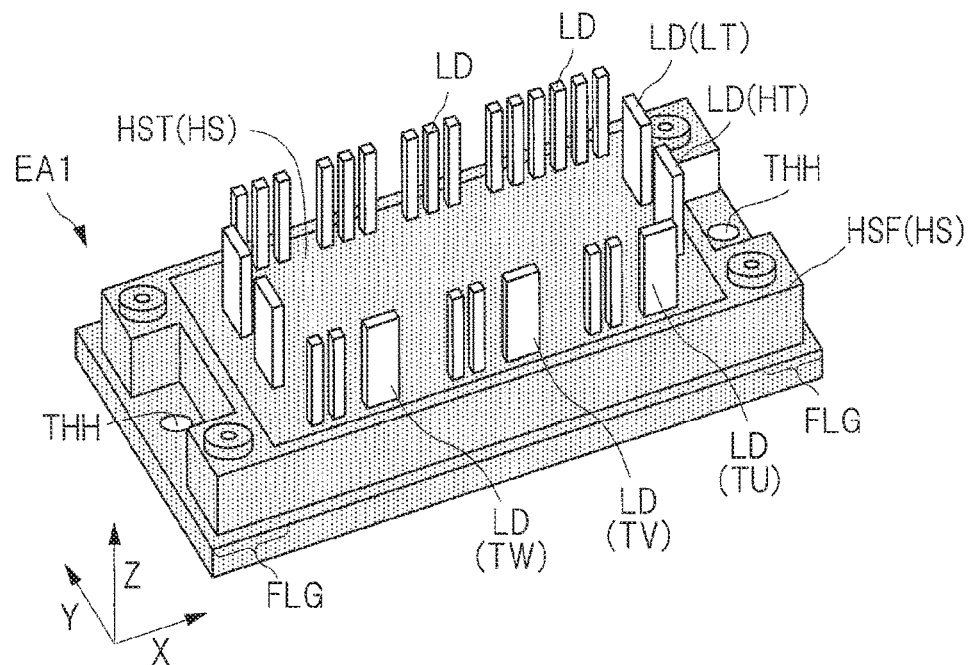
FIG. 9 is a perspective view showing an appearance of an electronic device making up the inverter circuit of FIG. 1.
Figure 10:
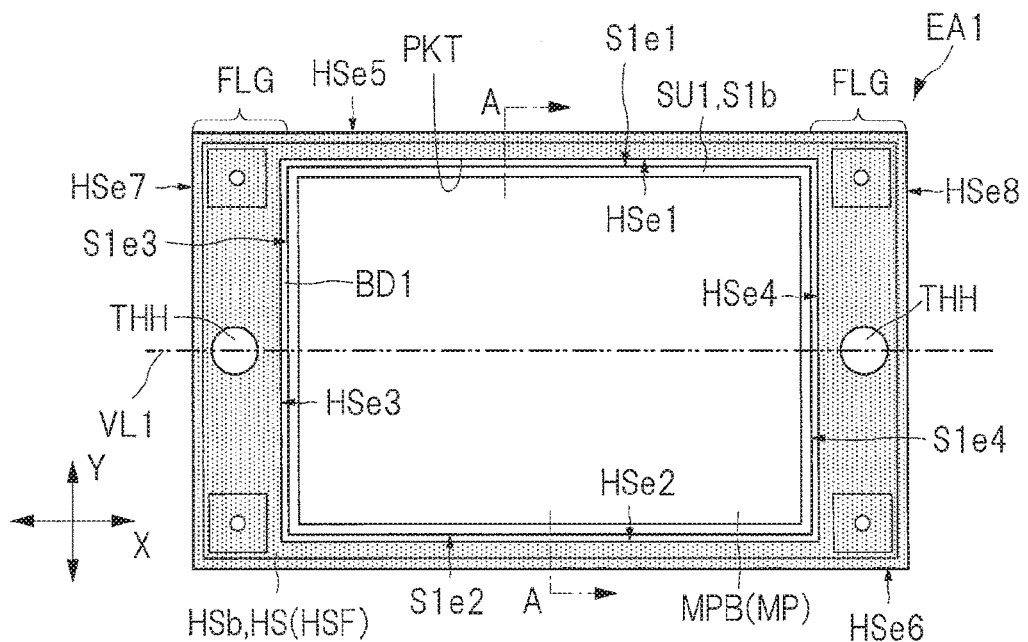
FIG. 10 is a plan view showing a back surface side of the electronic device of FIG. 9.
Figure 11:
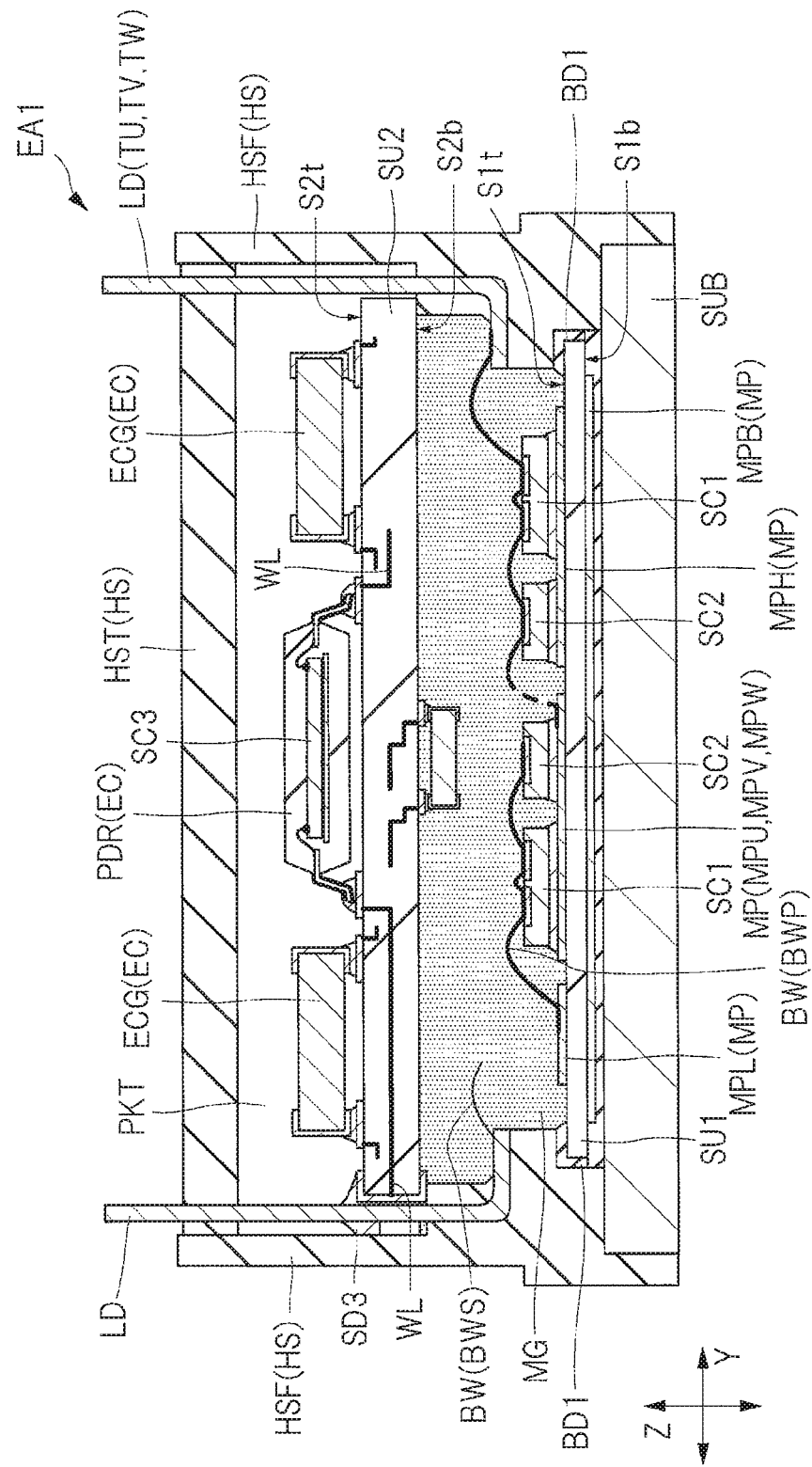
FIG. 11 is a sectional view taken along an A-A line of FIG. 10.
Figure 12:
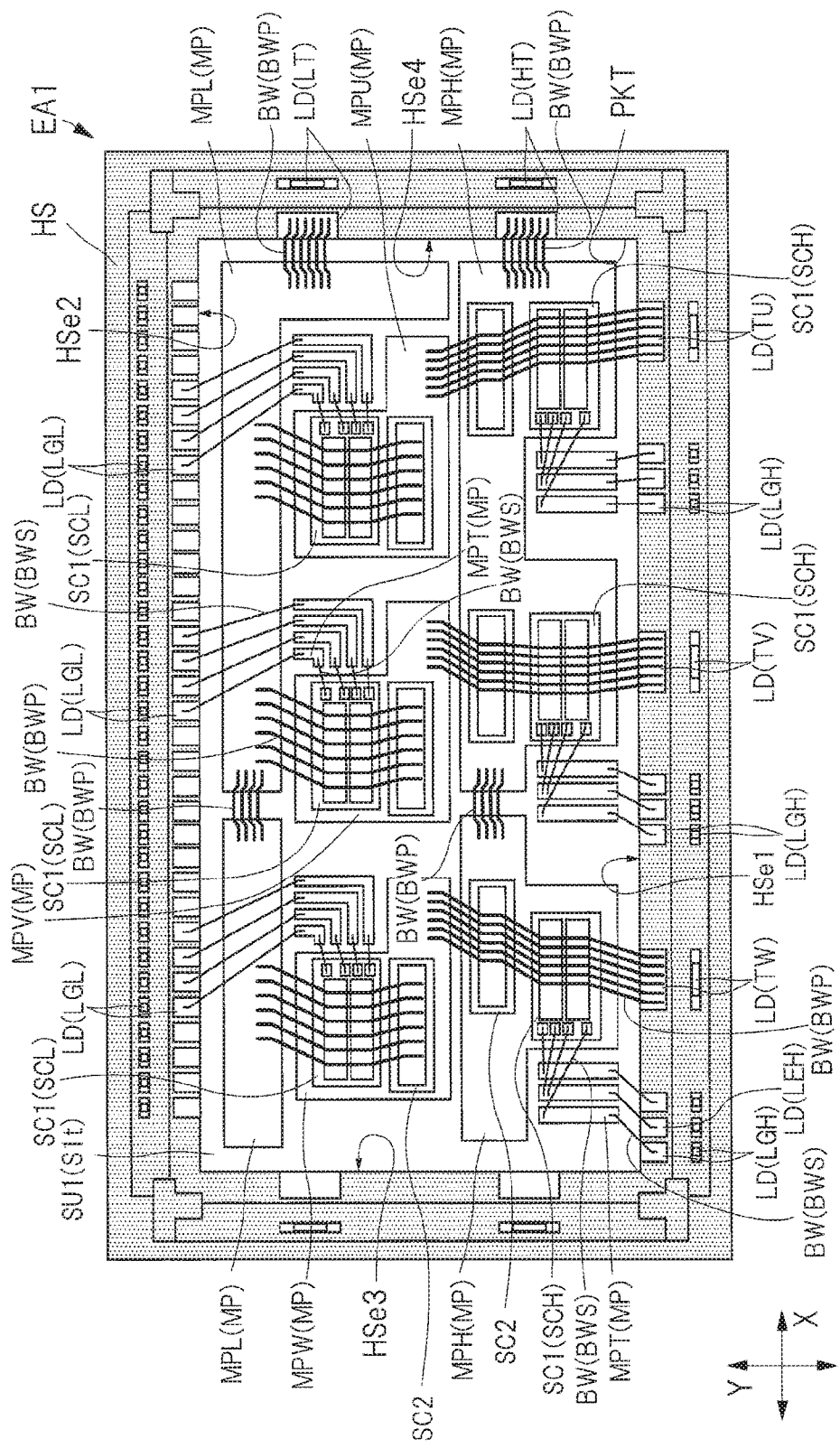
FIG. 12 is a plan view showing layout on an upper surface side of a lower-side substrate shown in FIG. 11.

A configuration example of an electronic device EA1 making up the inverter circuit PWC of FIG. 1 will then be described. FIG. 9 is a perspective view showing an appearance of the exterior of the electronic device making up the inverter circuit of FIG. 1. Incidentally, FIG. 10 shows a back surface side of a substrate SU1 from which a base substrate SUB shown in FIG. 11 is removed. FIG. 11 is a sectional view taken along an A-A line of FIG. 10. In FIG. 11, apart of wires connected to the semiconductor chip is indicated by a dotted line. In FIG. 11, an electronic component group composed of a plurality of electronic components connected to a driver component PDR mounted on a substrate SU2 is schematically shown as a single electronic component. FIG. 12 is a plan view showing layout on an upper-surface side of a lower-side substrate shown in FIG. 11.

Figure 13:
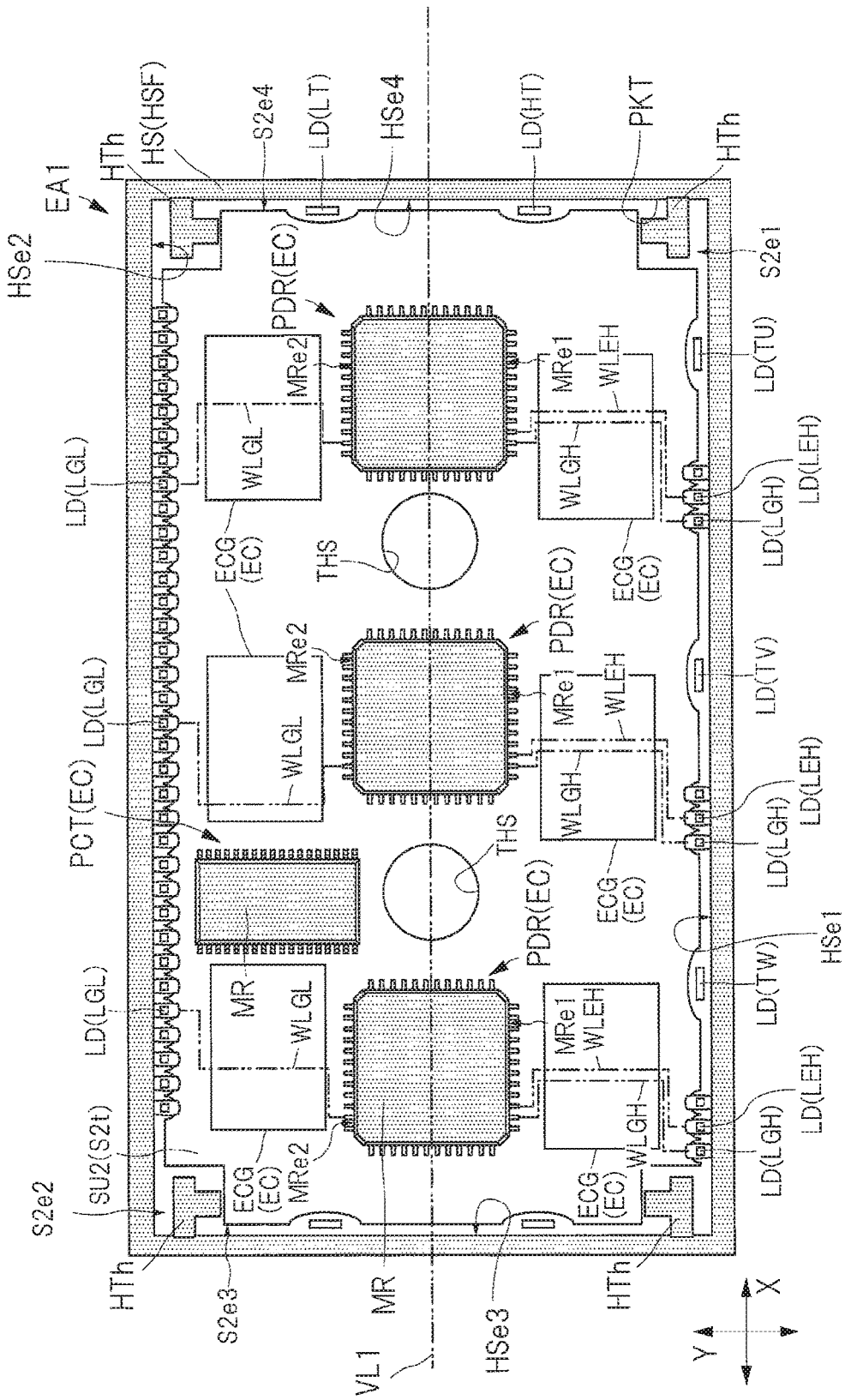
FIG. 13 is a plan view showing layout on an upper surface side of an upper-side substrate shown in FIG. 11.

In addition, FIG. 13 is a plan view showing layout on an upper-surface side of an upper-side substrate shown in FIG. 11. FIG. 13 shows wirings WLGH, WLGL, and WLEH as an example of wirings formed on the wiring substrate SU2. Since the wirings WLGH, WLGL, and WLEH are each formed between an upper surface S2$t$ and a lower surface S2$b$ of the wiring substrate SU2 of FIG. 11, they are indicated by dash-double-dot lines in FIG. 13.

The electronic device EA1 of this embodiment, which makes up the inverter circuit PWC of FIG. 1, is covered with an enclosure (case, housing) HS on its upper-surface side, as shown in FIG. 9. The electronic device EA1 is a case module in which a plurality of semiconductor chips SC1 and SC2 (see FIG. 12) electrically connected to each other are accommodated in the enclosure HS, and a plurality of leads (lead members, terminals) LD serving as external terminals are exposed from the enclosure HS.

The enclosure HS has a lid (lid member, cap) HST covering the plurality of semiconductor components (semiconductor chips SC1 and SC2 (see FIG. 12)), and a support (frame) HSF supporting the lid HST. Each of the support HSF and lid HST that make up the enclosure HS is a resin component made mainly of, for example, polyethylene terephthalate (hereinafter, "PET"). Incidentally, in a case of this embodiment, the lid HST and the support HSF are independent of each other and are members capable of being separated from each other. The lid HST and the support HSF, however, may be members incapable of being separated from each other. For example, the lid HST and the support HSF may be bonded and fixed via an adhesive. Or, the lid HST and the support HSF may be formed integrally.

In addition, as shown in FIG. 10, the support HSF continuously encircles a periphery of the substrate (output substrate) SU1. As shown in FIG. 11, the lid HST covers the entirety of an upper surface (surface, front surface, main surface) S$it$ of the substrate SU1. A space is provided inside the support HSF, and the plurality of semiconductor chips SC1 and SC2 mounted on the substrate SU1 are accommodated in a space (accommodation portion PKT) enclosed by the support HSF, the lid HST, and the base substrate SUB.

The periphery of the upper surface S$it$ of the substrate SU1 is bonded/fixed to the enclosure HS via a bond (glue) BD1.

In addition, a plurality of leads LD project from the lid HST of the enclosure HS. A plurality of through-holes (not shown) are formed in the lid HST of the enclosure HS, and the plurality of leads LD are inserted into the plurality of through-holes, respectively. The leads LD each are an external terminal of the electronic device EA1, and are connected electrically to: the plurality of semiconductor chips SC1 mounted on the substrate SU1 of FIG. 12; a plurality of driver components (semiconductor devices, semiconductor components, semiconductor packages) PDR mounted on the wiring substrate (control substrate) SU2 of FIG. 13; or a controller component (semiconductor device, semiconductor component, semiconductor package) PCT.

In addition, as shown in FIG. 10, in a plan view, the accommodation portion PKT of the enclosure HS has: a side (long side) HSe1 extending in the X direction; a side (long side) HSe2 located opposite the side HSe1; a side (short side) HSe3 extending in the Y direction intersecting the X direction (at a right angle in FIG. 10); and a side (short side) HSe4 located opposite the side HSe3. The sides HSe1 and HSe2 are relatively longer than the sides HSe3 and HSe4, respectively. Incidentally, in the example of FIG. 10, the accommodation portion PKT of the enclosure HS is formed into a square (rectangular) shape in a plan view. The enclosure HS has four sides at its outer periphery. If detailed, in a plan view, the outer periphery of the enclosure HS has: aside (long side) HSe5 extending in the X direction; a side (long side) HSe6 located opposite the side HSe5; a side (short side) HSe7 extending in the Y direction intersecting the X direction (at a right angle in FIG. 10); and a side (short side) HSe8 located opposite the side HSe7. The sides HSe5 and HSe6 are relatively longer than the sides HSe7 and HSe8, respectively. The side HSe1 of the accommodation portion PKT and the side HSe5 of the outer periphery are located opposite each other with a part of the enclosure HS sandwiched. Similarly, the sides HSe2, HSe3, and HSe4 of the accommodation portion PKT and the sides HSe6, HSe7, and HSe8 of the outer periphery are located opposite each other with parts of the enclosure HS sandwiched therefrom.

In addition, in a plan view, the substrate SU1 has: a side (long side, substrate side) S1$e$1 extending in the X direction; a side (long side, substrate side) S1$e$2 located opposite the side S1$e$1; a side (short side, substrate side) S1$e$3 extending in the Y direction intersecting the X direction (at a right angle in FIG. 10); and a side (short side, substrate side) S1$e$4 located opposite the side S1$e$3. The sides S1$e$1 and S1$e$2 are relatively longer than the sides S1$e$3 and S1$e$4, respectively.

In the example of FIG. 10, the substrate SU1 is square (particularly rectangular) in a plan view. In the example of FIG. 10, the side S1$e$1 of the substrate SU1 opposes the side HSe1 of the accommodation portion PKT of the enclosure HS. The side S1$e$2 of the substrate SU1 opposes the side HSe2 of the accommodation portion space PKT of the enclosure HS. The side S1$e$3 of the substrate SU1 opposes the side HSe3 of the accommodation portion PKT of the enclosure HS. The side S1$e$4 of the substrate SU1 opposes the side HSe4 of the accommodation portion PKT of the enclosure HS.

In addition, as shown in FIGS. 9 and 10, the enclosure HS has flanges (portions) FLG that are attachment portions for fixing the electronic device EA1 to, for example, a heat sink, support member, or the like. As shown in FIG. 10, the flanges FLG are provided to both ends of the support HSF in the X direction that is a longitudinal direction of the enclosure HS in a plan view. In other words, in the X direction, two flanges FLG are located opposite each other via the accommodation portion PKT in which the substrate SU1 is accommodated. Some of the flanges FLG each have a through-hole (hole, screw hole, screw insertion hole) THH formed at its middle. The through-hole THH is an opening that penetrates the flange FLG of the enclosure HS in a direction of its thickness, and the electronic device EA1 can be screwed and fixed by inserting a screw (not shown) into the through-holes THH in fixing the electronic device EA1 to, for example, the heat sink or support member.

In the example of FIG. 10, two through-holes THH are formed along a virtual line (center line) VL1 extending in the X direction that is the longitudinal direction so as to connect a center of the side HSe3 to a center of the side HSe4. In the example of FIG. 10, the virtual line VL1 is, in the X direction, a straight line that connects (presses) a center point of the through-hole THH located on one side and a center point of the through-hole THH located on the other side. In the example of FIG. 10, in a plan view as viewed from a lower surface (surface, back surface, main surface) Sib side of the substrate SU1, the virtual line VL1 traverses (passes through) the lower surface Sib of the substrate SU1. Here, the center point of the lower surface Sib of the substrate SU1 can be defined in the same manner as a center point of the upper surface (surface, front surface, main surface) S1t of the substrate SU1 shown in FIG. 12. That is, the center point of the lower surface Sib (see FIG. 10) and the center point of the upper surface S1t of the substrate SU1 of FIG. 12 are defined as an intersection between a line (virtual line not shown), which connects a midpoint of the side (long side, substrate side) S1e1 of the substrate SU1 to a midpoint of the side (long side, substrate side) S1e2, and a line (virtual line not shown), which connects a midpoint of the side (short side, substrate side) S1e3 to a midpoint of the side (short side, substrate side) S1e4.

The substrates SU1 and SU2 accommodated in the accommodation portion PKT of the enclosure HS of the electronic device EA1, and respective components fixed to the substrates SU1 and SU2 will then be described. As shown in FIG. 11, the electronic device EA1 includes the substrates SU1 and the wiring substrate (substrate) SU2 that are placed in the accommodation portion PKT of the enclosure HS. The substrate SU1 is a substrate corresponding to the output unit PW1 of the inverter circuit PWC (see FIG. 1), and a plurality of semiconductor components making up the output unit PW1 are mounted on the substrate SU1. As shown in FIG. 12, mounted on the substrate SU1 are six semiconductor chips SC1 each operating as a switching element, and six semiconductor chips SC2 each operating as a freewheeling diode. In addition, the substrate SU2 of FIG. 11 is a substrate corresponding to the control unit PW2 (see FIG. 1) of the inverter circuit PWC, and a plurality of electronic components making up the control unit PW2 are mounted on the substrate SU2. As shown in FIG. 13, mounted on the wiring substrate SU2 are three driver components PDR each having the gate drive circuit GC (see FIG. 1). In addition, mounted on the wiring substrate SU2 is one controller component PCT having the control circuit CT (see FIG. 1).

As shown in FIGS. 11 and 12, the electronic device EA1 includes: the substrate SU1; a plurality of metal patterns (patterns made of metal) MP formed on the upper surface S1t of the substrate SU1; and the plurality of semiconductor chips SC1 mounted on some of the metal patterns MP.

As shown in FIG. 11, the substrate SU1 has the upper surface (front surface, main surface, surface) S1t as a chip mounting surface on which the semiconductor chips SC1 are mounted, and the lower surface (back surface, main surface, surface) Sib located opposite the upper surface S1t. The substrate SU1 is a ceramic substrate made of a ceramic material such as alumina (aluminum oxide: $Al_2O_3$).

In addition, as shown in FIG. 11, a plurality of metal patterns MP are joined to the upper surface S1t and lower surface S1b of the substrate SU1. These metal patterns MP are, for example, stacked films in which a nickel (Ni) film is stocked on a front surface of a copper (Cu) film, and the copper film is joined directly onto the upper surface S1t or lower surface Sib of the substrate SU1. Like this embodiment, the substrate SU1 in which the semiconductor chips SC1 are directly mounted on the metal patterns MP made of copper is referred to, in some cases, as a direct bonding cupper (DBC) substrate.

A metal pattern MPB formed on the lower surface Sib side of the substrate SU1 is a metal film making up a heat radiating path of the electronic device EA1, and is formed uniformly in such away as to cover most part of the lower surface Sib of the substrate SU1. Since a metal film is formed on the lower surface Sib of the substrate SU1 that is a ceramic substrate, heat radiating performance of the electronic device EA1 can be improved. In addition, the plurality of metal patterns MP formed on the upper surface S1t of the substrate SU1 each make up apart of a conductive path of the inverter circuit PWC (see FIG. 1), and are detached (separated) from each other.

The plurality of metal patterns MP include metal patterns MPH supplied with a high-side side potential. The plurality of metal patterns MP also include metal patterns MPL supplied with a low-side side potential. The metal patterns MP further include metal patterns MPU, MPV, and MPW each supplied with a potential that changes in response to the switching operations of the transistor Q1 (see FIG. 1).

The metal patterns MPU, MPV, and MPW are supplied with potentials different from each other in phase by 120 degrees. For this reason, the metal patterns MPU, MPV, and MPW are detached (separated) from each other. In addition, the metal patterns MPU, MPV, and MPW is respectively connected to metal patterns MPT, which are connected to output leads LD (terminals TU, TV, and TW), via a plurality of wires BW. The wires BW shown in FIG. 12 are, therefore, included in output transmission paths for U phase, V phase, and W phase of FIG. 1.

In the example of FIG. 12, the metal patterns MPH are structured so that a plurality of metal patterns MPH (two in FIG. 12) are electrically connected to each other via wires BW (BWP). Likewise, the metal patterns MPL are structured such that a plurality of metal patterns MPL (two in FIG. 12) are electrically connected to each other via the wires BW (BWP). The metal patterns MPH are supplied with the same potential (high-side side potential) at each of U phase, V phase, and W phase (see FIG. 1). In addition, the metal patterns MPL are supplied with the same voltage (low-side side potential) at each of U phase, V phase, and W phase. In a modification of this embodiment, therefore, the metal patterns MPH and the metal patterns MPL may be each constructed by a signal metal pattern MP. In such a case, connecting the plurality of metal patterns MPH and MPL to the wires BW (BWP) is unnecessary, which makes it possible to reduce the number of components.

Meanwhile, when each of the metal pattern MPH and metal pattern MPL is divided into a plurality of pieces similarly to this embodiment, an extension distance of each of the metal pattern MPH and metal pattern MPL that are divided and arranged is shorter than an extension distance of each of the metal pattern MPH and metal pattern MPL that are not divided and are arranged, and so the extension distance can be reduced. For this reason, reduced can be a stress caused by a difference in linear expansion coefficient between the metal pattern MP and a ceramic substrate which is a base material.

In addition, mounted on some of the plurality of metal patterns MP are the plurality of semiconductor chips SC1 and semiconductor chips SC2. As described with reference to FIG. 1, the plurality of semiconductor chips SC1 are each a switching element on which the transistor Q1 as an IGBT is formed, and are mounted on the metal patterns MPH, metal pattern MPU, metal pattern MPV, and metal patterns MPW.

The semiconductor chips SC1, which are mounted on the metal patterns MPH, among the plurality of semiconductor chips SC1 are semiconductor chips (semiconductor components) SCH corresponding to high-side side switches. Mounted on the metal patterns MPH are three sets of the semiconductor chips SCH and the semiconductor chips SC2. Each of the semiconductor chips SC2 has the diode FWD (see FIG. 1). In a plan view, three semiconductor chips SCH are arranged along the X direction (in other words, along the side HSe1 that is a long side of the accommodation portion PKT (see FIG. 10) of the enclosure HS). The plurality of semiconductor chips SC2 paired with the plurality of semiconductor chips SCH are respectively mounted so as to line up the semiconductor chips SCH along the Y direction. In the example of FIG. 12, the semiconductor chip SCH is located closer to a side HSe1 side than the semiconductor chip SC2. In other words, the semiconductor chip SCH is mounted between the side HSe1 and the semiconductor chip SC2. Arranged on the side HSe1 side are a plurality of leads (lead members) LD electrically connected to the semiconductor chips SCH. In other words, the semiconductor chips SCH are shorter in distance from the leads LD than the semiconductor chips SC2.

Semiconductor chips mounted respectively on the metal pattern MPU, the metal pattern MPV, and the metal pattern MPW among the plurality of semiconductor chips SC1 are semiconductor chips SCL corresponding to low-side side switches. Each of the semiconductor chips SC2 is mounted on each of the metal pattern MPU, the metal pattern MPV, and the metal pattern MPW so as to make a set with each of the semiconductor chips SCL. In a plan view, three semiconductor chips SCL are arranged along the X direction (in other words, along the long side HSe2 of the accommodation portion PKT (see FIG. 10) of the enclosure HS). The semiconductor chips SC2 paired with the semiconductor chips SCL are respectively mounted so as to line up each of the semiconductor chips SCL along the Y direction. In the example of FIG. 12, the semiconductor chip SCL is located closer to the side HSe2 side than the semiconductor chip SC2. In other words, the semiconductor chip SCL is mounted between the side HSe2 and the semiconductor chip SC2. Arranged on the side HSe2 side, a plurality of leads (lead members) LD electrically connected to the semiconductor chips SCL. That is, the semiconductor chips SCL are shorter in distance from the leads LD than the semiconductor chips SC2.

Figure 14:
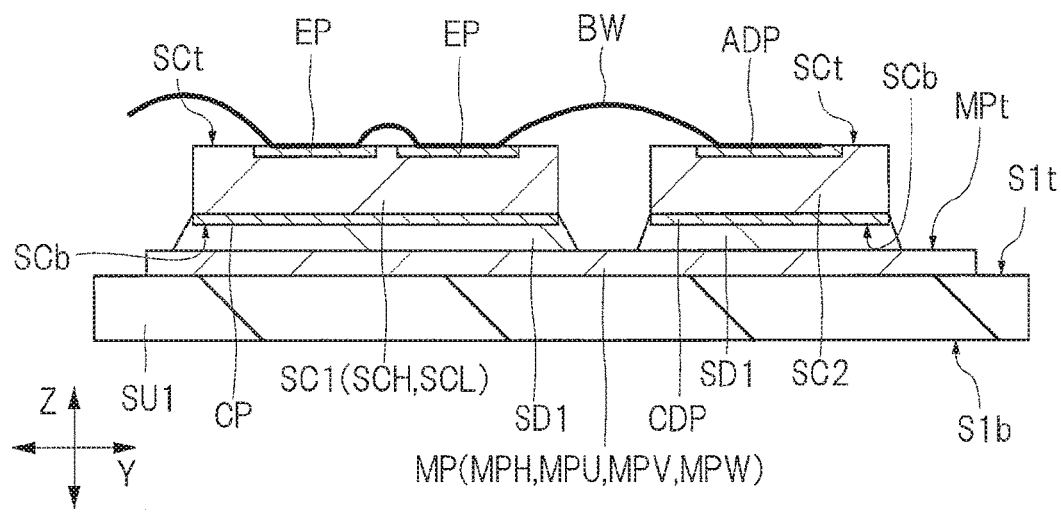
FIG. 14 is an enlarged sectional view of a principle part showing a detail of a portion in which semiconductor chips are mounted on metal patterns on the lower-side substrate of FIG. 11.

As shown in FIG. 14, according to this embodiment, the semiconductor chip SC1 is bonded/fixed to the metal pattern MP via a conductive connecting material (die bonding material, conductive member, conductive adhesive, connecting member, bond) SD1 so that the back surface SCb of the semiconductor chip SC1 opposes the upper surface (surface) MPt of the metal pattern MP. FIG. 14 is an enlarged sectional view of a principle part showing a detail of a portion where semiconductor chips are mounted on metal patterns on the lower-side substrate of FIG. 11. The conductive connecting material SD1 of FIG. 14 is, for example, solder, a conductive resin containing a plurality (number) of conductive particles (e.g., silver particles), or the like. As shown in FIG. 14, the collector electrode CP is formed on the back surface SCb of the semiconductor chip SC1. The collector electrode CP is electrically connected to the metal pattern MP via the conductive connecting material SD1.

Specifically, as shown in FIG. 12, the collector electrode CP (see FIG. 14) on each of the high-side semiconductor chips SCH among the plurality of semiconductor chips SC1 is connected to the metal pattern MPH. The metal pattern MPH is connected via a plurality of wires BW to the lead LD corresponding to the high-side terminal HT supplied with a high-side voltage.

In addition, as shown in FIG. 14, the semiconductor chip SC2 is fixed to the metal pattern MP via the conductive connecting material SD1 so that the back surface SCb of the semiconductor chip SC2 opposes the upper surface (surface) MPt of the metal pattern MP. The cathode electrode CDP is formed on the back surface SCb of the semiconductor chip SC2, and the cathode electrode CDP is electrically connected to the metal pattern MP via the conductive connecting material SD1.

In addition, connected to each of the plurality of metal patterns MPT among the plurality of metal patterns MP as described above is one lead LD. Formed on each of the metal patterns MPH and metal patterns MPL among the plurality of metal patterns MP are the plurality of leads LD. Mounted on each of the metal patterns MPH and the metal patterns MPL is one lead LD formed along each pf the short sides S1e3 and S1e4 among the four sides that the upper surface Sit of the substrate SU1 has.

In addition, mounted on each of the metal pattern MPU, metal pattern MPV, and metal pattern MPW among the plurality of metal patterns MP is no lead LD. In other words, no lead LD is connected directly to any one of the metal pattern MPU, metal pattern MPV, and metal pattern MPW among the plurality of metal patterns MP. Each of the metal pattern MPU, metal pattern MPV, and metal pattern MPW is electrically connected to the metal patterns MPT via the plurality of wires BW. Namely, each of the metal pattern MPU, metal pattern MPV, and metal pattern MPW is electrically connected to the leads LD via the plurality of wires BW and metal patterns MPT.

In addition, as shown in FIG. 12, the plurality of wires BW are connected to the emitter electrodes EP (see FIG. 14) of the semiconductor chip SC1. Specifically, the emitter electrodes EP of the high-side semiconductor chip SCH are connected to one of the metal pattern MPU, metal pattern MPV, and metal pattern MPW via the plurality of wires BW. In other words, the emitter electrodes EP of the high-side semiconductor chip SCH are connected to one of an U-phase terminal TU, a V-phase terminal TV, and a W-phase terminal TW.

In addition, each of the plurality of wires BW connected to the emitter electrodes EP of the high-side semiconductor chip SCH has one end connected to one of the metal pattern MPU, metal pattern MPV, and metal pattern MPW, and the other end connected to the lead corresponding to the terminal TU, TV, or TW. In other words, each of the metal pattern MPU, metal pattern MPV, and metal pattern MPW is connected via the wires BW to the lead corresponding to the terminals TU, TV, or TW.

In addition, each of the plurality of wires BW connected to the emitter electrodes EP of the semiconductor chip SC1 (SCH) is connected also to the anode electrode ADP (see FIG. 14) of the semiconductor chip SC2. In other words, the anode electrode ADP of each semiconductor chip SC2 is connected to one of the metal pattern MPU, metal pattern MPV, and metal pattern MPW via the plurality of wires BW.

In addition, the emitter electrodes EP (see FIG. 14) of the low-side semiconductor chip SCL are connected to the metal pattern MPL via the wires BW. The metal pattern MPL is connected via a plurality of wires BW to the lead LD corresponding to the low-side terminal LT supplied with a low-side potential. In other words, the emitter electrodes EP of the low-side semiconductor chip SCL are electrically connected to the low-side terminal LT. In addition, each of the plurality of wires BW connected to the emitter electrodes EP of the semiconductor chip SC1 (SCL) is connected also to the anode electrode ADP (see FIG. 14) of the semiconductor chip SC2. In other words, the anode electrode ADP of each semiconductor chip SC2 is electrically connected to the low-side terminal LT via the wires BW.

In addition, one wire BW is connected to the gate electrode GP (see FIG. 2) of the semiconductor chip SC1. Specifically, as shown in FIG. 12, each of the gate electrodes GP (see FIG. 2) that the high-side semiconductor chip SCH and the low-side semiconductor chip SCL have is connected to the metal pattern MPT via the wire BW. This metal pattern MPT is a wiring pattern interposed in a path electrically connecting a signal transmission electrode pad of the semiconductor chip SC1 to a signal transmission lead LD among the plurality of leads LD. The different wires BWS are connected respectively to both ends of the metal pattern MPT. One end of the metal pattern MPT is electrically connected to the gate electrode GP of the semiconductor chip SC1 via the wire BWS. The other end of the metal pattern MPT is connected to the lead LD via the wire BWS. FIG. 12 shows, as examples of the signal transmission lead LD, leads LGH and LGL transmitting drive signals (gate signals) for driving the switching operations of the transistors Q1 (see FIG. 1) that the semiconductor chip SCH and semiconductor chip SCL have. The lead LGH of FIG. 12 makes up part of the gate line GLH that transmits the gate signal GSH of FIG. 8. The lead LGL of FIG. 12 makes up part of the gate line GLL that transmits the gate signal GSL of FIG. 8.

In addition, the plurality of wires BW shown in FIG. 12 are metal wires, and are made of, for example, aluminum in this embodiment. However, a material of the wire BW includes various different materials, and gold or copper can be used in addition to aluminum. In the example of FIG. 12, among the plurality of wires BW, the wire BWP carrying a relatively large current is larger in wire diameter (width or thickness perpendicular to the extension direction of the wire) than the wire BWS carrying a relatively small current. Specifically, the relatively thick wire BWP is connected to each of the leads corresponding to the terminals HT, LT, TU, TV, and TW among the plurality of leads LD. In addition, the plurality of wires BWP are connected to the emitter electrodes EP (see FIG. 14) of the semiconductor chips SC1. Further, the metal patterns MPH adjacent to each other or the metal patterns MPL adjacent to each other are electrically connected via the wires BWP. The wires BW other than the above wires BWP mainly make up signal transmission paths, and are the wires BWS each having a relatively small wire diameter. Since the wire BWP with a large diameter is used as a path for carrying a large current, resistance of the transmission path can be reduced.

Figure 15:
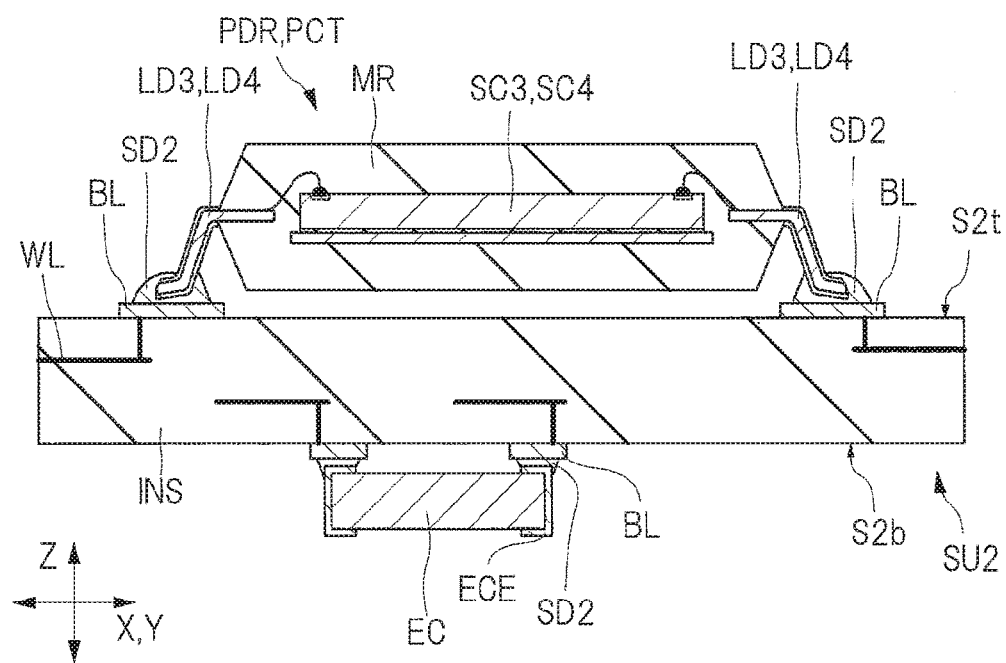
FIG. 15 is an enlarged sectional view of a principle part showing a portion in which a semiconductor package and an electronic component are mounted on the upper-side substrate of FIG. 11.

In addition, as shown in FIG. 11, in the accommodation portion PKT of the enclosure HS, the wiring substrate SU2 is disposed above the substrate SU1. The wiring substrate SU2 has the lower surface (back surface, main surface, surface) S2b opposes the upper surface Sit of the substrate SU1, and the upper surface (front surface, main surface, surface) S2t located opposite the lower surface S2b. Mounted on the wiring substrate SU2 are a plurality of electronic components including the driver components PDR which are semiconductor components. FIG. 15 is an enlarged sectional view of a principle part showing a state in which a semiconductor package and an electronic component are mounted on the upper-side substrate of FIG. 11. Incidentally, since the driver component PDR and controller component PCT shown in FIG. 13 have the same sectional structure, the semiconductor package shown in FIG. 15 is described as a sectional view of the driver component PDR or controller component PCT.

In this embodiment, the electronic components are mounted on the upper surface S2t and the lower surface S2b of the wiring substrate SU2. For this reason, a plurality of bonding leads (terminals) BL (see FIG. 15) electrically connected to electronic components are formed on each of the upper surface S2t and the lower surface S2b of the wiring substrate SU2. In the example of FIG. 15, for example, leads LD3 electrically connected to a semiconductor chip SC3 of the driver component PDR are electrically connected to the bonding leads BL via conductive connecting materials SD2. Leads LD4 electrically connected to a semiconductor chip SC4 of the controller component PCT are electrically connected to the bonding leads BL via the conductive connecting materials SD2. Electrodes ECE of an electronic component EC are electrically connected to the bonding leads BL via the conductive connecting materials SD2. Similar to the conductive connecting material SD1 of FIG. 14, the conductive connecting material SD2 is, for example, solder, a conductive resin containing a plurality (number) of conductive particles (e.g., silver particles), or the like.

In addition, the wiring substrate SU2 has a plurality of wirings WL connected to the electronic component mounted on the wiring substrate SU2. In the example of FIG. 11, the wiring substrate SU2 has a plurality of wiring layers between the upper surface S2t and the lower surface S2b, and wirings WL are formed on each wiring layer. The plurality of wiring layers stacked between the upper surface S2t and the lower surface S2b are electrically connected to each other through via wirings, which are inter-layer conductive paths. Thus, in a case of the wiring substrate SU2 having the wiring layers stacked between the upper surface S2t and the lower surface S2b, the upper surface S2t and the lower surface S2b can be used as mounting spaces for the electronic components EC including semiconductor components. For example, when various circuits are incorporated in the electronic device EA1, a mounting area of the wiring substrate SU2 and a space for layout of the wirings WL connected to each of the electronic components EC become necessary with an increase in the number of electronic components EC making up the circuits. In a case of the wiring substrate SU2, most of the wirings WL are formed between the upper surface S2t and the lower surface S2b, so that an increase in an area of the upper surface S2t of the wiring substrate SU2 can be suppressed.

The plurality of wirings WL that the wiring substrate SU2 has electrically connect the electronic components EC to each other or the electronic components EC to the leads LD shown in FIG. 11. A method of connecting the wirings WL to the leads LD will be described in detail later.

In addition, as shown in FIG. 13, mounted on the upper surface S2t of the wiring substrate SU2 are a plurality of electronic components EC which include three driver components PDR and one controller component PCT. Each of the three driver components PDR is a semiconductor component having the gate drive circuit GC (see FIG. 8). In this embodiment, the gate drive circuit GC is formed on the semiconductor chip SC3 (see FIG. 15) that the driver component PDR has. This gate drive circuit GC is electrically connected to the bonding leads BL (see FIG. 15) on the wiring substrate SU2 via the leads LD3 (see FIG. 15). In this embodiment, the control circuit CT (see FIG. 8) is formed on the semiconductor chip SC4 (see FIG. 15) in the driver component PCT. The control circuit CT is electrically connected to the bonding leads BL on the wiring substrate SU2 via the leads LD4. Some of the plurality of leads LD4 of the controller component PCT are connected via the wirings WL to some of the plurality of leads LD3 of the driver component PDR. The rest of the plurality of leads LD4 that the controller component PCT has are connected via the wirings WL to the leads LD exposed from the enclosure HS as shown in FIG. 9. Some of the leads LD3 that each of the plurality of driver components PDR has are connected via the wirings WL to the leads LD exposed from the enclosure HS as shown in FIG. 9.

FIG. 13 schematically shows an area, on which electronic component groups are mounted, by dividing the area per group and by using squares, the electronic component groups being composed of a plurality of electronic components each configuring a circuit such as a noise filter and an amplifier. In FIG. 13, a plurality (number) of electronic components EC are mounted in each of electronic component groups ECG surrounded by the squares. The plurality of electronic components EC include, for example, a capacitor component, an inductor component, a resistor component, or the like. These electronic components EC are so-called chip components that are surface-mounted on the bonding leads BL (see FIG. 15) via the conductive connecting material SD2 (see FIG. 15) such as solder.

As shown in FIG. 13, the plurality of driver components PDR are each mounted on the upper surface S2t of the wiring substrate SU2 so as to be lined up along the X direction. In the example of FIG. 13, the driver components PDR each overlap the virtual line VL1 extending in the X direction that is a longitudinal direction so as to connect the center of the side HSe3 and the center of the side HSe4.

In addition, each of the plurality of (three) driver components PDR has a sealing material MR, which, in a plan view, has: a side MRe1 disposed along the side HSe1 of the accommodation portion PKT of the enclosure HS; and a side MRe2 opposite to the side MRe1. Exposed from the sealing material MR at the side MRe1 are the leads LD3 connected to the semiconductor chip SCH (see FIG. 12), which is a high-side switching element, among the plural leads LD3 (see FIG. 15) that each of the plural (three) driver components PDR has. The leads LD3 connected to the semiconductor chip SCH (see FIG. 12) that is a high-side switching element are arranged along the side MRe1. Meanwhile, exposed from the sealing material MR are the side MRe2 are the leads LD3 connected to the semiconductor chip SCL (see FIG. 12), which is a low-side switching element, among the plural leads LD3 that each of the plural (three) driver components PDR has. The leads LD3 connected to the semiconductor chip SCL (see FIG. 12) that is a low-side switching element are arranged along the side MRe2.

In addition, the wirings WL connected to the semiconductor chips SCH (see FIG. 12), which are high-side switching elements, among the plurality of wirings WL (see FIG. 11) that the wiring substrate SU2 has are arranged, in a plan view, between each of the driver components PDR and the side HSe1 of the accommodation portion PKT of the enclosure HS. For example, FIG. 13 shows wirings WLGH and WLEH that are arranged between each of the driver components PDR and the side HSe1 of the accommodation portion PKT of the enclosure HS. The wiring WLGH is a wiring electrically connecting the gate electrode of the high-side transistor HQ1 (see FIG. 8), which each semiconductor chip SCH has, and the high-side drive circuit DCH (see FIG. 8) of each driver component PDR. The wiring WLEH is a wiring electrically connecting the emitter electrode of the high-side transistor HQ1, which the semiconductor chip SCH has, and the high-side drive circuit DCH of the driver component PDR. The high-side drive circuit DCH is supplied, as a reference potential for a high-side gate voltage, with the emitter potential of the high-side transistor HQ1 via the wiring WLEH.

In addition, the wirings WL connected to the semiconductor chips SCL (see FIG. 12), which are low-side switching elements, among the plurality of wirings WL (see FIG. 11) of the wiring substrate SU2 are arranged, in a plan view, between each of the driver components PDR and the side HSe2 of the accommodation portion PKT of the enclosure HS. For example, FIG. 13 shows wirings WLGL each arranged between each driver component PDR and the side HSe2 of the accommodation portion PKT of the enclosure HS. The wiring WLGL is a wiring electrically connecting the gate electrode of the low-side transistor LQ1 (see FIG. 8), which each semiconductor chip SCL has, and the low-side drive circuit DCL (see FIG. 8) of each driver component PDR.

In addition, the electronic device EA1 includes a plurality of leads LD. The leads LD have functions as transmission paths electrically connecting the semiconductor components mounted on the substrate SU1 (see FIG. 12) and the electronic components mounted on the substrate SU2. The plurality of leads LD function also as external terminals of the electronic device EA1. As shown in FIG. 11, each of the leads LD extends in the Z direction, which is a direction normal to the upper surface Sit of the substrate SU1, along an inner surface of the accommodation portion PKT in the enclosure HS.

In addition, as shown in FIGS. 12 and 13, in a plan view, the plurality of leads LD are arranged along one of the sides HSe1, HSe2, HSe3, and HSe4 of the accommodation portion PKT of the enclosure HS. Specifically, the leads LD connected to the semiconductor chips SCH (see FIG. 12) among the plural leads LD are arranged along the side HSe1. In the example of FIGS. 12 and 13, the leads LGH connected to the gate electrodes GP (see FIG. 2) of the semiconductor chips SCH and the leads LEH connected to the signal electrodes DTP (see FIG. 2) of the semiconductor chips SCH are arranged along the side HSe1.

In addition, the leads LD connected to the semiconductor chips SCL (see FIG. 12) among the plurality of leads LD are arranged along the side HSe2. In the example of FIGS. 12 and 13, the leads LGL connected to the gate electrodes GP (see FIG. 2) of the semiconductor chips SCL are arranged along the side HSe2.

In addition, the leads LD corresponding to the terminal HT and terminal LT among the plurality of leads LD are arranged along the side HSe4. Incidentally, in the example of FIGS. 12 and 13, the leads arranged along the side HSe3 are electrically separated from other components. As a modification, however, the leads arranged along the side HSe3 may be connected to, for example, the metal patterns MPH and MPL and used as the terminals HT and LT.

In addition, the respective leads LD corresponding to the terminals HT, LT, TU, TV, and TW among the plurality of leads LD have relatively larger sectional areas in a direction perpendicular to their extension direction than the other leads (e.g., leads LGH and LGL). Thus, resistance of transmission paths carrying a large current can be reduced.

In addition, as shown in FIG. 11, a space between the enclosure HS and the substrate SU1 is filled with a sealant (gelled insulating material) MG. The plurality of semiconductor chips SC1 and SC2 and the plurality of wires BW are each sealed with this sealant MG. To-be-sealed parts of the semiconductor chips SC1 and SC2, wires BW, and leads LD are protected by the sealant MG. The electronic components mounted on the substrate SU1 each make up the output unit PW1 described with reference to FIG. 1, and carry a current larger than a current flowing through the electronic components mounted on the wiring substrate SU2. Like this embodiment, when each of the plurality of semiconductor chips SC1 and SC2 and wires BW is sealed with the sealant MG, a withstand voltage of each of the semiconductor chips SC1 and SC2 and wires BW can be improved.

Incidentally, a method of sealing the semiconductor chip(s) includes a method of using a resin material, which is hardened by heat and whose strength can be ensured to some extent, such as an epoxy resin. For example, the driver component PDR of FIG. 13 is a semiconductor package in which the semiconductor chip SC3 (see FIG. 11) is sealed with the sealing material MR. This sealing material MR is a hard resin obtained by hardening a thermosetting resin such as an epoxy resin. The sealant MG is made of a gelled material (polymer compound) softer than the epoxy resin. Specifically, in this embodiment, the sealant MG is a silicone gel. The silicone gel is a sort of silicone resin that is a polymer compound having a main skeleton formed by siloxane bonds. The silicone resin is classified as a thermosetting resin hardened by applying heat energy, but has such character that its elasticity after hardening is low like natural rubber. The silicone gel, which belongs to a silicone resin, is a resin that becomes a gelled state after hardening, and is lower in a crosslink density of a chain polymer with a crosslink structure than an elastomer referred to as silicone rubber. For this reason, the elasticity of the hardened silicone gel is lower than that of the hardened silicone rubber. In a case of a semiconductor package like the driver component PDR or controller component PCT shown by FIG. 13, strength of the semiconductor package is improved by improving strength of the sealing material MR, so that the semiconductor package is preferably sealed with a hard resin material. Meanwhile, like this embodiment, when an interior space of the enclosure HS is filled with a resin, the strength of the electronic device EA1 is improved by using a hard material to form the enclosure HS, so that the sealant MG may be soft. In addition, in this embodiment, a silicone rubber is used as the bond BD1 of FIG. 11, but the sealant MG is lower in elasticity than the bond BD1. In other words, the sealant MG is softer than the bond BD1 and is easy to deform. For this reason, a stress caused due to a change in the temperature of the electronic device EA1 is absorbed and reduced by deformation of the sealant MG that is silicone gel.

<Layout Study>

In the electronic device EA1 of this embodiment, if all of the electronic components EC mounted on the wiring substrate SU2 of FIG. 13 are mounted on the substrate SU1 of FIG. 12, the area of the substrate SU1 becomes enlarged. In this embodiment, a number of electronic components EC are divided among a plurality of substrates and mounted on them, and the substrate SU1 and wiring substrate SU2 are stacked, so that an increase in a plane area of the electronic device EA1 (in other words, a mounting area of the electronic device EA1) can be suppressed. However, it has been found from a study of the inventors in the present application that the performance of the electronic device EA1 can be improved by devising the layout of the electronic components EC and the wrings connected thereto when many electronic components EC are divided among the plurality of substrates and mounted on them.

For example, in the case of this embodiment, the plurality of semiconductor chips SCH and the plurality of semiconductor chips SCL, through which a large current flows for driving the motor MT (FIG. 1), are arranged densely on the substrate SU1 of FIG. 12. Meanwhile, the driver components PDR and controller components PCT, which carry a relatively small current and each have many terminals, are mounted on the wiring substrate SU2 of FIG. 13. In this case, the substrate SU1 and wiring substrate SU2 are configured so as to have structures corresponding to features of the electronic components to be mounted thereon. That is, on the substrate SU1 on which the plurality of semiconductor chips SCH and semiconductor chips SCL as shown in FIG. 12 are mounted, respective areas of the metals patterns MPH, MPL, MPU, MPV, and MPW are made lager in terms of reducing the resistance of the transmission paths carrying the large current. In terms of efficiently radiating heat generated by the large current, a metal pattern MPB is formed on the lower surface Sib of the substrate SU1, as shown in FIG. 10. Meanwhile, the plurality of wirings WL, which the wiring substrate SU2 of FIG. 15 has, each have an area smaller than that of the metal pattern MPH etc. of FIG. 12. However, a plurality of wiring layers are stackedly configured so that many wirings WL can be efficiently drawn around.

In addition, as described with reference to FIG. 8, in terms of matching the respective raising and falling times of the gate signal GSH and the gate signal GSL, the path distance of the gate line GLH is preferably made equal in length to that of the gate line GLL. Since the inverter circuit PWC of this embodiment has three phases, the gate line GLH and gate line GLL of FIG. 8 are each provided per three lines. In this case, the respective path distances of the six gate lines are preferably made equal in length to each other. Like this embodiment, when the plurality of driver components PDR (FIG. 13) and the plurality of semiconductor chips SC1 (see FIG. 12) are mounted on the different substrates, the respective path distances of the gate line GLH and gate line GLL become long. For this reason, as compared to a case of their path distances being short, variations in path distances have a great influence on reliability of the switching operation.

In the case of this embodiment, in the inverter circuit, the components of the high-side circuit (the high-side side switching elements and the transmission paths connected to the high-side drive circuits) are densely arranged on the side HSe1 side as shown in FIG. 12, while the components of the low-side circuit (the low-side side switching elements and the wirings connected to the low-side drive circuits) are densely arranged on the side HSe2 side. Specifically, as shown in FIG. 12, in a plan view, the plurality of semiconductor chips SCH are each arranged on the side HSe1 side of the accommodation portion PKT. The plurality of semiconductor chips SCL are each arranged on the side HSe2 side of the accommodation portion. As shown in FIG. 13, the plurality of wirings WLGH electrically connecting the gate electrodes of the high-side transistors HQ1 (see FIG. 8) and the high-side drive circuits DCH (see FIG. 8) of the driver components PDR are arranged between the side SHe1 and each of the driver components PDR. The wirings WLGH are connected to the plurality of leads (lead members) LGH arranged along the side HSe1. The plurality of wirings WLGL electrically connecting the gate electrodes of the low-side transistors LQ1 (see FIG. 8) and the low-side drive circuits DCL (see FIG. 8) of the driver components PDR are arranged between the side SHe2 and each of the driver components PDR. The wirings WLGL are connected to the plurality of leads (lead members) LGL arranged along the side HSe2.

As shown in FIG. 13, a component(s) for the high-side circuit and a component (s) for the low-side circuit are divided and arranged, on the basis of a position of each driver component PDR, along the side HSe1 and the side HSe2 opposite to each other, which makes it possible to easily adjust the path distances of the gate lines GLH and GLL of FIG. 8.

For example, in this embodiment, as shown in FIG. 13, the plurality of driver components PDR are alongside arranged along the X direction so as to have the same direction as arrangement directions of the plurality of semiconductor chips SCH and SCL. For this reason, the respective path distances of the three gate lines GLH can be easily made equal in length to each other. The respective path distances of the three gate lines GLL can be easily made equal in length to each other.

In addition, for example in this embodiment, the plurality of driver components PDR are each located at such a position as to overlap the virtual line VL1 extending in the X direction that is a longitudinal direction of connecting the center of the side HSe3 to the center of the side HSe4. For this reason, if the path distances of the gate lines GLH and those of the gate lines GLL are made equal in length to each other on the wiring substrate SU2 and the substrate SU1, the entirety of the gate lines GLH are consequently made equal to the entirety of the gate lines GLL. That is, the path distances of each gate line GLH and each gate line GLL can be easily made equal in length to each other.

In this embodiment, three gate lines GLH and three gate lines GLL are each made equal in length to each other. Incidentally, the phrase "being made equal in length" means that respective path distances of a plurality of transmission paths to be made equal in length are made equal to the following extent; the extent is such an extent that a rising time till a potential level of an electric signal traveling through each path exceeds a threshold, and a falling time till the potential level falls below the threshold are within a range of a permissible margin. Therefore, in addition to a case of the path distances of the transmission paths to be made equal in length being completely equal to each other, the phrase also includes a case of the transmission paths having an error to such an extent as to fall within a range. To satisfy the condition "being made equal in length", the error range is at least within 25%, particularly preferably within 10%.

In addition, as shown in FIG. 13, the electronic device EA1 of this embodiment includes the controller component PCT having the control circuit CT (see FIG. 8). The controller component PCT is mounted on the upper surface S2t of the wiring substrate SU2. The controller component PCT is mounted in the X direction and between two driver components PDR adjacent to each other among the plurality of the driver components PDR.

The controller component PCT is connected to each of three driver components PDR. In the example of this embodiment, the controller component PCT is not directly connected to the plurality of semiconductor chips SC1 and semiconductor chips SC2 of FIG. 12. In other words, the controller component PCT is separated from the semiconductor chips SC1 and SC2. Some of the electric signals outputted from the plurality of signal electrodes DTP of the semiconductor chip SC1 of FIG. 2 are data-processed by the driver component PDR of FIG. 13, and the processed data is transmitted, as an electric signal, to the controller component PCT. An input signal from the control circuit CT, which has been described with reference to FIG. 8, is processed by the gate drive circuit GC, and a gate signal generated by the state drive circuit GC is transmitted to the gate electrode GP of the semiconductor chip SC1 of FIG. 2.

In addition, as described with reference to FIG. 8, amplitude of waveforms of the gate signals GSH and GSL is larger than that of waveforms of the signals SGH and SGL. In other words, the amplitude of the waveforms of the gate signals SGH and SGL is smaller than that of the waveforms of the signals GSH and GSL. For this reason, the plurality of transmission paths for transmitting the electric signals between the controller component PCT and the driver component PDR may not need to be made equal in length to each other.

Like this embodiment, when the controller component PCT is disposed in the X direction and between the two driver components PDR adjacent to each other among the plurality of driver components PDR, it is difficult for the wiring paths of the plurality of wirings WLGH, WLEH, and WLGL to be obstructed by the controller components PDR. For this reason, the wirings WLGH, WLEH, and WLGL are improved about a degree of freedom of their layout, and are easy to make equal in length to each other.

In addition, as shown in FIG. 13, an electronic component group ECG, which is electrically connected to one of the driver components PDR and one of the semiconductor chips SCH (see FIG. 12), is mounted on the wiring substrate SU2 and between the side HSe1 of the accommodation portion PKT in the enclosure HS and each of the driver components PDR. Another electronic component group ECG, which is electrically connected to another of the driver components PDR and to another of the semiconductor chips SCL (see FIG. 12), is mounted on the wiring substrate SU2 and between the side HSe2 of the accommodation portion PKT in the enclosure HS and each of the driver components PDR. These electronic component groups ECG are electronic components EC (see FIG. 13) for making up a noise filter circuit that reduces, for example, noise of a gate drive signal outputted from the gate drive circuit GC of FIG. 8 or a signal inputted to the gate drive circuit GC.

As shown in FIG. 13, in the X direction, the controller component PCT is disposed between the electronic component groups ECG adjacent to each other. For this reason, an arrangement space for each electronic component group ECG is not obstructed by the controller component PCT, which allows the electronic component groups ECG to be arranged close to the driver components PDR.

In addition, in the Y direction, the controller component PCT is arranged closer to the side HSe2 of the accommodation portion PKT than to the side HSe1 thereof. As shown in FIG. 13, the leads corresponding to the terminals TU, TV, and TW among the plurality of leads LD are arranged along the side HSe1 of the accommodation portion PKT. Potentials at the terminals TU, TV, and TW change periodically, but become the same as the potential at the terminal HT at their highest level. Like this embodiment, when the controller component PCT is mounted in the Y direction and at a position closer to the side HSe2 of the accommodation portion PKT than to the side HSe1, the leads LD that transmit the signals with the controller component PCT are arranged along the side HSe2. Thus, in this arrangement, the leads LD making up the signal transmission paths can keep distances from the terminals TU, TV, and TW supplied with the potential.

In addition, as shown in FIG. 13, formed in the wiring substrate SU2 are through-holes THS that penetrate the wiring substrate SU2 in a direction of its thickness. The through-hole THS penetrates from one surface of the upper surface S2*t* and the lower surface S2*b* of the wiring substrate SU2 shown in FIG. 11 to the other surface. In a step of manufacturing the electronic device EA1, when the interior of the accommodation portion PKT shown in FIG. 11 is filled with the sealant MG after fixing the wiring substrate SU2, the through-hole THS is used for inserting therein a nozzle NZ described later. To fill the whole surface of the substrate SU1 with the sealant MG, the through-holes THS are preferably located close to the middle of the wiring substrate SU2 in a plan view as shown by FIG. 13. Like this embodiment, when the electronic device EA1 is rectangular, the plurality of through-holes THS are preferably provided along the X direction that is a longitudinal direction.

In the case of this embodiment, since the controller component PCT is located at a position closer to the side HSe2 side, the through-hole THS is disposed between each of the three driver components PDR.

The importance of making the path distances of the plurality of gate lines equal in path to each other has been described above. As described with reference to FIG. 8, in this embodiment, the high-side drive circuit DCH uses, as a reference potential, the emitter voltage of the high-side transistor HQ1 in generating a gate voltage. This emitter potential is outputted from the emitter signal electrode EDP (see FIG. 2) of the semiconductor chip SC1 (see FIG. 2) and is supplied to the high-side drive circuit DCH via the emitter line ELH. Since the emitter potential of the high-side transistor HQ1 fluctuates, the path distance of the emitter line ELH is preferably made equal in length to the path distance of the high-side gate line GLH.

As described above, in the inverter circuit in this embodiment, the components making up the high-side circuit (the high-side side switching elements and the transmission paths connected to the high-side drive circuit) are densely arranged on a side of the side HSe1 of FIG. 12, and the components making up the low-side circuit (the low-side side switching elements and the wirings connected to the low-side drive circuit) are densely arranged on a side of the side HSe2. For this reason, the path distance of the emitter line ELH can be easily made equal in length to the path distance of the high-side gate line GLH.

Specifically, as shown in FIG. 13, the plurality of wirings WLEH, which electrically connect the emitter electrodes of the high-side transistors HQ1 (see FIG. 8) and the high-side drive circuits DCH (see FIG. 8) of the driver components PDR, are each arranged between the side HSe1 and each of the driver components PDR. The wirings WLEH are connected to the plurality of leads (lead members) LEH arranged along the side HSe1. In the electronic device EA1, the wirings WLEH and the wirings WLGH are arranged on a side of the same side HSe1 on the basis of the location of the driver components PDR. The emitter line ELH and gate line GLH shown in FIG. 8 are each connected to the same driver component PDR (see FIG. 13) and the same semiconductor chip SCH (see FIG. 12). For this reason, the path distance of the emitter line ELH can be easily made equal to the path distance of the high-side gate line GLH.

<Connecting Wiring Substrate to Leads>

Figure 16:
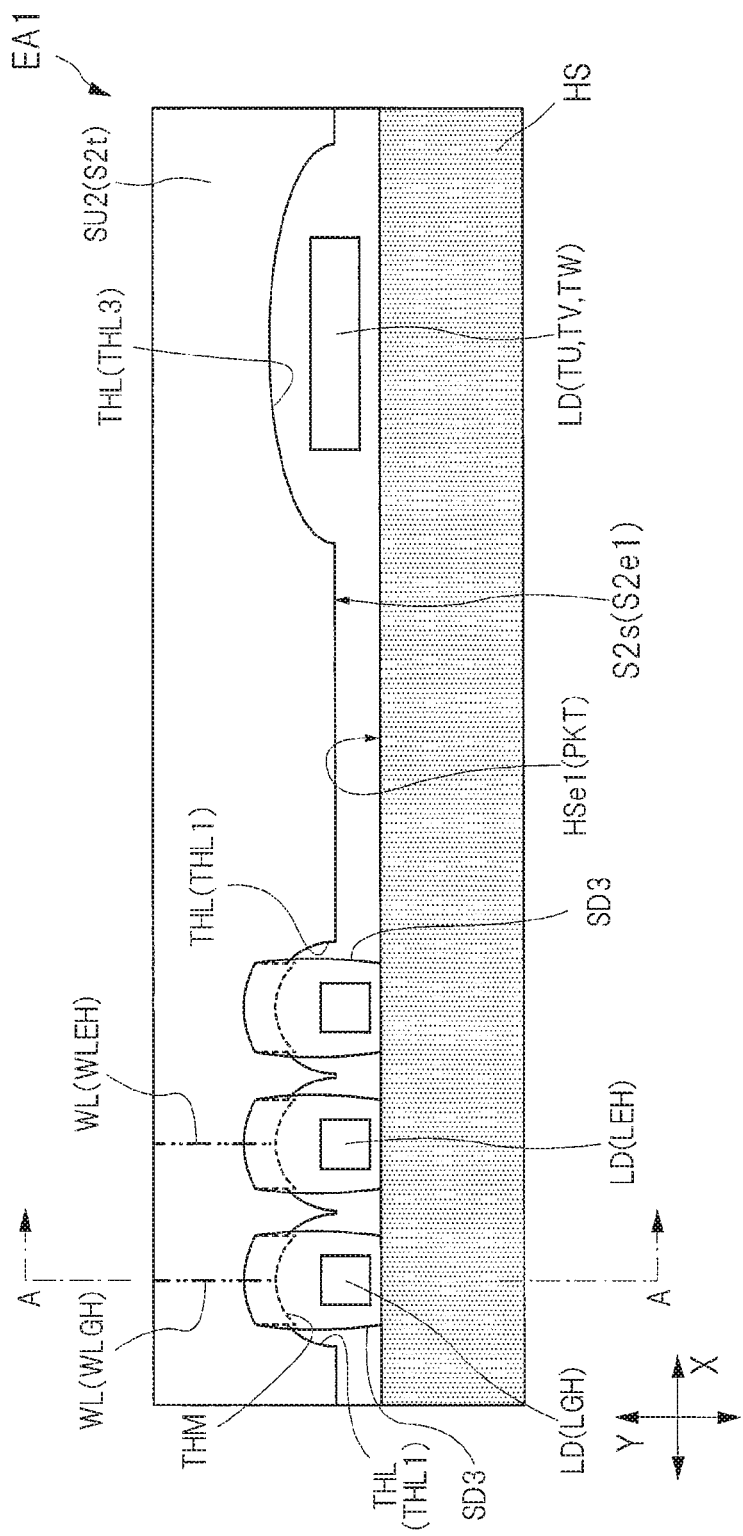
FIG. 16 is an enlarged plan view enlargedly showing a portion in which leads and a wiring substrate shown in FIG. 13 are electrically connected.
Figure 17:
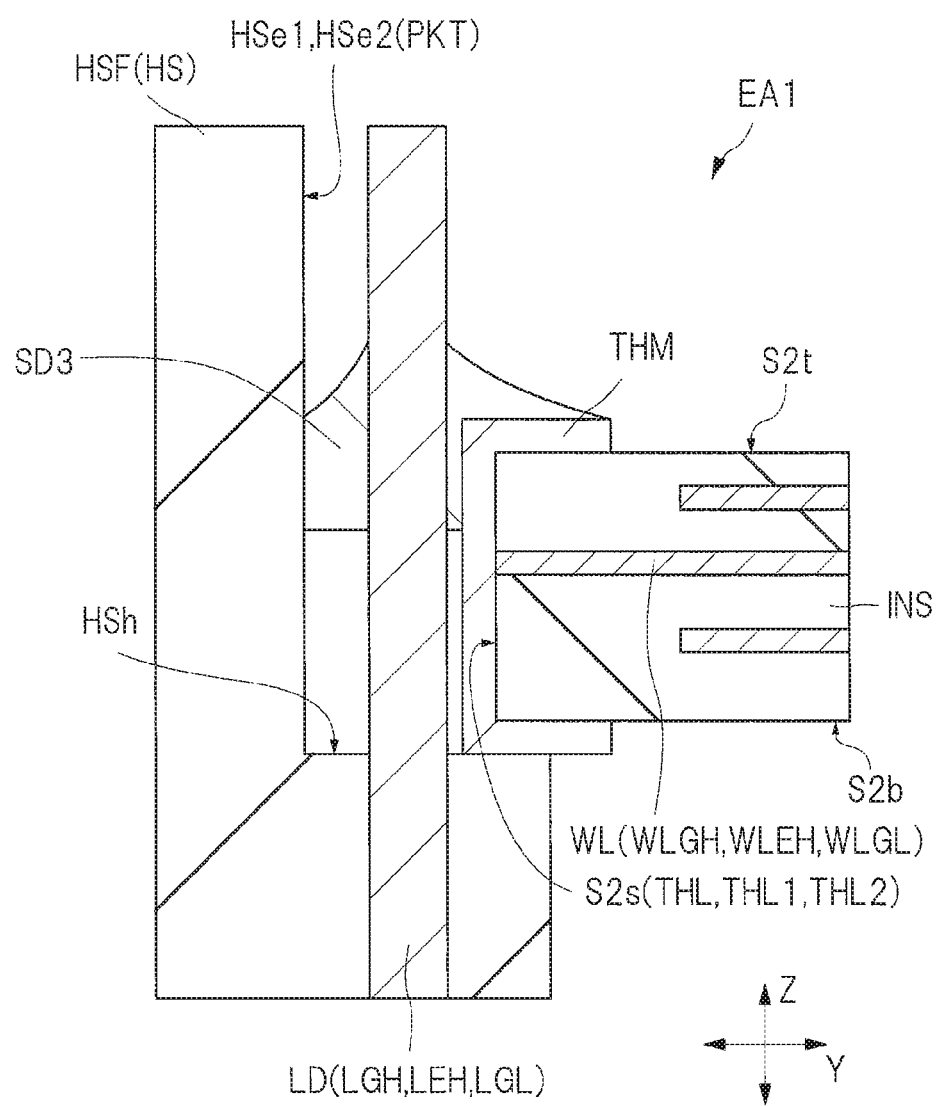
FIG. 17 is an enlarged sectional view taken along an A-A line of FIG. 16.

A part in which the wiring substrate SU2 of FIG. 13 is electrically connected to each of the plurality of leads LD will then be described in detail. FIG. 16 is an enlarged plan view enlargedly showing a part in which the lead and the wiring substrate shown in FIG. 13 are electrically connected. FIG. 17 is an enlarged sectional view taken along an A-A line of FIG. 16. Incidentally, the leads LGH, LEH, and LGL connected respectively to the wirings WLGH, WLEH, and WLGL among the plurality of leads LD of FIG. 13 have the same structure. Thus, in FIG. 17, the respective reference numerals of the components having the same or similar structure are indicated together.

As shown in FIGS. 16 and 17, the wiring substrate SU2 has the plurality of openings THL each penetrating from one surface of the upper surface S2*t* and the lower surface S2*b* (see FIG. 17) to the other surface. In a plan view, the respective openings THL are provided on a periphery of the wiring substrate SU2. Each of the leads LD is placed in an area enclosed by each of the openings THL and an inner surface of the accommodation portion PKT in the enclosure.

As a modification of this embodiment, a though-hole having a planarly closed shape may be formed inside the periphery of the wiring substrate SU2. However, when the opening THL not planarly closed at a periphery portion of the wiring substrate SU2 is formed like this embodiment, this is preferable in the following respects. That is, as shown in FIG. 16, a gap (clearance) is present between a side face S2*s* of the wiring substrate SU2 and the inner surface of the accommodation portion PKT in the enclosure HS. Each opening THL of this embodiment is not planarly closed, so that the side face S2*s* of the wiring substrate SU2 as shown in FIG. 17 opposes the inner surface of the enclosure HS. For this reason, in the case of this embodiment, this gap portion can be used as an arrangement space for the plurality of leads LD in addition to an inside area of the opening THL. Therefore, as described above as the modification, the through-holes closed in a plan view, an opening area of the wiring substrate SU2 in a plan view can be reduced in comparison with a case of forming the through-holes planarly closed. If the opening areas of the openings THL penetrating the leads LD can be reduced like this, a component arrangement space(s) on the wiring substrate SU2 can be expanded.

In addition, as shown in FIGS. 16 and 17, some of the plurality of openings THL function as connecting portions electrically connecting the leads LD and the wirings WL of the wiring substrate SU2. As shown in FIG. 17, the wirings WLGH are electrically connected to the leads LGH via solder SD3 in openings THL1 provided to the side HSe1 of the enclosure HS among the plurality of openings THL. The wirings WLGL are electrically connected to the leads LGL via the solder SD3 in openings THL2 provided to the side HSe2 of the enclosure HS among the plurality of openings THL. The wirings WLEH are electrically connected to the leads LEH via the solder SD3 in the openings THL1 provided to the side HSe1 of the enclosure HS among the plurality of openings THL.

Specifically, formed in the openings THL1 and THL2 of the wiring substrate SU2 is a metal film (conductive pattern) THM so as to cover part of the upper surface S2*t*, part of the side face S2*s*, and part of the lower surface S2*b*. Each of the wirings WLGH, WLEH, and WLGL is connected to the metal film formed in each opening. The solder SD3 adheres tightly to the metal film THM and to the lead LD. For this reason, each of the wirings WLGH, WLEH, and WLGL is connected to the lead LD via the metal film THM and solder SD3.

In addition, as shown in FIG. 17, the enclosure HS has a substrate support surface HSh for supporting the wiring substrate SU2. The substrate support surface HSh can prevent the wiring substrate SU2 from falling off downward. By connecting the wiring substrate SU2 and the plurality of leads LD via the solder SD3, the wiring substrate SU2 is fixed onto the substrate support surface HSh.

Now, the plurality of leads LD shown in FIG. 13 include leads LD that are electrically connected to the semiconductor chips SC1 (see FIG. 12) and electrically separated from such components mounted on the wiring substrate SU2 as the driver components PDR. For example, the terminals TU, TV, TW, HT, and LT of FIG. 13 correspond to such leads LD. An opening THL3 (see FIG. 16), which encircle the leads LD corresponding to the terminals TU, TV, TW, HT, and LT among the plurality of openings THL of the wiring substrate SU2, is not covered with the metal film THM, and an insulating material INS (see FIG. 17) making up the wiring substrate SU2 is exposed therefrom.

In other words, in this embodiment, the metal film THM is not provided on all of the openings THL but is selectively formed on the openings THL encircling the leads electrically connected to the wiring substrate SU2. In this case, for example, even if the terminal UT comes in contact with the wiring substrate SU2 due to deformation etc. of the lead LD, electrical connection of the terminal UT and the wiring substrate SU2 can be suppressed.

<Connection of Gate Electrodes and Leads>

Figure 18:
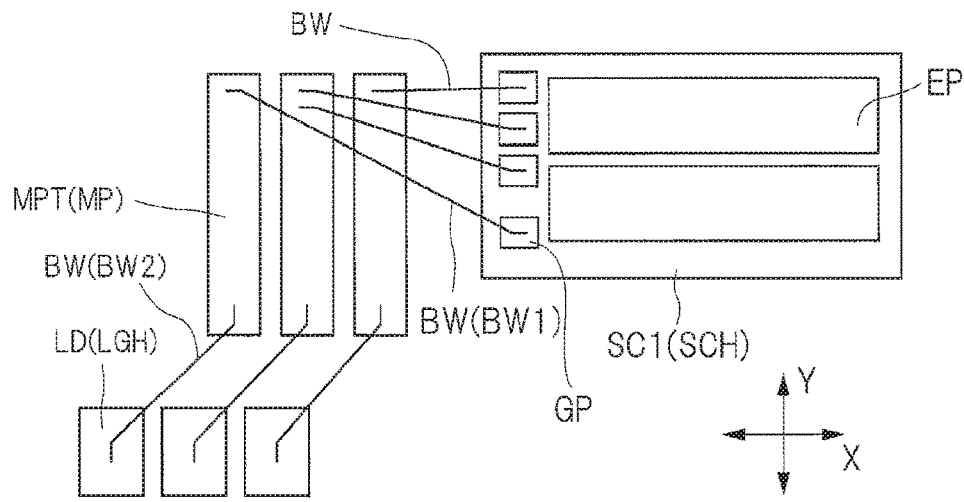
FIG. 18 is an enlarged plan view of a principle part of a gate line connected to a high-side semiconductor chip of FIG. 12.
Figure 19:
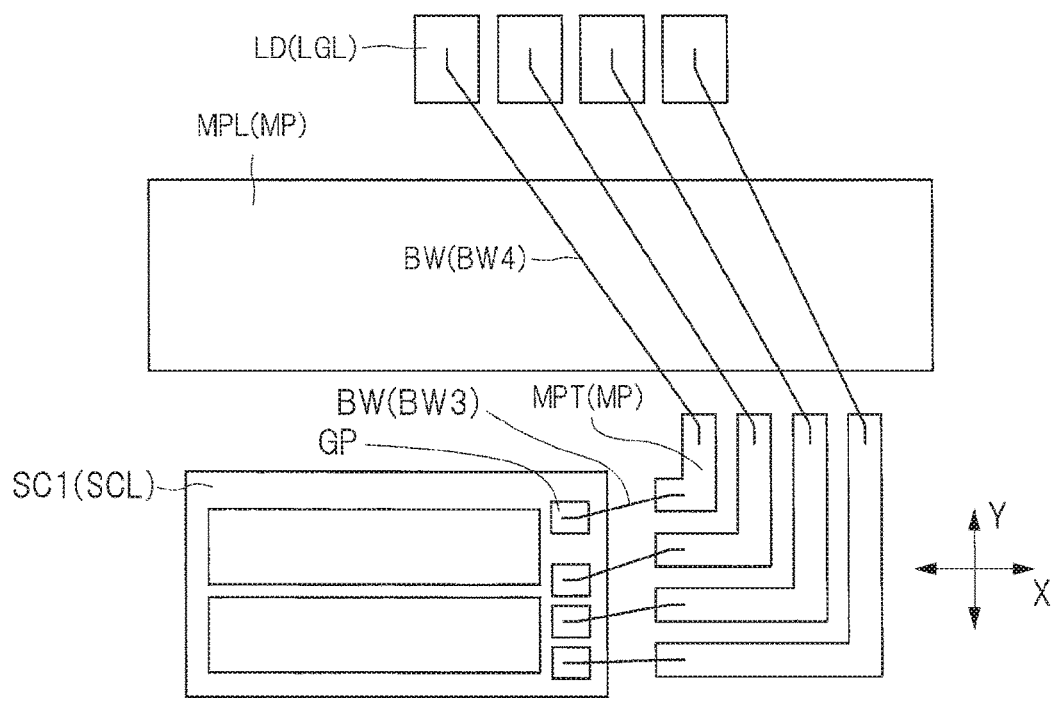
FIG. 19 is an enlarged plan view of a principle part of a gate line connected to a low-side semiconductor chip of FIG. 12.

Apart of electrically connecting the substrate SU1 and each of the leads LD of FIG. 12 will then be described in detail. FIG. 18 is an enlarged plan view of a principle part of a gate line connected to a high-side side semiconductor chip shown in FIG. 12. FIG. 19 is an enlarged plan view of a principle part of a gate line connected to a low-side side semiconductor chip shown in FIG. 12.

As shown in FIG. 18, the gate electrode GP of the semiconductor chip SCH is electrically connected to the lead LGH via a wire BW1, a metal pattern MPT, and a wire BW2. Specifically, the wire BW1 has one end connected to the gate electrode GP and the other end connected to the metal pattern MPT. The wire BW2 has one end connected to the metal pattern MPT and the other end connected to the lead LGH.

In addition, as shown in FIG. 19, the gate electrode GP of the semiconductor chip SCL is electrically connected to the lead LGL via a wire BW3, a metal pattern MPT, and a wire BW4. Specifically, the wire BW3 has one end connected to the gate electrode GP and the other end connected to the metal pattern MPT. The wire BW4 has one end connected to the metal pattern MPT and the other end connected to the lead LGL.

Here, as shown in FIG. 12, the metal patterns MPL are disposed between the leads LD and the semiconductor chips SCL. Thus, the emitter electrodes EP (see FIG. 2) of the semiconductor chips SCL can be connected to the metal patterns MPL through wires BW. In this layout, however, the wires BW4 to be connected to the low-side semiconductor chip SCL extend across or so as to stride the metal pattern MPL in a plan view, as shown in FIG. 19. As a result, in the gate line connected to the low-side gate electrode GP, the wire BW4 becomes longer in length than the wire BW3.

As shown in FIG. 18, meanwhile, the wires BW2 connected to the high-side semiconductor chip SCH do not overlap a metal pattern(s) other than the metal patterns MPT in a plan view. For this reason, the wire BW2 making up the high-side gate line is shorter in length than the wire BW4 (see FIG. 19) making up the low-side gate line. In this embodiment, therefore, the high-side gate line and the low-side gate line are made equal in length to each other by adopting the following configuration. That is, the wire BW1 connected to the gate electrode GP of the high-side semiconductor chip SCH is made the longest in length among the wires BW connected to electrodes other than the emitter electrode EP of the semiconductor chip SCH. The wire BW1 is also longer in length than the wire BW2. By lengthening the length of the wire BW1 in this manner, the path distances of the high-side gate line and the low-side gate line are made equal in length to each other.

<Manufacturing Method for Electronic Device>

Figure 20:
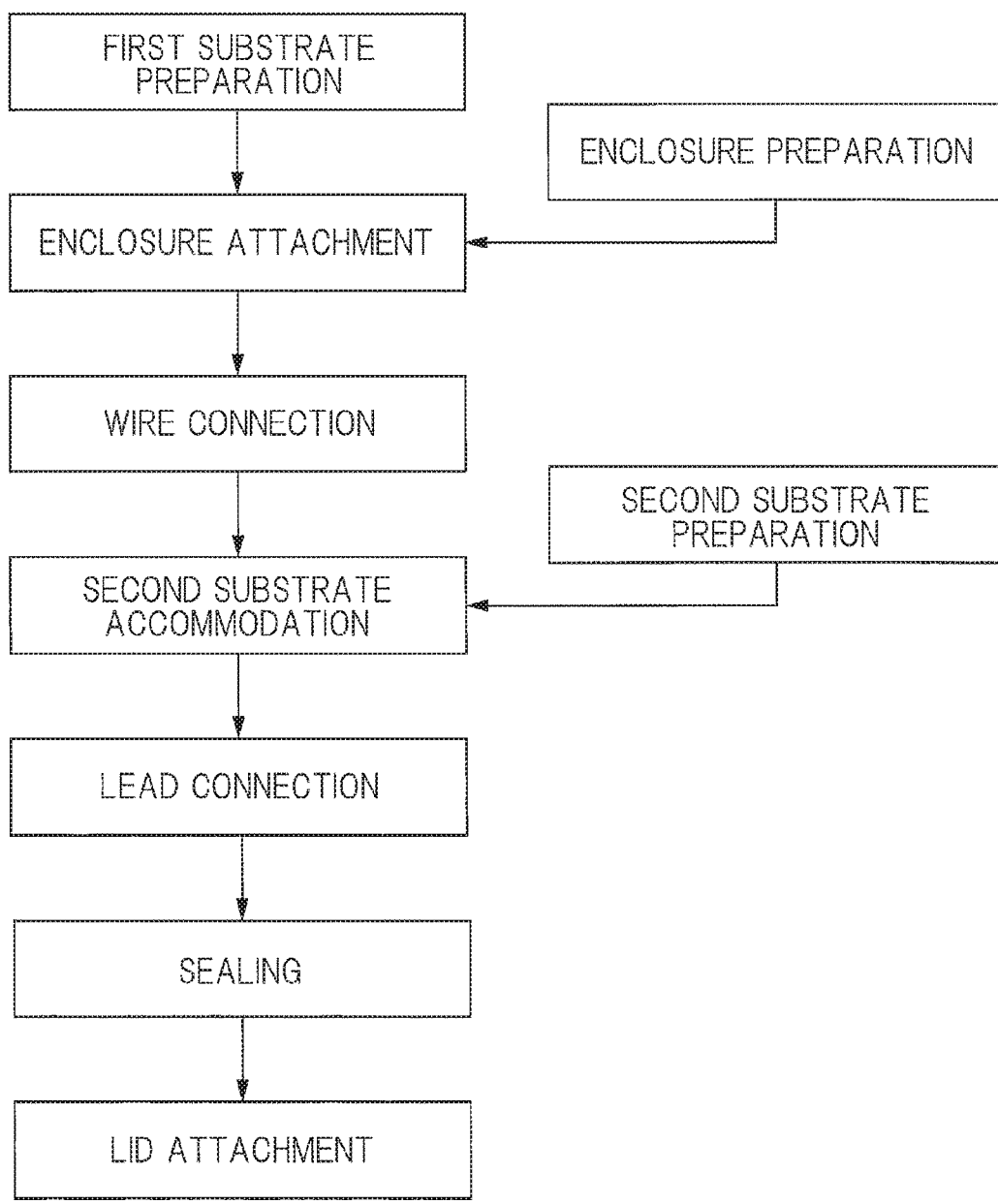
FIG. 20 is an explanatory diagram showing an assembling flow of the electronic device of FIG. 9.

A manufacturing process for the electronic device EA1 described with reference to FIGS. 1 to 19 will then be described based on a step shown in FIG. 20. FIG. 20 is an explanatory diagram showing an assembling flow of the electronic device of FIG. 9.

<First Substrate Preparation>

Figure 21:
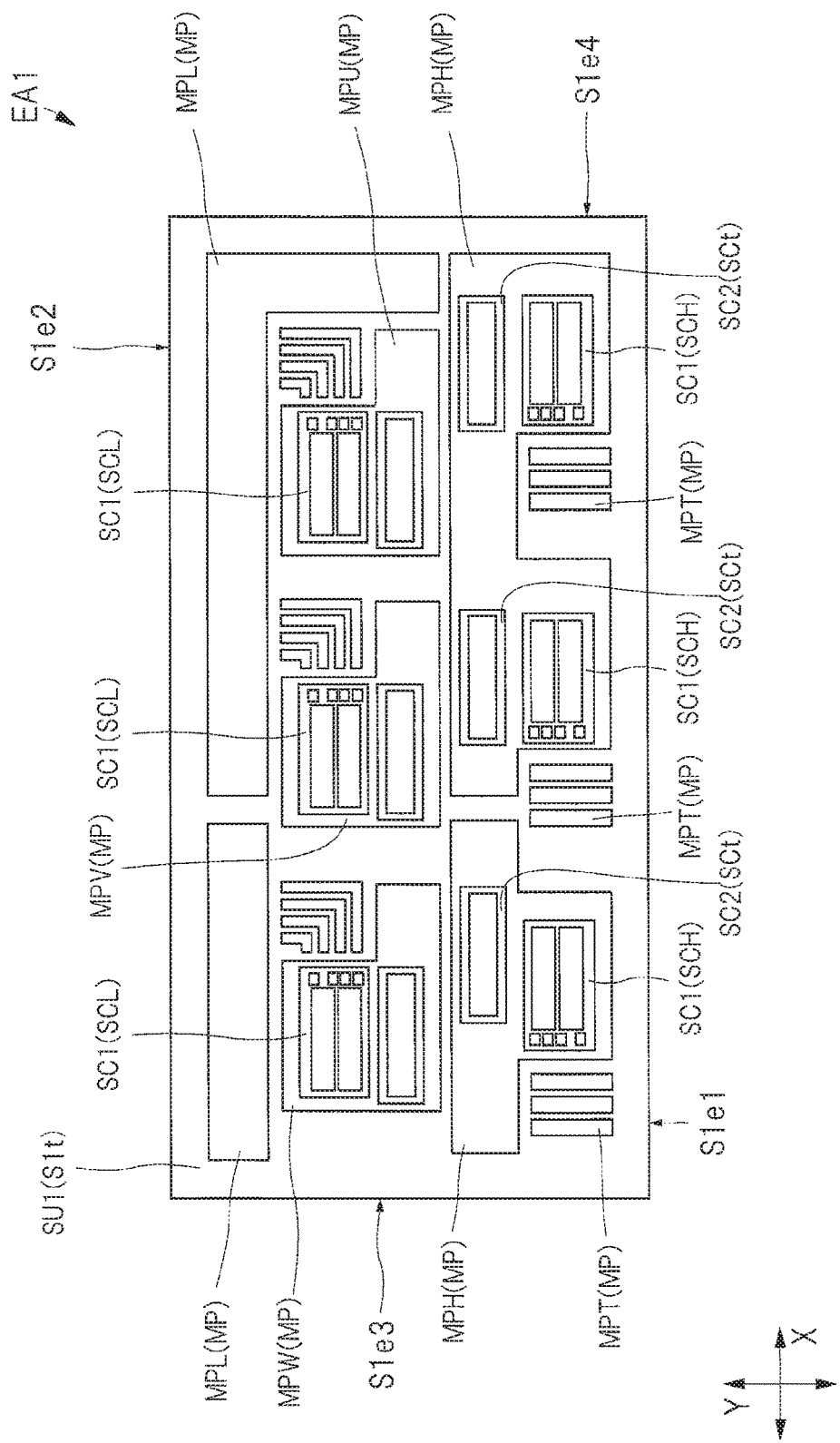
FIG. 21 is a plan view of a substrate prepared at a first substrate preparation step shown in FIG. 20.

At a first substrate preparation step, the substrate SU1 of FIG. 21 is prepared firstly. FIG. 21 is a plan view of the substrate prepared at the first substrate preparation step indicated in FIG. 20.

The substrate SU1 prepared at this step has: the upper surface (front surface, main surface, surface) S1t as a chip mounting surface on which the plurality of semiconductor chips SC1 are mounted; and the lower surface (back surface, main surface, surface) S1b located opposite the upper surface S1t. The substrate SU1 is a ceramic substrate made of a ceramic material.

In addition, jointed to the upper surface S1t of the substrate SU1 are the plurality of metal patterns MP. As described with reference to FIG. 10, the metal pattern MPB is formed on the lower surface S1b of the substrate SU1. Each of the plurality of metal patterns MP is, for example, a stacked film in which a nickel (Ni) film is stacked on a surface of a copper (Cu) film and the copper film is joined directly to the upper surface S1t or lower surface S1b of the substrate SU1. When the copper film is joined to a board made of ceramic such as alumina, a eutectic reaction is utilized for joining. Used as a method of stacking the nickel film on the surface of the copper film can be, for example, an electroplating method.

In addition, the semiconductor chips SCH and SC2 are mounted on the metal patterns MPH supplied with a high-side side potential among the plurality of metal patterns MP. The semiconductor chips SCH and SC2 have rectangular plane shapes, and are arranged in a state (opposing state) where their respective long sides (side SC1e1 of FIG. 2 and side SC2e1 of FIG. 5) face each other. Each of the semiconductor chips SCH is mounted so that the gate electrode GP (see FIG. 2) is located at the closest position to the side S1e1 among the electrodes (electrode pads).

In addition, mounted on each of the metal patterns MPU, MPV, and MPW connected to AC power output terminals among the plurality of metal patterns MP are one semiconductor chip SCL and one semiconductor chip SC2. The semiconductor chips SCL and SC2 have rectangular plane shapes, and are arranged in a state (opposing state) where their respective long sides (side SC1e1 of FIG. 2 and side SC2e1 of FIG. 5) face each other. Each of the semiconductor chips SCL is mounted so that the gate electrode GP (see FIG. 2) is located at the closest position to the side S1e2 among the electrodes (electrode pads).

In addition, in the Y direction and from the side S1e1 of the substrate SU1 toward the side S1e2, the semiconductor chips SCH, high-side semiconductor chips SC2, low-side semiconductor chips SC2, and semiconductor chips SCL are arranged in this order.

As shown in FIG. 14 describe above, each of the plurality of semiconductor chips SCH, SCL, and SC2 is mounted by a so-called face-up packaging method in a state of causing the back surface SCb to oppose the upper surface MPt of the metal pattern MP. The collector electrode CP and the cathode electrode CDP are formed on the back surface SCb of the semiconductor chip SC1 and the back surface SCb of the semiconductor chip SC2, respectively. To electrically connect the collector electrode CP and cathode electrode CDP to the metal pattern MP, the semiconductor chips SC1 and SC2 are mounted on the metal pattern MP via the conductive connecting material (die bond, conductive member, conductive adhesive, connecting member, bond) SD1.

<Enclosure Attachment>

At an enclosure attachment step indicated in FIG. 20, as shown in FIG. 11, the enclosure HS is attached so as to surround a circumference of the substrate SU1, and the substrate SU1 and the enclosure HS are fixed via the bond BD1. In other words, the substrate SU1 is accommodated in the accommodation portion PKT of the enclosure HS at the enclosure attachment step. At this step, the support HSF of the enclosure HS is bonded and fixed to cover the periphery of the upper surface Sit of the substrate SU1. The periphery of the upper surface Sit of the substrate SU1 and the support HSF of the enclosure HS are bonded and fixed via the bond BD1. At this step, the lower surface Sib of the substrate SU1 is bonded and fixed to the base substrate SUB.

Attached to the support HSF of the enclosure HS are the plurality of leads LD in advance at an enclosure preparation step of FIG. 20. The respective leads LD are attached so as to extend along the inner surface of the accommodation portion in the enclosure HS and, as shown in FIG. 12, are arranged along the sides HSe1, HSe2, and HSe3.

<Wire Connection>

At a wire connection step indicated in FIG. 20, as shown in FIG. 12, the plurality of semiconductor chips and leads LD are electrically connected via wires (conductive members) BW.

At this step, as described with reference to FIG. 12, the emitter electrodes EP (see FIG. 2) of the high-side semiconductor chip SCH and the anode electrode ADP (see FIG. 5) of the semiconductor chip SC2 (see FIG. 21) are connected to any of the metal patterns MPU, MPV, and MPW via the plurality of wires BWP. The emitter electrodes EP of the low-side semiconductor chip SCL and the anode electrode ADP of the low-side semiconductor chip SC2 are connected to the metal pattern MPL via the plurality of wires BWP. The gate electrodes GP (see FIG. 2) that each of the high-side semiconductor chip SCH and low-side semiconductor chip SCL has are each electrically connected to each metal pattern MPT via the wire BWS. Other signal electrodes DTP (see FIG. 2) of the semiconductor chips SCH and SCL are electrically connected to the metal patterns MPT via the wires BWS, respectively.

In addition, like this embodiment, when each of the metal pattern MPL and the metal pattern MPH is divided into a plurality of pieces, the divided metal patterns MPL and metal patterns MPH are electrically interconnected via the wires BW. Incidentally, the wires BW connecting the metal patterns MP to each other may be formed in advance at the first substrate preparation step of FIG. 20.

The plurality of wires BW of FIG. 12 are metal wires and are made of, for example, aluminum in this embodiment. However, various modified materials are adopted as the material of the wire BW, and gold or copper can be also used besides aluminum. Incidentally, this embodiment shows, as an example, a case where the wires are used as members for connecting the semiconductor chip SC1 and the metal pattern MP. As a modification of the embodiment, however, strip-shaped metal (e.g., aluminum ribbon) may be used. As another modification, the semiconductor chip SC1 may be connected to the metal pattern MP via solder by using patterned metal plates (copper clips).

<Second Substrate Preparation>

Figure 22:
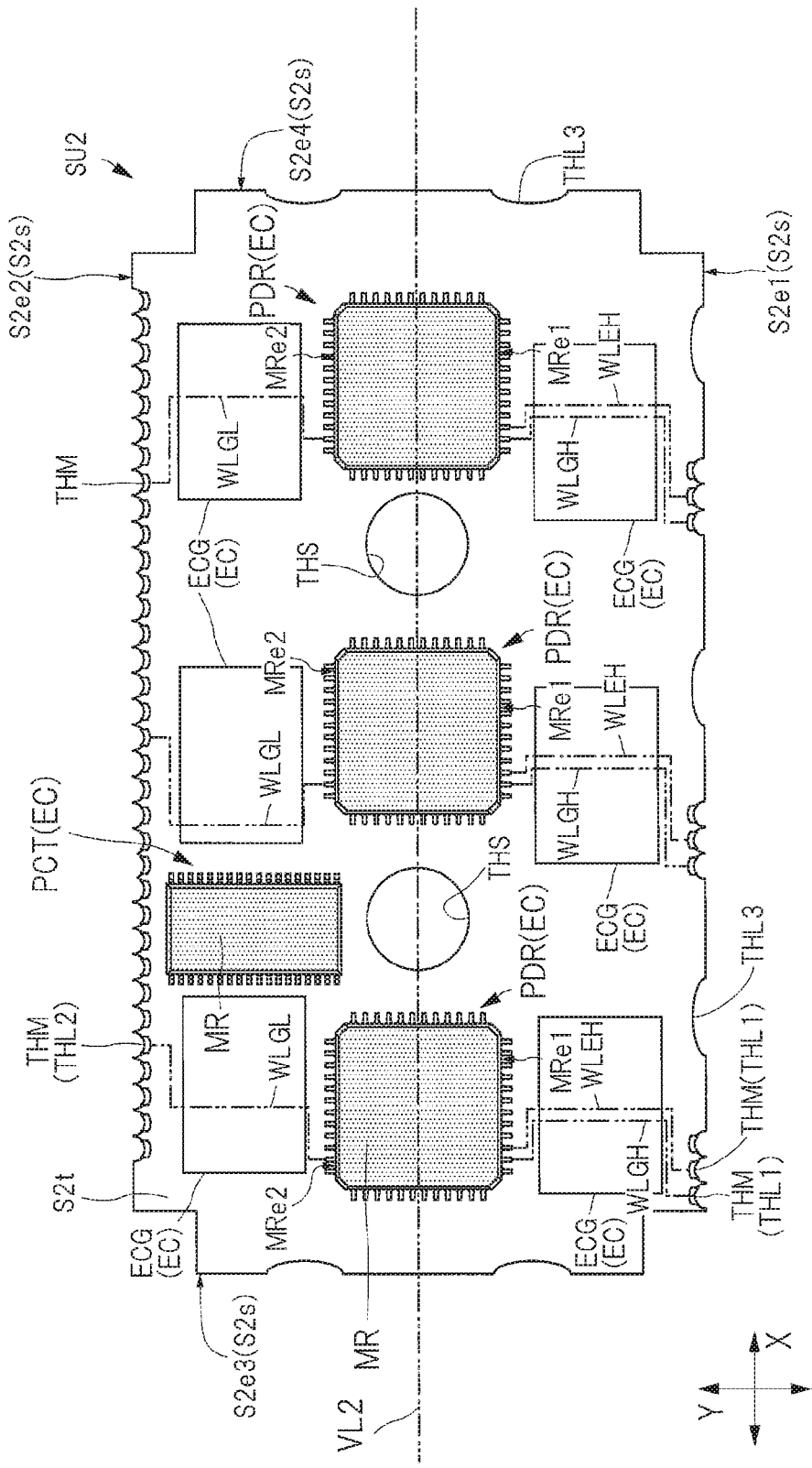
FIG. 22 is a plan view of a wiring substrate prepared at a second substrate preparation step shown in FIG. 20.

In addition, at a second substrate preparation step indicated in FIG. 20, the wiring substrate SU2 of FIG. 22 is prepared. FIG. 22 is a plan view of the wiring substrate prepared at the second substrate preparation step of FIG. 20. Incidentally, in FIG. 20, the second substrate preparation step is indicated below the enclosure preparation step, but timing of carrying out the second substrate preparation step is not limited thereto if the second substrate preparation step is ended before the second substrate accommodation step. For example, the first substrate preparation step, second substrate preparation step, and enclosure preparation step of FIG. 20 may be carried out simultaneously and parallel.

As described with reference to FIG. 11, the wiring substrate SU2 prepared at this step has the lower surface (back surface, main surface, surface) S2b opposing the upper surface Sit of the substrate SU1, and the upper surface (front surface, main surface, surface) S2t located opposite the lower surface S2b. Mounted on the wiring substrate SU2 are a plurality of electronic components including the driver components PDR that are semiconductor components.

In addition, as shown in FIG. 22, in a plan view, the wiring substrate SU2 has: the side (long side, substrate side) S2e1 lengthening (extending) in the X direction; the side (long side, substrate side) S2e2 located opposite the side S2e1; the side (short side, substrate side) S2e3 lengthening (extending) in the Y direction intersecting the X direction (at a right angle in FIG. 22); and the side (short side, substrate side) S2e4 located opposite the side S2e3. The sides S2e1 and S2e2 are relatively longer than the sides S2e3 and S2e4, respectively.

Provided in the side S2e1 are the plurality of openings (recessions, notches) THL1 and the plurality of openings THL3 having been described with reference to FIGS. 16 and 17. Provided in the side S2e2 are openings (recessions, notches) THL2. In the openings THL1 and THL2 of the wiring substrate SU2, the plurality of metal films (conductive patterns) THM, which have been described with reference to FIGS. 16 and 17, are formed.

A relationship between each side of the accommodation portion PKT of the enclosure HS and each component mounted on the wiring substrate SU2, which have been described with reference to FIG. 13, can be reworded as follows.

That is, each of the plurality of driver components PDR is mounted on the upper surface S2t of the wiring substrate SU2 and at such a position as to overlap a virtual line (center line) VL2 extending in the X direction that is a longitudinal direction connecting the center of the side S2e3 and the center of the side S2e4.

In addition, the plurality of wirings WLGH electrically connecting the gate electrodes of the high-side transistors HQ1 (see FIG. 8) and the high-side drive circuits DCH (see FIG. 8) of the driver components PDR are respectively arranged between the side S2e1 and each of the driver components PDR. The plurality of wirings WLGH are connected to the plurality of metal films THM arranged along the side S2e1.

In addition, the plurality of wirings WLGL electrically connecting the gate electrodes of the low-side transistors LQ1 (see FIG. 8) and the low-side drive circuits DCL (see FIG. 8) of the driver components PDR are respectively arranged between the side S2e2 and each of the driver components PDR. The wirings WLGL are connected to the plurality of metal films THM arranged along the side S2e2.

In addition, an electronic component group ECG, which is electrically connected to one of the driver components PDR and one of the semiconductor chips SCH (see FIG. 12), is mounted between the side S2e1 of the wiring substrate SU2 and each of the driver components PDR. Another electronic component group ECG, which is electrically connected to one of the driver components PDR and one of the semiconductor chips SCL (see FIG. 12), is mounted between the side S2e2 of the wiring substrate SU2 and each of the driver components PDR.

In addition, in the X direction, the controller component PCT is disposed between the electronic component groups ECG adjacent to each other. For this reason, the arrangement spaces for the electronic component groups ECG are not obstructed by the controller component PCT, which allows the electronic component groups ECG to be arranged close to the driver components PDR. In the Y direction, the controller component PCT is located closer to the side S2e2 than to the side S2e1 of the accommodation portion PKT.

<Second Substrate Accommodation>

Figure 23:
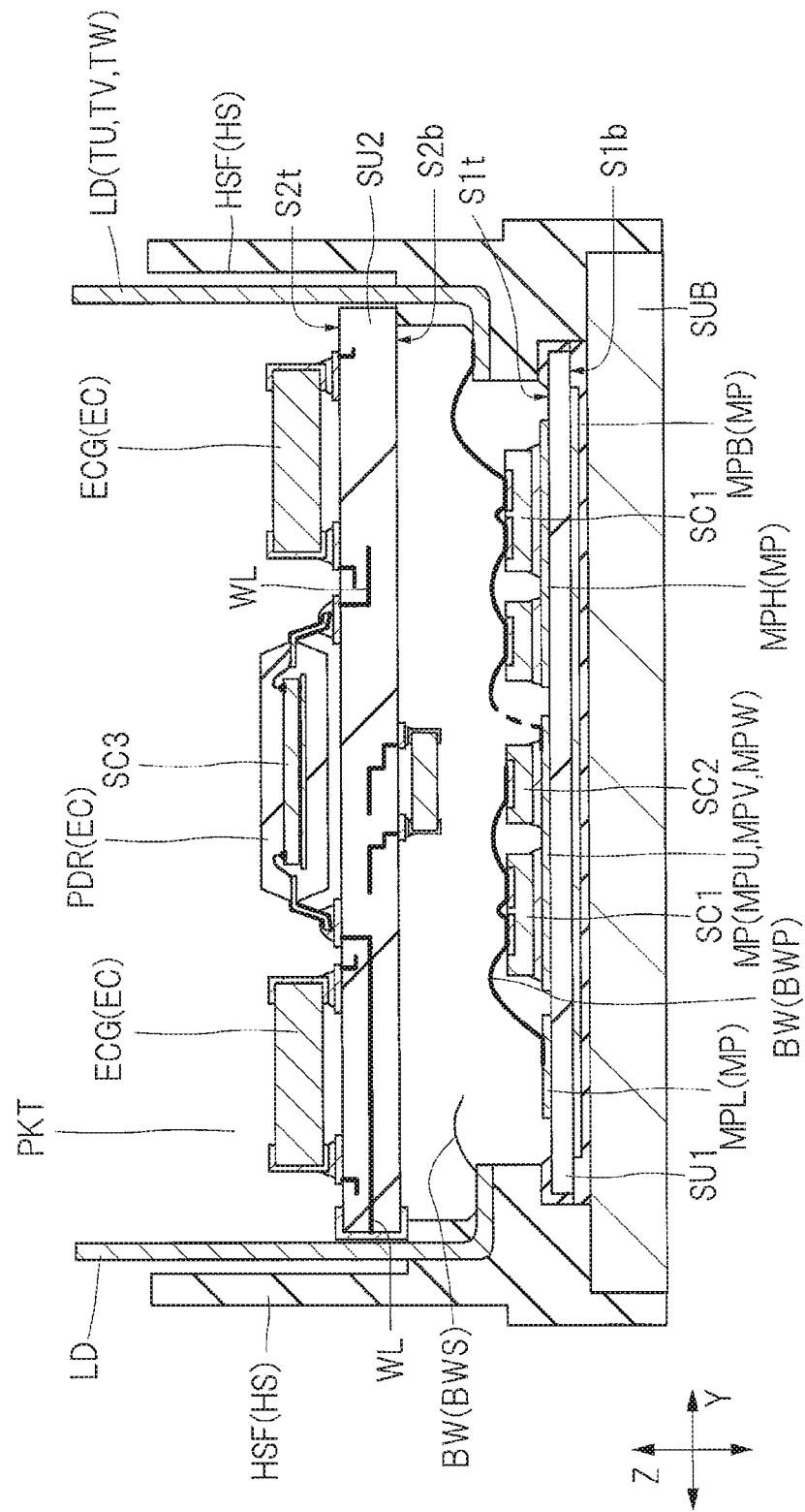
FIG. 23 is a sectional view showing a state in which the wiring substrate is accommodated in an enclosure at a second substrate accommodation step shown in FIG. 20.
Figure 24:
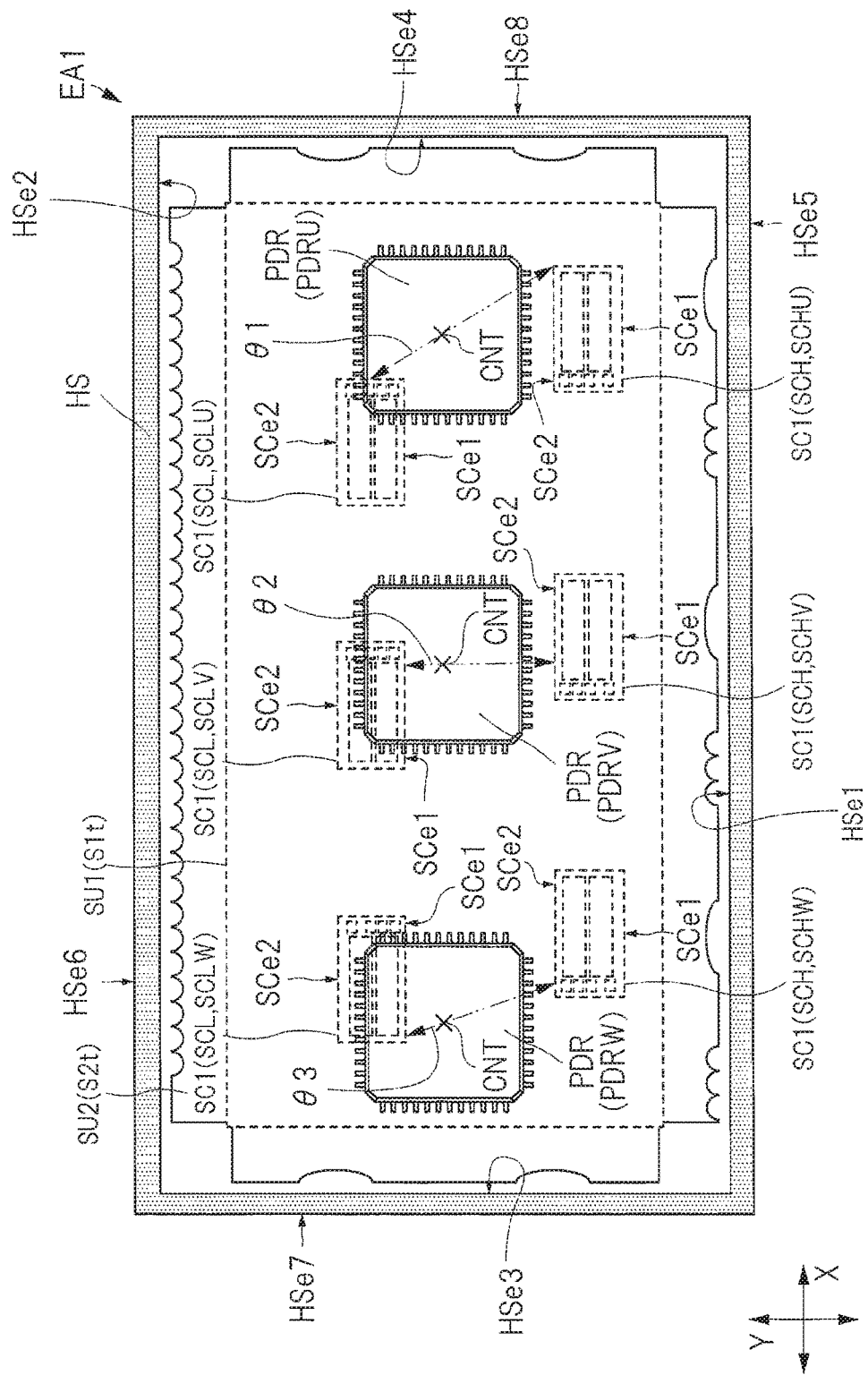
FIG. 24 is a perspective plan view showing a positional relationship between each of lower-side semiconductor chips and each of upper-side driver components after the wiring substrate is accommodated in the enclosure.

In addition, at the second substrate accommodation step of FIG. 20, the wiring substrate SU2 is accommodated in the accommodation portion PKT of the enclosure HS, as shown in FIG. 23. FIG. 23 is a sectional view showing a state in which the wiring substrate is accommodated in the enclosure at the second substrate accommodation step of FIG. 20. FIG. 24 is a perspective plan view showing a positional relationship between the lower-side semiconductor chips and the upper-side driver components after the wiring substrate is accommodated in the enclosure. The perspective plan view in this case is a plan view in which the semiconductor chips SC1 mounted on the substrate SU1 are seen through the wiring substrate SU2 and through the electronic components mounted on the wiring substrate SU2. To make FIG. 24 easier to understand, a component(s) other than the six semiconductor chips SC1 (indicated by dotted lines) and three driver components PDR out of a number of components mounted on the substrate SU1 or the wiring substrate SU2 are omitted in FIG. 24.

At this step, as shown in FIG. 20, the wiring substrate SU2 is disposed above the substrate SU1 so that the lower surface S2b of the wiring substrate SU2 opposes the upper surface Sit of the substrate SU1. As described with reference to FIG. 17, the support HSF of the enclosure HS has the substrate support surface HSh. The wiring substrate SU2 is, therefore, supported by the substrate support surface HSh. Incidentally, at this stage, the wiring substrate SU2 is not fixed yet. The wiring substrate SU2 is to be fixed into the enclosure HS at the following lead connection step.

In addition, at this step, the wiring substrate SU2 is preferably disposed so that the virtual line VL2 of FIG. 22 is superposed on the virtual line VL1 of FIG. 10 in a plan view.

Here, the positional relationship between the driver components PDR and the semiconductor chips SC1 after fixation of the wiring substrate SU2 will be described with reference to FIG. 24. Incidentally, the positional relationship to be described below is almost maintained also in the completed electronic device EA1.

As shown in FIG. 24, the enclosure HS has the side (long side) HSe5 extending in the X direction, and the side (long side) HSe6 located opposite the side (long side) HSe5. In a plan view, the plurality of semiconductor chips SCH are each arranged along the side HSe5 (or side HSe1) and at such a position as to be located closer to the side HSe5 (or side HSe1) than to each of the plurality of semiconductor chips SCL. In a plan view, the semiconductor chips SCL are each arranged along the side HSe6 (or side HSe2) and at such a position as to be located closer to the side HSe6 (or side HSe1) than to each of the semiconductor chips SCH. Each of the semiconductor chips SCH and SCL has a side SCe1 extending along the side HSe5 (or side HSe1) of the enclosure HS, and a side SCe2 located opposite the side SCe1 and extending along the side HSe6 (or side HSe2) of the enclosure HS.

Now, attention is paid to a positional relationship of each set of the driver component PDR, semiconductor chip SCH, and semiconductor chip SCL, which are electrically connected to each other, among the plurality of driver components PDR, semiconductor chips SCH, and semiconductor chips SCL. In the example of FIG. 24, a driver component PDRU is electrically connected to a semiconductor chip SCHU and to semiconductor chip SCLU. In other words, the semiconductor chip SCHU and semiconductor chip SCLU are controlled by the driver component PDRU. A driver component PDRV is electrically connected to a semiconductor chip SCHV and semiconductor chip SCLV. In other words, the semiconductor chip SCHV and semiconductor chip SCLV are controlled by the driver component PDRV. A driver component PDRW is electrically connected to a semiconductor chip SCHW and to semiconductor chip SCLW. In other words, the semiconductor chip SCHW and semiconductor chip SCLW are controlled by the driver component PDRW.

As shown in FIG. 24, in a perspective plan view, the driver component PDRU is mounted on the upper surface S2t of the wiring substrate SU2 in a direction θ1 crossing the X direction so that a center CNT of the driver component PDRU is located between the semiconductor chip SCHU and the semiconductor chip SCLU. In a direction θ2 in a perspective plan view, the driver component PDRV is mounted on the upper surface S2t of the wiring substrate SU2 so that a center CNT of the driver component PDRV is located between the semiconductor chip SCHV and the semiconductor chip SCLV. In a direction θ3 in a perspective plan view, the driver component PDRW is mounted on the upper surface S2t of the wiring substrate SU2 so that a center CNT of the driver component PDRW is located between the semiconductor chip SCHW and the semiconductor chip SCLW. Incidentally, the center CNT of each of the driver components PDR described here is defined, as shown in FIG. 22, as a midpoint of a center line connecting a midpoint of the side MRe1 and a midpoint of the side MRe2 opposite to the side MRe1, the sides MRe1 and MRe2 being sides that each driver component PDR has.

In addition, in the example of FIG. 24, in the Y direction in a perspective plan view, the driver component PDRU is mounted on the upper surface S2t of the wiring substrate SU2 so as to be located between the side SCe1 of the semiconductor chip SCHU and the side SCe2 of the semiconductor chip SCLU. In the Y direction in a perspective plan view, the driver component PDRV is mounted on the upper surface S2t of the wiring substrate SU2 so as to be located between the side SCe1 of the semiconductor chip SCHV and the side SCe2 of the semiconductor chip SCLV. In a perspective plan view, the driver component PDRW is mounted on the upper surface S2t of the wiring substrate SU2 in such a way as to be located between the side SCe1 of the semiconductor chip SCHW and the side SCe2 of the semiconductor chip SCLW in the Y direction.

As described above referring to FIG. 8, since the driver components have the above layout, the path distance of the high-side gate line GLH can be made equal in length to the path distance of the low-side gate line GLL.

<Lead Connection>

In addition, at a lead connection step indicated in FIG. 20, some of the plurality of leads LD of FIG. 13 are electrically connected to the wiring substrate SU2.

At this step, as described with reference to FIG. 17, the wirings WLGH are electrically connected to the leads LGH via the solders SD3 and the metal films THM in the openings THL1. The wirings WLGL are electrically connected to the leads LGL via the solders SD3 and the metal films THM in the openings THL2. The wirings WLEH are electrically connected to the leads LEH via the solders SD3 and the metal films THM in the openings THL3. At this step, when the solders SD3 are hardened, the wiring substrate SU2 is fixed to the enclosure HS via the solders SD3 and the leads LD.

<Sealing>

Figure 25:
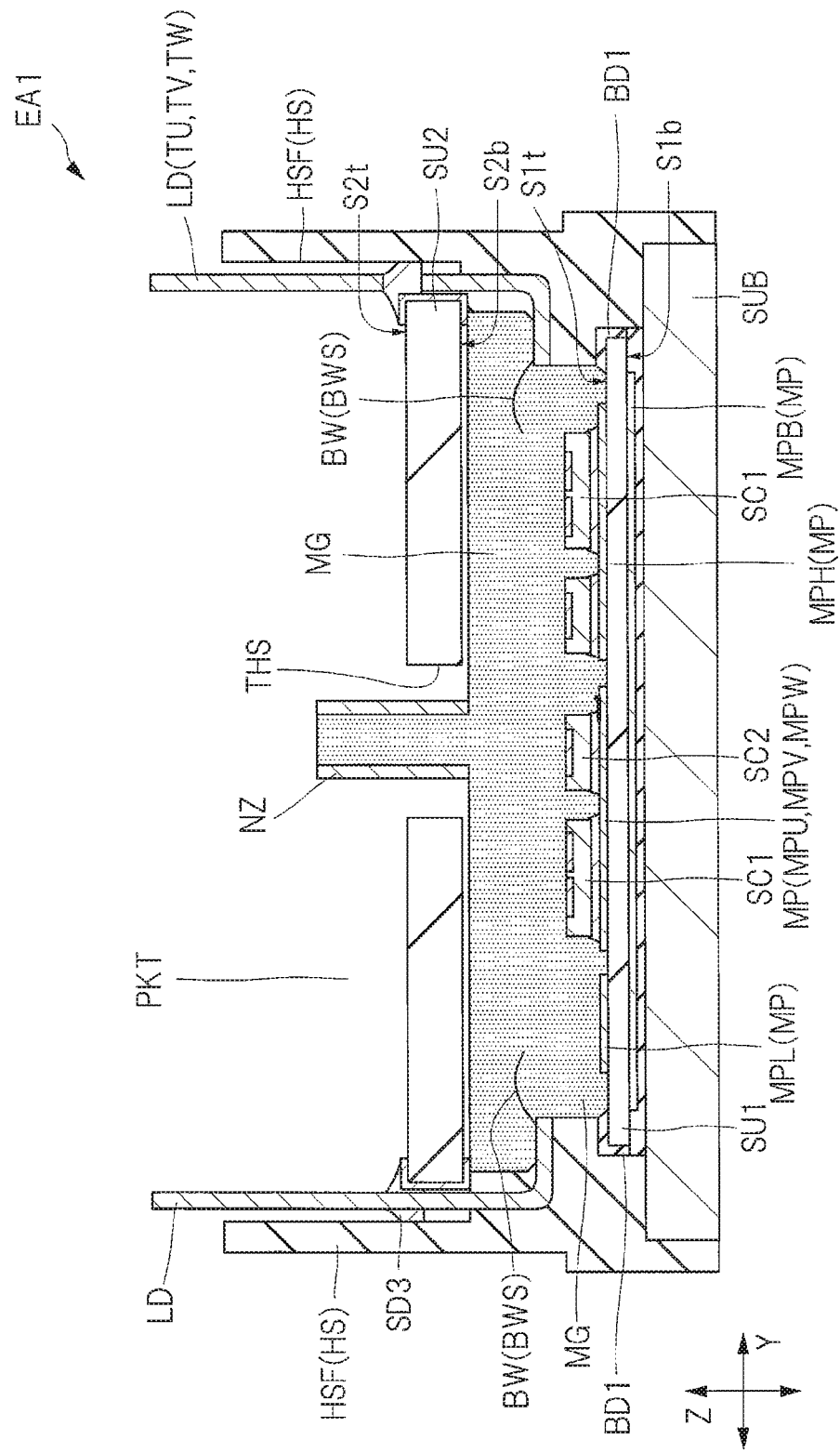
FIG. 25 is a sectional view showing a state in which a resin is supplied into an accommodation portion of the enclosure at a sealing step shown in FIG. 20.

At a sealing step indicated in FIG. 20, as shown in FIG. 25, the sealant MG is supplied into a space between the substrate SU1 and the wiring substrate SU2 in the accommodation portion PKT to seal part of each of the plurality of leads LD, the plurality of semiconductor chips SC1 and SC2, and the plurality of wires BW. FIG. 25 is a sectional view showing a state of supplying a resin into the accommodation portion of the enclosure at the sealing step of FIG. 20.

In this embodiment, the sealing step is performed in a state where the lid (lid member, cap) HST of FIG. 11 is not attached yet. As shown in FIG. 22, the plurality of through-holes THS are formed in the wiring substrate SU2. For this reason, in this embodiment, as shown in FIG. 25, the nozzle NZ, which is a jig for resin injection, is inserted in each through-hole THS to supply the sealant MG into the space between the substrate SU1 and the wiring substrate SU2.

Now, as a modification with respect to the example of FIG. 20, there is a method of performing the sealing step after the wire connection step and before the second substrate accommodation step. In this case, since the sealing step is performed before accommodating the wiring substrate SU2, the through-holes THS formed in the wiring substrate SU2 may not need to be provided. However, in this modification, the lead connection step is performed after the sealing step. Like this embodiment, when the gelled sealant MG with relatively high fluidity is used, a number of bubbles may occur in the sealant MG at the sealing step. These bubbles can be easily eliminated by, for example, placing in a vacuum chamber the electronic device in production and carrying out so-called vacuum deaeration. At this time, however, splash of the gelled sealant MG may adhere to a circumference of the electronic device. If the splash of the gelled sealant MG adheres to a portion of the lead LD to be bonded to the solder SD3, this becomes a cause for deterioration in bondability of the solder SD3. Therefore, in this embodiment, the through-holes THS are formed in the wiring substrate SU2, and the method of performing the sealing step after the lead connection step is applied.

In addition, as described already, the through-holes THS are preferably located close to the middle of the wiring substrate SU2 in a plan view shown in FIG. 13 in order to fill the whole of the substrate SU1 with the sealant MG. Like this embodiment, when the electronic device EA1 is rectangular, the through-holes THS are preferably provided along the X direction that is a longitudinal direction.

<Lid Attachment>

At the sealing step of FIG. 20, as shown in FIG. 11, the lid HST is attached to an upper part of the enclosure HS to cover an area sealed with the sealant MG. Since the area sealed with the sealant MG is covered with the lid HST, foreign objects etc. can be prevented from intruding into the inner space of the enclosure HS. A plurality of through-holes (not depicted) are formed in the lid HST of the enclosure HS, and the plurality of leads LD are inserted into the through-holes, respectively.

As shown in FIG. 13, the support HSF of the enclosure HS has lid holding portions HTh that hold the lid HST. In the example of FIG. 13, the lid holding portions HTh are formed at four corners of the support HSF, respectively. The lid HST is fixed to the lid holding portions HTh of the support HSF by, for example, a bond (not depicted). Or, the lid HST may be placed on the accommodation portion PKT of the support HSF without interposing the bond therebetween. If a location of the lid HST is not shifted on the support HSF, the foreign objects can be prevented from intruding into the inner space of the enclosure HS even when the lid HST is not completely fixed thereto.

Through each of the above steps, the electronic device EA1 described with reference to FIGS. 1 to 19 can be obtained. The obtained electronic device EA1 is then subjected to necessary inspections and tests such as exterior inspections and electrical tests, and is shipped out. Or, the obtained electronic device is mounted on a packaging board (not depicted).

In the foregoing, the invention made by the inventors of the present invention has been concretely described based on the embodiments. However, it is needless to say that the present invention is not limited to the foregoing embodiments and various modifications and alterations can be made within the scope of the present invention. Incidentally, some modifications have been described in the above embodiment, but typical modifications other than the modifications described in the above embodiment will be explained hereinafter.

First Modification

In the above embodiment, described as the method of electrically connecting the wiring substrate SU2 and some of the plurality of leads LD has been the method of connecting, via the solder SD3, the leads LD extending linearly in the Z direction and the metal films THM provided on the periphery of the wiring substrate SU2. A modification with respect to a connection structure of FIGS. 16 and 17 will hereinafter be described.

Figure 26:
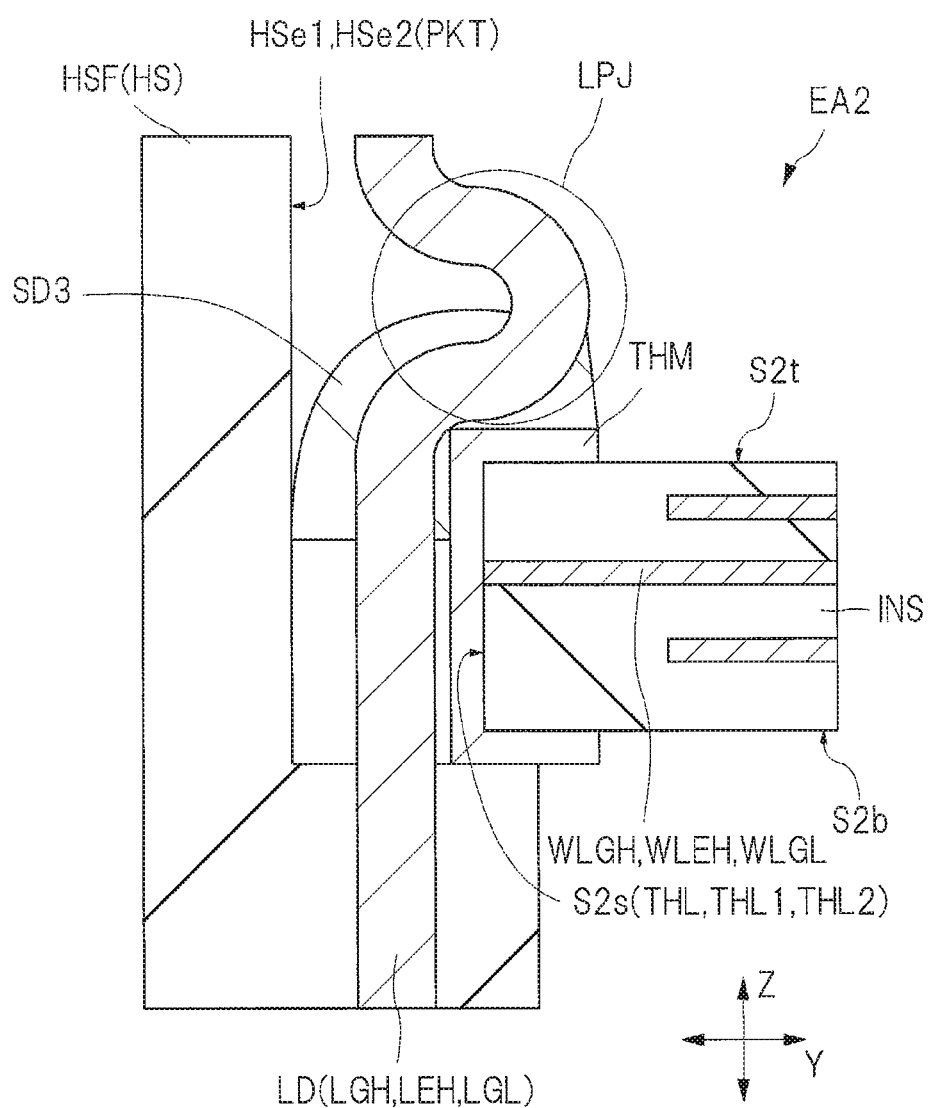
FIG. 26 is an enlarged sectional view of a principle part showing a modification made to the sectional view of FIG. 17.
Figure 27:
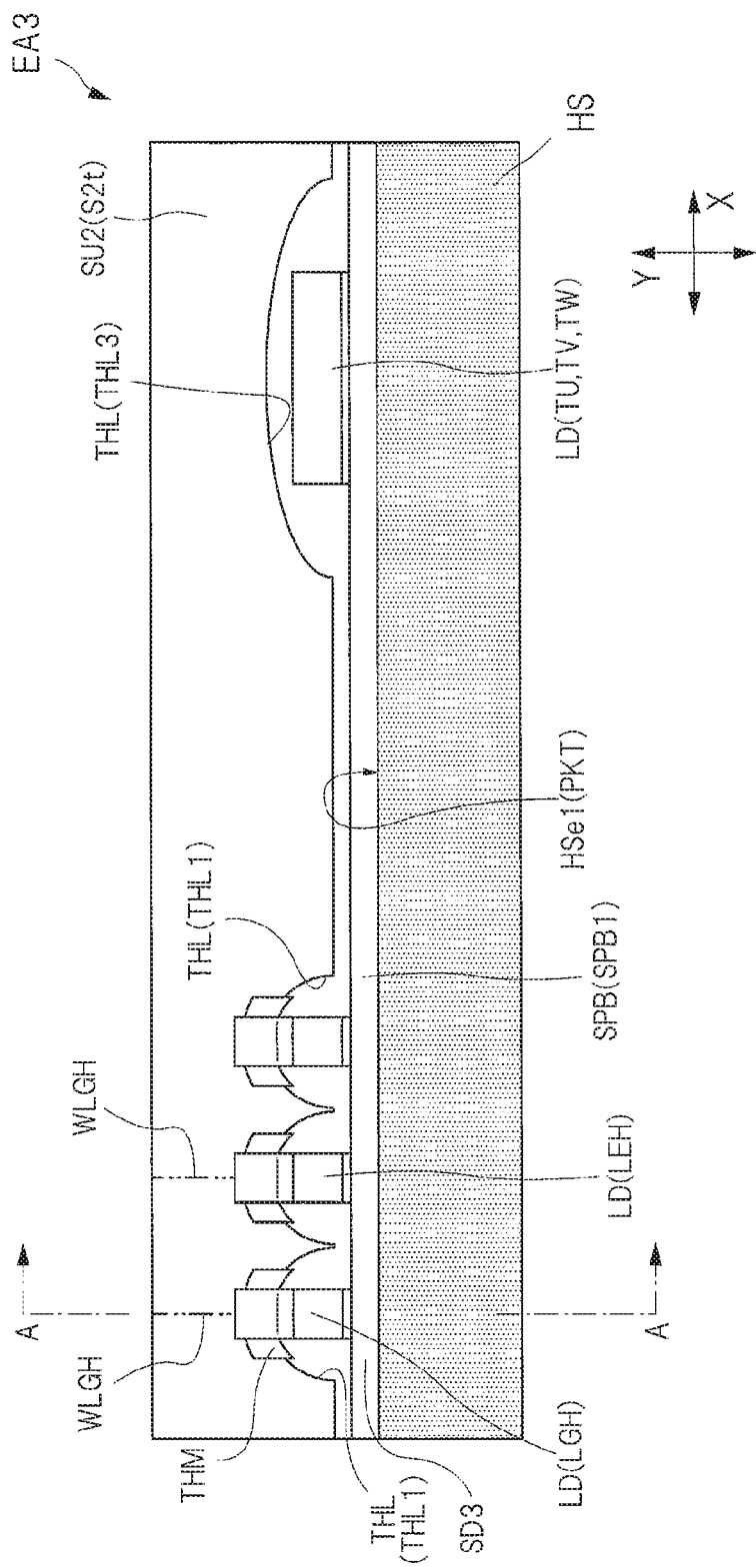
FIG. 27 is an enlarged sectional view of a principle part showing a modification made to the sectional view FIG. 16.
Figure 28:
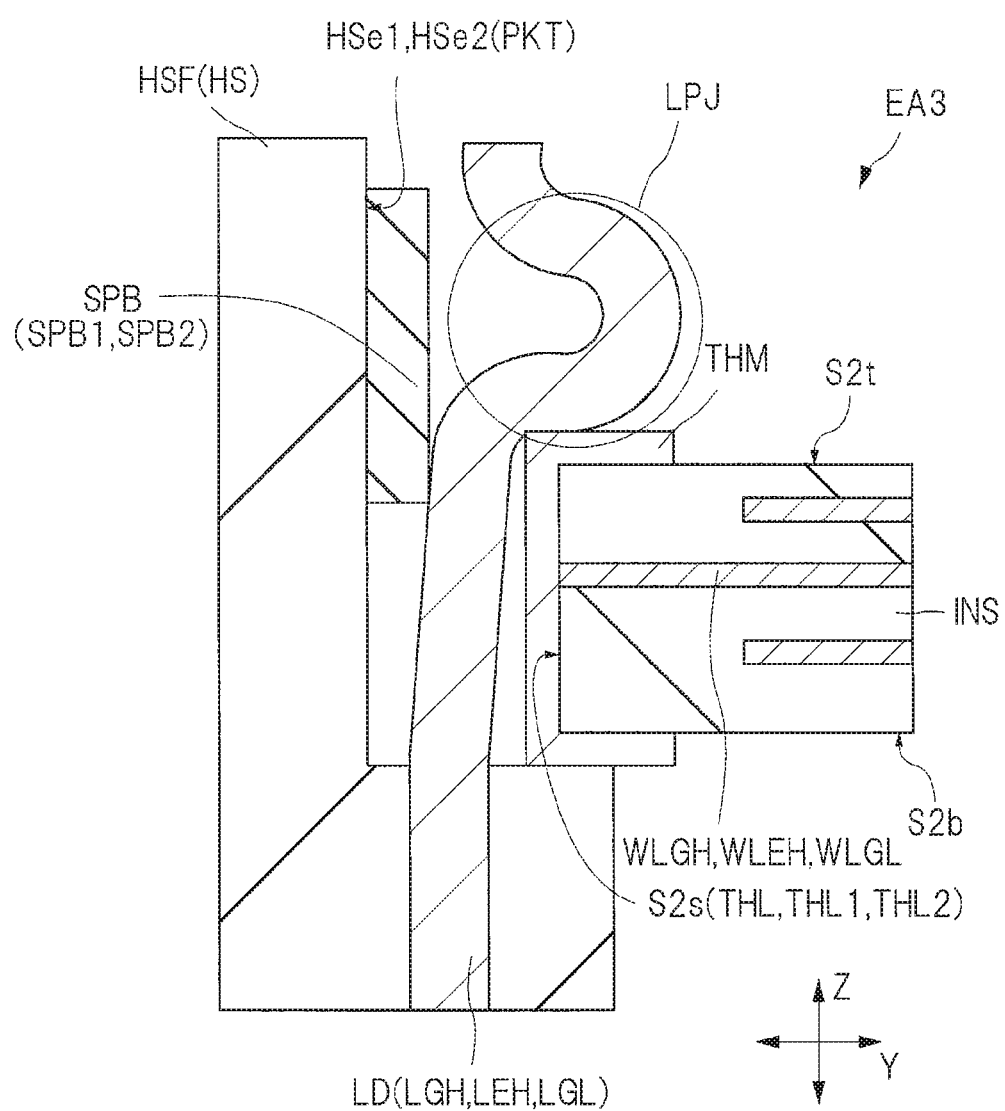
FIG. 28 is an enlarged sectional view of a principle part taken along an A-A line of FIG. 27.

FIG. 26 is an enlarged sectional view of a principle part showing a modification with respect to the example of FIG. 17. FIG. 27 is an enlarged sectional view of a principle part showing a modification with respect to the example of FIG. 16. FIG. 28 is an enlarged sectional view of a principle part taken along an A-A line of FIG. 27.

An electronic device EA2 shown in FIG. 26 is different from the electronic device EA1 of FIG. 17 in that each of the leads LD connected to the wiring substrate SU2 among the plurality of leads LD has a projection LPJ protruding in a direction intersecting the Z direction. In the example of FIG. 26, the projection LPJ is formed at each of the leads LGH, LEH, and LGL.

As shown in FIG. 26, the projection LPJ is provided so as to cover a part of the upper surface S2$t$ of the wiring substrate SU2. At least a part of the projection LPJ is in contact with the solder SD3. Since the projection LPJ is provided at the lead LD to bring the projection LPJ into contact with the solder SD3 in this manner, a contact area between the lead LD and the solder SD3 increases in comparison with the example of FIG. 17. This brings an increase in bonding strength between the lead LD and the solder SD3. Reduced can be also a resistance component of a part to which the lead LD and the solder SD3 are electrically connected.

In addition, an electronic device EA3 shown in FIGS. 27 and 28 is different from the electronic device EA1 of FIG. 16 and the electronic device EA2 of FIG. 26 in that the leads LD connected to the wiring substrate SU2 among the plurality of leads LD are each electrically connected to the metal film THM without interposing the solder SD3 of FIGS. 16, 17, and 26. In the example of FIG. 28, the leads LGH, LEH, and LGL among the plurality of leads are connected to the wiring substrate by the following connection method.

That is, as shown in FIG. 27, disposed between the inner surface of the enclosure HS and each of the leads LD is a bar member (spacer member) SPB1 which is in contact with the leads LD and the inner surface of the enclosure HS and extends along the side HSe1 of the enclosure HS. Likewise, disposed between the inner surface of the enclosure HS and each of the leads LD is a bar member (spacer member) SPB2 (see FIG. 28) which is in contact with the leads LD and the inner surface of the enclosure HS and extends along the side HSe2 (see FIG. 28) of the enclosure HS. The bar members SPB (SPB1 and SPB2) are bar-like members made of an insulating material(s). In a case of the electronic device EA3, since the bar member SPB is inserted between the inner surface of the enclosure HS and the lead LD, the lead LD is pressed toward the wiring substrate SU2. As a result, the lead LD bends toward the wiring substrate SU2, and thereby the projection LPJ is into contact with the metal film THM of the wiring substrate SU2.

The connection method adopted in the electronic device EA3 makes it possible to connect the leads LD and the wiring substrate SU2 without using the solder SD3, so that it is difficult for short circuit to occur between the leads LD adjacent to each other. This allows a reduction in an arrangement interval between the leads LD.

Incidentally, as a further modification with respect to the electronic device EA3, the lead LD linearly extending in the Z direction and shown in FIG. 17 may be pressed by the bar member 28 as shown in FIG. 28. However, in terms of certainly bringing the lead LD into contact with the metal film THM, the lead LD preferably has the projection LPJ, as shown in FIG. 28.

In addition, as shown in FIG. 27, when the plurality of leads LD are pressed collectively by one bar member SPB, such lead (s) not electrically connected to the wiring substrate SU2 as the terminals TU, TV, and TW is also pressed toward the wiring substrate SU2. However, as mentioned already, the metal film THM is not formed in the openings (recessions, notches) THL3 of the wiring substrate SU2. Even if the terminals TU, TV, and TW are brought in contact with the wiring substrate SU2, therefore, a state where the terminals TU, TV, and TW are kept electrically separated from the wiring substrate SU2 can be maintained.

Second Modification

In addition, in the above embodiment, an aspect applied to the three-phase inverter circuit has been dealt with and described, but this aspect may be applied also to an inverter circuit different from the three-phase inverter circuit. For example, a technique(s) described in the above embodiment may be applied to a single-phase inverter circuit etc. In this case, for example, an inverter circuit including one of the legs LG1, LG2, and LG3 of FIG. 1 can be obtained. In the single-phase inverter circuit, the path distance of the high-side gate line can be easily made equal in length to the path distance of the low-side gate line.

Third Modification

In addition, in the above embodiment, an aspect in which the plurality of driver components PDR and the controller component PCT are respectively mounted on the upper surface S2$t$ of the wiring substrate SU2 has been dealt with and described. However, the driver components PDR and the controller component PCT may be mounted on the lower surface S2$b$. In another example, for example, the driver components PDR may be mounted on the upper surface S2$t$ and the controller component PCT may be mounted on the lower surface S2$b$. However, the respective driver components PDR are preferably mounted on the same surface in terms of making the gate lines GLH and GLL (see FIG. 8) equal in length to each other, the gate lines GLH and GLL being connected to the driver components PDR.

Fourth Embodiment

In addition, in the above embodiment, as shown in FIG. 11, described has been a configuration in which the area between the substrate SU1 and the wiring substrate SU2 is sealed with the sealant MG and the driver components PDR etc. mounted on the upper surface S2$t$ side of the wiring substrate SU2 are exposed from the sealant MG. However, the upper surface of the wiring substrate SU2 may be also sealed with the sealant MG. In such a case, components mounted on the wiring substrate SU2 are protected by the sealant MG. For example, when semiconductor chips are used as the driver components PDR and controller component PCT, and if wires are connected to the semiconductor chips, the wires need to be protected. Therefore, if the upper surface S2$t$ side of the wiring substrate SU2 is sealed with the sealant MG, those wires can be protected.

Fifth Embodiment

In addition, in the above embodiment, an example of using the IGBT as the transistor Q1 making up the switching element has been described. As a modification, however, a power MOSFET may be used as the switching element of the inverter circuit. In a case of the power MOSFET, a body diode which is a parasitic diode is formed in the semiconductor element configuring a transistor. This body diode functions as the diode (free-wheeling diode) FWD of FIG. 7. For this reason, if a semiconductor chip having the power MOSFET is used, the body diode is built in the semiconductor chip. In the case of using the power MOSFET, therefore, one semiconductor chip may be used as one switching element.

In addition, use of the power MOSFET as the switching element of the inverter circuit can be also applied by replacing: a content about the "emitter" described in the above embodiment and the second embodiment as "source"; and a content about the "collector" as "drain". Therefore, the duplicate description will be omitted.

Sixth Modification

In addition, various modifications have been described above. For example, however, a combination(s) of the above modifications can be applied.

In addition, if a technical idea is extracted from the descriptions of the semiconductor device and its manufacturing method described in the above embodiment(s), the idea can be expressed as follows.

[Additional Note 1]

A manufacturing method for an electronic device comprises the steps of:

(a) preparing a first substrate having a first main surface and a second main surface opposite to the first main surface, a plurality of first semiconductor components and a plurality of second semiconductor components being mounted on the first main surface;

(b) preparing a case including an accommodation portion, the accommodation portion having in a plan view a first long side extending in a first direction, a second long side opposite to the first long side, a first short side extending in a second direction intersecting the first direction, and a second short side opposite to the first short side;

(c) preparing a second substrate having a third main surface and a fourth main surface opposite to the third main surface, a plurality of third semiconductor components being mounted on the third main surface or the fourth main surface;

(d) accommodating the first substrate in the case after the (a) and (b);

(e) mounting the second substrate on the accommodation portion of the case, after the (d), so that the first main surface of the first substrate and the third main surface of the second substrate oppose each other;

(f) electrically connecting the second substrate and some of a plurality of lead members extending in a third direction that is a normal direction to the first main surface along an inner surface of the accommodation portion of the case; and (g) sealing the first semiconductor components and the second semiconductor components with a resin, the resin being supplied into a space between the first substrate and the second substrate in the accommodation portion of the case, wherein the plurality of first semiconductor components each have a first power transistor and are arranged on a side of the first long side of the accommodation portion so as to line up along the first direction in a plan view, the plurality of second semiconductor components each have a second power transistor and are arranged on a side of the second long side of the accommodation portion so as to line up along the first direction in a plan view, the plurality of the third semiconductor components each have a first drive circuit driving the first power transistor and a second drive circuit driving the second power transistor, and are mounted so as to line up along the first direction in a plan view, the plurality of lead members include:

a plurality of first lead members arranged along the first long side of the inner surface of the case and electrically connected to a gate electrode of the first power transistor; and a plurality of second lead members arranged along the second long side of the inner surface of the case and electrically connected to a gate electrode of the second power transistor, the second substrate has:

a plurality of first wirings arranged between the first long side of the case and each of the plurality of third semiconductor components and electrically connected with the first drive circuit; and a plurality of second wirings arranged between the second long side of the case and each of the plurality of third semiconductor components and electrically connected with the second drive circuit, and at the (f), the plurality of first wirings are connected to the plurality of first lead members on a side of the first long side of the case, and the plurality of second wirings are connected to the plurality of second lead members on a side of the second long side of the case.

What is claimed is:

1. An electronic device comprising:

a first substrate having a first main surface and a second main surface opposite to the first main surface;

a plurality of first semiconductor components each having a first power transistor, the first semiconductor components being mounted on the first main surface of the first substrate;

a plurality of second semiconductor components each having a second power transistor, the second semiconductor components being mounted on the first main surface of the first substrate;

a second substrate having a third main surface and a fourth main surface opposite to the third main surface;

a plurality of third semiconductor components each having a first drive circuit driving the first power transistor and a second drive circuit driving the second power transistor, the third semiconductor components being mounted on the third main surface or fourth main surface of the second substrate; and a case accommodating the first substrate and the second substrate so that the second substrate is located over the first main surface of the first substrate, wherein the case has, in a plan view, a first long side extending along a first direction, and a second long side extending along the first direction and located opposite the first long side, wherein, in a plan view, each of the plurality of first semiconductor components is arranged along the first long side and is closer to the first long side than each of the second semiconductor components, wherein, in a plan view, each of the plurality of second semiconductor components is arranged along the second long side and is closer to the second long side than each of the first semiconductor components, wherein, in a plan view, each of the plurality of first semiconductor components and the plurality of second semiconductor components has a third side extending along the first long side of the case, and a fourth side extending along the second long side of the case and located opposite the third side, wherein the plurality of third semiconductor components include a fourth semiconductor component, wherein the plurality of first semiconductor components include a fifth semiconductor component electrically connected to the first drive circuit of the fourth semiconductor component, wherein the plurality of second semiconductor components include a sixth semiconductor component electrically connected to the second drive circuit of the fourth semiconductor component, wherein, in a perspective plan view, the fourth semiconductor component is present between the third side of the fifth semiconductor component and the fourth side of the sixth semiconductor component, wherein the case has, in a plan view, a first short side extending along a second direction intersecting the first direction, and a second short side extending along the second direction and located opposite the first short side, wherein the second substrate has a first wiring electrically connecting the first power transistor of the fifth semiconductor component and the first drive circuit of the fourth semiconductor component, and a second wiring electrically connecting the second power transistor of the sixth semiconductor component and the second drive circuit of the fourth semiconductor component, wherein, in a plan view, the first wiring is disposed between the first long side of the case and the fourth semiconductor component, and the second wiring is disposed between the second long side of the case and the fourth semiconductor component, wherein, in a plan view, each of the plurality of third semiconductor components overlaps a virtual line connecting a midpoint of the first short side of the case and a midpoint of the second short side, wherein a seventh semiconductor component has a control circuit controlling operations of the first drive circuit and the second drive circuit and is electrically connected to each of the plurality of third semiconductor components, the seventh semiconductor component being mounted on one surface, on which the plurality of third semiconductor components are mounted, out of the third main surface and the fourth main surface of the second substrate, wherein the seventh semiconductor component is closer to the second long side than to the first long side in the second direction, and wherein the seventh semiconductor component is mounted between two third semiconductor components adjacent to each other among the plurality of third semiconductor components in the first direction.

2. The electronic device according to claim 1, wherein a first potential supplied to each of the plurality of first semiconductor components from outside is lower than a second potential supplied to each of the plurality of second semiconductor components from outside.

3. The electronic device according to claim 2, wherein a voltage of a control signal transmitted to each of the plurality of third semiconductor components from the control circuit of the seventh semiconductor component is lower than a voltage of a drive signal transmitted to each of the first semiconductor components from the first drive circuit that each of the third semiconductor components has, and is lower than a voltage of a drive signal transmitted to each of the second semiconductor components from the second drive circuit that each of the third semiconductor components has.

4. The electronic device according to claim 2, wherein each of the plurality of first semiconductor components and the plurality of second semiconductor components is sealed with a gelled resin, and wherein the second substrate has a plurality of through-holes, the through-holes being formed between the plurality of third semiconductor components and penetrating from one of the third main surface and the fourth main surface to the other.

5. The electronic device according to claim 1, further comprising a plurality of lead members electrically connecting the first substrate and the second substrate, wherein the second substrate has a plurality of openings each penetrating from one of the third main surface and the fourth main surface to the other, wherein, in a plan view, each of the openings is provided on a periphery of the second substrate, and wherein each of the lead members is disposed in an area encircled by each of the openings, and the first long side, second long side, first short side, and second short side of the case.

6. The electronic device according to claim 5, wherein the second substrate has a first wiring electrically connecting the first power transistor of the fifth semiconductor component and the first drive circuit of the fourth semiconductor component, and a second wiring electrically connecting the second power transistor of the sixth semiconductor component and the second drive circuit of the fourth semiconductor component, wherein the first wiring is electrically connected via solder to at least one first lead member belonging to the plurality of lead members in a first opening provided on a side of the first long side of the case among the plurality of openings, and wherein the second wiring is electrically connected via solder to at least one second lead member belonging to the plurality of lead members in a second opening provided on a side of the second long side of the case among the plurality of openings.

7. The electronic device according to claim 5, wherein a first conductive pattern is formed on a periphery of a first opening encircling at least one first lead member belonging to the plurality of lead members among the plurality of openings, the first conductive pattern covering the first opening and being electrically connected to the fourth semiconductor component, wherein a second conductive pattern is formed on a periphery of a second opening encircling at least one second lead member belonging to the plurality of lead members among the plurality of openings, the second conductive pattern covering the second opening and being electrically connected to the fourth semiconductor component, wherein each of the first and second lead members has a projection protruding in a direction intersecting a third direction that is a direction of a thickness between the third main surface and fourth main surface of the second substrate, and wherein the projection is connected to the first conductive pattern or second conductive pattern on a side of the fourth main surface of the second substrate.

8. The electronic device according to claim 7, wherein a first bar member is disposed between the case and the first lead member, the first bar member being in contact with the first lead members and the case and extending along the first long side of the case, wherein a second bar member is disposed between the case and the second lead member, the second lead member being in contact with the second lead members and the case and extending along the second long side of the case, and wherein the first and second bar members are each made of an insulating material.

9. The electronic device according to claim 5,
wherein the second substrate has a first wiring electrically connecting the first power transistor of the fifth semiconductor component and the first drive circuit of the fourth semiconductor component, and a second wiring electrically connecting the second power transistor of the sixth semiconductor component and the second drive circuit of the fourth semiconductor component,
wherein a first conductive pattern is formed on a periphery of a first opening encircling at least one first lead member belonging to the plurality of lead members among the plurality of openings, the first conductive pattern covering the first opening and being electrically connected to the fourth semiconductor component,
wherein a second conductive pattern is formed on a periphery of a second opening encircling at least one second lead member belonging to the plurality of lead members among the plurality of openings, the second conductive pattern covering the second opening and being electrically connected to the fourth semiconductor component,
wherein the plurality of lead members include a third lead member electrically connected to the plurality of first semiconductor components or second semiconductor components and electrically separated from the second substrate,
wherein the first wiring is electrically connected to the first lead members via the first conductive pattern,
wherein the second wiring is electrically connected to the first lead members via the first conductive pattern, and
wherein a periphery of a third opening encircling the third lead member among the plurality of openings is covered with no conductive pattern, and an insulating material making up the second substrate is exposed from the periphery.

10. The electronic device according to claim 1,
wherein at least one first electronic component group is mounted between the first long side of the case and each of the plurality of third semiconductor components, the first electronic component group being electrically connected to one of the third semiconductor components and one of the first semiconductor components, and
wherein a second electronic component group is mounted between the second long side of the case and each of the plurality of third semiconductor components, the second electronic component group being electrically connected to one of the third semiconductor components and one of the second semiconductor components.

11. An electronic device comprising:
a first substrate having a first main surface and a second main surface opposite to the first main surface;
a plurality of first semiconductor components each having a first power transistor, the first semiconductor components being mounted on the first main surface of the first substrate;
a plurality of second semiconductor components each having a second power transistor, the second semiconductor components being mounted on the first main surface of the first substrate;
a second substrate having a third main surface and a fourth main surface opposite to the thin main surface;
a plurality of third semiconductor components each having a first drive circuit driving the first power transistor and a second drive circuit driving the second power transistor, the third semiconductor components being mounted on the third main surface or fourth main surface of the second substrate; and
a case accommodating the first substrate and the second substrate so that the second substrate is located over the first main surface of the first substrate,
wherein the case has, in a plan view, a first long side extending along a first direction, and a second long side extending along the first direction and located opposite the first long side,
wherein, in a plan view, each of the plurality of first semiconductor components is arranged along the first long side and is closer to the first long side than each of the second semiconductor components,
wherein, in a plan view, each of the plurality of second semiconductor components is arranged along the second long side and is closer to the second long side than each of the first semiconductor components,
wherein, in a plan view, each of the plurality of first semiconductor components and the plurality of second semiconductor components has a third side extending along the first long side of the case, and a fourth side extending along the second long side of the case and located opposite the third side,
wherein the plurality of third semiconductor components include a fourth semiconductor component,
wherein the plurality of first semiconductor components include a fifth semiconductor component electrically connected to the first drive circuit of the fourth semiconductor component,
wherein the plurality of second semiconductor components include a sixth semiconductor component electrically connected to the second drive circuit of the fourth semiconductor component,
wherein, in a perspective plan view, the fourth semiconductor component is present between the third side of the fifth semiconductor component and the fourth side of the sixth semiconductor component,
wherein at least one first electronic component group is mounted between the first long side of the case and each of the plurality of third semiconductor components, the first electronic component group being electrically connected to one of the third semiconductor components and one of the first semiconductor components,
wherein a second electronic component group is mounted between the second long side of the case and each of the plurality of third semiconductor components, the second electronic component group being electrically connected to one of the third semiconductor components and one of the second semiconductor components,
wherein a seventh semiconductor component has a control circuit controlling operations of the first drive circuit and the second drive circuit and is electrically connected to each of the plurality of third semiconductor components, the seventh semiconductor component being mounted on one surface, on which the third semiconductor component is mounted, out of the third main surface and the fourth main surface of the second substrate, and
wherein the seventh semiconductor component is mounted between the first electronic component groups adjacent to each other in the first direction.

* * * * *